US00RE41499E

(19) United States
(12) Reissued Patent
Nakatsuji et al.

(10) Patent Number: US RE41,499 E
(45) Date of Reissued Patent: Aug. 10, 2010

(54) HIGH-SPEED ERROR CORRECTING APPARATUS WITH EFFICIENT DATA TRANSFER

(75) Inventors: Fumio Nakatsuji, Kyoto-fu (JP); Yuichi Hashimoto, Osaka-fu (JP)

(73) Assignee: Panasonic Corporation, Osaka (JP)

(21) Appl. No.: 11/951,276

(22) Filed: Dec. 5, 2007

Related U.S. Patent Documents

Reissue of:
(64) Patent No.: 6,332,206
Issued: Dec. 18, 2001
Appl. No.: 09/256,740
Filed: Feb. 24, 1999

U.S. Applications:
(62) Division of application No. 10/738,699, filed on Dec. 17, 2003, now abandoned.

(30) Foreign Application Priority Data

Feb. 25, 1998 (JP) ..... 10-043219

(51) Int. Cl.
*H03M 13/00* (2006.01)
*G11C 29/00* (2006.01)

(52) U.S. Cl. ..... 714/755; 714/756; 714/769; 714/781; 714/804; 714/805

(58) Field of Classification Search ..... 714/755, 714/756, 769
See application file for complete search history.

(56) References Cited

U.S. PATENT DOCUMENTS 3,622,985 A * 11/1971 Ayling et al. ..... 714/757
4,506,362 A * 3/1985 Morley ..... 714/6
4,775,978 A * 10/1988 Hartness ..... 714/770
4,845,713 A * 7/1989 Zook ..... 714/784
RE34,100 E * 10/1992 Hartness ..... 714/769
5,446,743 A * 8/1995 Zook ..... 714/784
5,629,949 A * 5/1997 Zook ..... 714/769
5,631,914 A * 5/1997 Kashida et al. ..... 714/755
5,701,314 A * 12/1997 Armstrong et al. ..... 714/765
5,719,884 A * 2/1998 Roth et al. ..... 714/755
5,745,506 A * 4/1998 Yamashita et al. ..... 714/760
5,844,919 A * 12/1998 Glover et al. ..... 714/769
5,844,920 A * 12/1998 Zook et al. ..... 714/769
5,872,800 A * 2/1999 Glover et al. ..... 714/766
5,974,580 A * 10/1999 Zook et al. ..... 714/755
5,991,911 A * 11/1999 Zook ..... 714/758
5,996,105 A * 11/1999 Zook ..... 714/755
6,048,090 A * 4/2000 Zook ..... 714/755
6,052,815 A * 4/2000 Zook ..... 714/758

FOREIGN PATENT DOCUMENTS

JP 62-256270 11/1987
JP 1293013 * 11/1989
JP 01293013 11/1989

* cited by examiner

*Primary Examiner*—Joseph D Torres

(57) ABSTRACT

An error correcting apparatus includes a storing means for storing product code with $n_2$ rows and $n_1$ columns, an error correcting unit 5 that performs error correction for four code sequences simultaneously in parallel, and a bus control unit 2 for reading codes on four rows from the buffer memory 1 and transferring the codes to the error correcting unit 5. The bus control unit 2 reads and transfers four consecutive codes on each of four rows in order before shifting the reading position by four codes in the row direction.

66 Claims, 39 Drawing Sheets

Fig. 29

| TIME | T1 | T2 | T3 | T4 | T5 | |
|---|---|---|---|---|---|---|
| BUFFERING | 1ST BLOCK | 2ND BLOCK | 3RD BLOCK | 4TH BLOCK | 5TH BLOCK | |
| ERROR DETECTION | 1ST BLOCK | 2ND BLOCK | 3RD BLOCK | 4TH BLOCK | 5TH BLOCK | |
| ERROR CORRECTION | | 1ST BLOCK | 2ND BLOCK | — | 4TH BLOCK | |
| TRANSFER TO HOST | | | 1ST BLOCK | 2ND BLOCK | 3RD BLOCK | |

Fig. 31

| TIME | 11 | 12 | 13 | 14 | 15 | |
|---|---|---|---|---|---|---|
| SYNDROME CALCULATION | 1ST ROW | 4TH ROW | 6TH ROW | 7TH ROW | 11TH ROW | |
| EUCLIDEAN CALCULATION | | 1ST ROW | 4TH ROW | 6TH ROW | 7TH ROW | |
| CHAIN CALCULATION | | | 1ST ROW | 4TH ROW | 6TH ROW | |
| ERROR DATA UPDATED | | | | 1ST ROW | 4TH ROW | |

Fig. 38

| TIME | T1 | T2 | T3 | T4 | T5 | |
|---|---|---|---|---|---|---|
| BUFFERING | 1ST BLOCK | 2ND BLOCK | 3RD BLOCK | 4TH BLOCK | 5TH BLOCK | |
| ERROR CORRECTION 1 | 1ST BLOCK | 2ND BLOCK | 3RD BLOCK | 4TH BLOCK | 5TH BLOCK | |
| ERROR CORRECTION 2 | | 1ST BLOCK | 2ND BLOCK | — | 4TH BLOCK | |
| TRANSFER TO HOST | | | 1ST BLOCK | 2ND BLOCK | 3RD BLOCK | |

Fig. 39

| TIME | T1 | T2 | T3 | |
|---|---|---|---|---|
| BUFFERING | 1ST BLOCK | 2ND BLOCK | 3RD BLOCK | |
| ERROR CORRECTION 1 | 1ST BLOCK C1ECC | 2ND BLOCK C1ECC | 3RD BLOCK C1ECC | |
| ERROR CORRECTION 2 | | 1ST BLOCK C2ECC | 2ND BLOCK C2ECC | |
| TRANSFER TO HOST | | | 1ST BLOCK | |

Fig. 40

| TIME | t1 | t2 | t3 | t4 | t5 |
|---|---|---|---|---|---|
| C1 SYNDROME CALCULATION | 2ND BLOCK 1ST ROW | 2ND BLOCK 2ND ROW | 2ND BLOCK 3RD ROW | 2ND BLOCK 4TH ROW | 2ND BLOCK 5TH ROW |
| C2 SYNDROME CALCULATION | 1ST BLOCK 1ST COLUMN | 1ST BLOCK 2ND COLUMN | 1ST BLOCK 3RD COLUMN | 1ST BLOCK 4TH COLUMN | 1ST BLOCK 5TH COLUMN |
| EUCLIDEAN CALCULATION | | 2ND BLOCK; 1ST BLOCK 1ST ROW ; 1ST COLUMN | 2ND BLOCK; 1ST BLOCK 2ND ROW 2ND COLUMN | 2ND BLOCK; 1ST BLOCK 3RD ROW 3RD COLUMN | 2ND BLOCK; 1ST BLOCK 4TH ROW ; 4TH COLUMN |
| CHAIN CALCULATION | | 2ND BLOCK 1ST ROW | 1ST BLOCK 2ND BLOCK 1ST COLUMN; 2ND ROW | 1ST BLOCK ; 2ND BLOCK 2ND COLUMN; 3RD ROW | 1ST BLOCK ; 2ND BLOCK 3RD COLUMN; 4TH ROW |
| ERROR DATA UPDATED | | | 2ND BLOCK; 1ST BLOCK 1ST ROW ; 1ST COLUMN | 2ND BLOCK; 1ST BLOCK 2ND ROW 2ND COLUMN | 2ND BLOCK; 1ST BLOCK 3RD ROW ; 3RD COLUMN |

HIGH-SPEED ERROR CORRECTING APPARATUS WITH EFFICIENT DATA TRANSFER

Matter enclosed in heavy brackets [ ] appears in the original patent but forms no part of this reissue specification; matter printed in italics indicates the additions made by reissue.

*CROSS-REFERENCE TO RELATED APPLICATIONS*

*Notice: More than one reissue application has been filed for the reissue of U.S. Pat. No. 6,332,206. This is a reissue divisional application of U.S. application Ser. No. 10/738,699, filed on Dec. 17, 2003 now abandoned which is a reissue application of U.S. Pat. No. 6,332,206 issued on Dec. 18, 2001. A second reissue divisional application of U.S. application Ser. No. 10/738,699 was filed on Dec. 5, 2007 and assigned application Ser. No. 11/951,272, now abandoned.*

[This application is based on application No. H10-43219 filed in Japan, the contents of which are hereby incorporated by reference.]

BACKGROUND OF THE INVENTION (1) Field of the Invention

The present invention relates to an apparatus that corrects errors in decoded data. In particular, the invention relates to an apparatus for correcting errors in two-dimensional block code at high speed.

(2) Description of the Prior Art

When a data storage device uses a magnetic or optical disc as a storage medium, scratches or dirt on the disc can cause data errors. To enable such errors to be corrected, codes specifically for this purpose are added when recording data onto the storage medium. These codes are commonly called error correction codes are parity data. During the reproduction of recorded data, errors are detected using the error correction codes and the detected errors are corrected. Hereafter, the processing for adding these error correction codes and the processing for correcting errors will collectively be called "error-related processing". To improve the performance of error-related processing, many systems use Reed-Solomon codes as the error correction codes and product code as the data structure.

FIG. 1 shows an example of product code. Information composed of k1*k2 bytes is assigned m1 bytes of parity data in the horizontal (row) direction (hereinafter the "C1 series" or "C1 direction") and m2 bytes of parity data in the vertical (column) direction (hereinafter the "C2 series" or "C2 direction"). The combination of the information, the C1 parity data and the C2 parity data compose one block. This block is the largest unit for which error correction can be performed. This block is n1*n2 bytes in size. Usually, the information and the parity data will be stored in a memory such as a DRAM (Dynamic Random Access Memory) by incrementing the address in the memory by one in the C1 direction. As a result, the data that composes the code sequences in the C1 direction is stored in storage areas with consecutive addresses. Conversely, the code sequences in the C2 direction is stored in storage areas with non-consecutive addresses. Note that the separate codes that compose the product data will be called "data" or "data elements" in the following explanation.

FIG. 2 shows the flow of the error correction performed for the code sequences in the C1 direction. Error correction is first performed for the code sequence in the first row. The processing then proceeds to the second and following rows and is repeated a total of $n_2$ times. This means that data is scanned and error correction is performed for one entire row at a time. The term "scan" here also refers to the reading order used when reading the data that is to be subjected to error detection and error correction from the storage areas. In this text, the term "error detection" refers to processing that does not include error correction. The term "error correction" meanwhile can refer both to error correction and to the error detection that precedes it.

FIG. 3 shows the flow of the error correction performed on the C2 code sequences. Error correction is first performed for the code sequence in the first column. The processing then proceeds to the second and following columns and is repeated a total of $n_1$ times. This means that data is scanned and error correction is performed for one entire column at a time.

FIG. 4 is a block diagram showing the composition of a conventional error correction apparatus that performs error correction with the flow described above. In this example, there are 100 bytes of information numbered d1 to d100 and 10 bytes of parity data numbered p1 to p10. Together these form one code sequence.

The information and parity data are read from the memory and sequentially inputted into the syndrome generating unit 900. The syndrome generating unit 900 performs a predetermined calculation whenever one data element is inputted and, when all of the information d1~d100 and parity data p1~p10 that compose one code sequence have been inputted, generates ten syndromes. If non-zero data is present in any of these syndromes, this means that an error is present in the code sequences, so that the error position-error value calculating unit 901 uses the syndromes to calculate the error position and the error value. Here, the "error position" is information showing the position of the erroneous data element in the code sequence, while the "error value" shows the size of the error. Finally, the error data updating unit 902 uses the error position and error value to read the error data from the memory and to correct the error, before writing the updated value back into the same position in the memory. This processing is then repeated for another code sequence.

As described above, a conventional error correction apparatus scans and performs error correction one row at a time for code sequences in the C1 direction and one column at a time for code sequences in the C2 direction. In this way, error correction is performed for every code sequence that composes a block.

In recent years, there have been increasing demands for improvements in the processing speed of data storage devices such as modern optical disc drives. Conventional error correction apparatuses, however, are unable to satisfy these demands.

To meet such demands, it would conceivably be possible to use plurality of error correction apparatuses in parallel within a single data storage device. Such an arrangement would however require a large-scale circuit and would reduce cost performance.

SUMMARY OF THE INVENTION

In view of the stated problems, it is a primary object of the present invention to provide an error correcting apparatus that can perform the processing required for error correction at high speed with a small-scale circuit.

This primary object can be achieved by an error correcting apparatus that repeatedly performs calculations that are required for error correction on code sequences in a row direction and a column direction in block code of R rows and L columns, the error correcting apparatus including: a storing unit for storing the block code; a calculating unit for performing calculations for correcting errors in the block code in units of one of (a) one row and (b) one column; and a transfer unit, including a row direction transferring unit for repeatedly reading code sequences on R1 (where R1 is an integer such that $2 \leqq R1 < R$) rows in the block code from the storing unit and transferring the read code sequences to the calculating unit until all R rows have been read and transferred, the row direction transferring unit transferring the code sequences on the R1 rows from the storing unit to the calculating unit by repeatedly reading and transferring sections of L1 consecutive codes (where L1 is an integer such that $2 \leqq L1 < L$) on the R1 rows in order, shifting a read position by L1 codes after reading L1 consecutive codes on each of the R1 rows, wherein when codes have been transferred by the row direction transferring unit, the calculating unit performs the calculations for the code sequences on the R1 rows in parallel, treating the received codes as L1-code-wide sections of the code sequences on different rows in the R1 rows.

With the stated construction, error correction in the row direction is performed in parallel for a plurality of code sequences. A zigzag scanning order is followed for a plurality of small blocks that are obtained by dividing the code sequences on a plurality of rows in the row direction. This is to say, the error correction proceeds in parallel by repetitively scanning only part of the code sequences on different rows. Compared with when error correction that scans the entire code sequence on one line at a time is performed, the present method can use a lower average speed when inputting into the error correction circuit for each row and can use smaller circuitry, such as for the queue buffer in the error correction circuit for each line, even when codes are read and error correction is performed at the same rate as before. Scanning is performed for sequences of codes on a same row, so that if the block code is stored in a storage device like a DRAM that uses two-dimensional addresses, the scanning will access consecutive column addresses on the same row and so read the codes at high speed.

Here, the block code may be product code, and code sequences in the row direction and column direction that compose the block code may include information codes and error correction codes, the calculating unit may include an error detecting unit for detecting whether errors are present in a code sequence on one of (a) a row and (b) a column in the block code; and an error code updating unit for rewriting, when the error detecting unit has detected at least one error in a code sequence, a code in the storing unit that corresponds to the error using a corrected value, the row direction transferring unit may repeatedly transfer code sequences to the error detecting unit, and the error detecting unit may perform error detection for the code sequences on the R1 rows in parallel, treating the received codes as L1-code-wide sections of the code sequences on different rows in the R1 rows.

With the above construction, the error correcting apparatus of the present invention can perform error detection in the row direction as part of the error correction of product code. This improves the detection of errors by devices that receive product code and perform error correction on the product code. Examples of such devices are a medium reading device, such as for an optical disc, or a receiving device used in data communication.

Here, the storing unit may store the block code so that codes on a same row are stored in a storage area with consecutive addresses, and the row direction transferring unit may sequentially read L1 codes from a storage area with consecutive addresses in the storing unit.

With the stated construction, sections of codes that belong to the same row can be read by simply incrementing the address outputted to the storing unit, so that the time taken to read from the storing unit can be reduced.

Here, the storing unit may be a dynamic random access memory, and the row direction transferring unit may read L1 codes from the-storing unit using page mode.

With the above construction, sections of codes that belong to the same row can be read by outputting one RAS address and then consecutive CAS addresses to the storing unit. The read speed is therefore increased by achieving more page bits for a DRAM.

Here, the row direction transferring unit may transfer codes by performing direct memory access to the storing unit.

With the stated construction, all of the codes that will be subjected to parallel error detection by the error detecting unit can be consecutively read from the storing unit and inputted into the error detection unit. Interruptions in the input of code sequences during error detection for a small block by the error detecting unit are thereby avoided, meaning that error correction can be performed based on an efficient pipeline.

Here, the error detecting unit may include: R1 error detecting units that each perform error detection for a code sequence on one row in the R1 rows; and a distributing unit for distributing codes, which are received from the row direction transferring unit, in L1-code-wide sections to the R1 error detecting units in order, wherein the R1 error detecting units may be independent of one another and may each perform error detection in parallel with a transfer of codes by the row direction transferring unit.

During error correction in the row direction, the separate error detecting units may receive an input of L1 codes from the distributing unit once every R1 rows. Each error detecting unit performs error detection while the distributing unit is distributing codes to other error detecting units. As a result, the processing load of each error detecting unit is reduced, which reduces the overall scale of the circuitry.

Here, each of the R1 error detecting units may complete the error detection for an L1-code-wide section in a time that is shorter than an interval at which L1-code-wide sections are distributed to the error correcting unit by the distributing unit.

During error correction in the column direction, the input rate of codes into each error detecting unit (i.e., the number of codes per unit time) is within the processing ability of each error detecting unit (the number of codes per unit time for which error detection can be performed). This means that each error detecting unit does not require a large queue buffer for storing the inputted codes.

Here, each of the R1 error detecting units may have a product-sum calculating circuit that calculates a plurality of syndromes for one code sequence.

With the above construction, the present invention can achieve an error correcting apparatus that is suited to processing Reed-Solomon codes.

Here, when a division of L by L1 results in a quotient of D and a remainder of E, the row direction transferring unit may repeat a transfer of L1-code-wide sections on R1 rows D times, before reading and transferring an E-code-wide section on each of the R1 rows in order to the error detecting unit, and the error detecting unit may perform error detection a predetermined number of times for L1-code-wide sections before performing error detection for E-code-wide sections.

With the stated construction, error correction can be performed in parallel as far as the end of each code sequence even if the code length of the product code in the row direction is not an integer multiple of the number of codes L1 that are consecutively read each time. This realizes a flexible error correcting apparatus that does not make requirements on the size of the product code.

Here, the transferring unit may further include a column direction transferring unit for reading code sequences in L2 (where L2 is an integer such that $2 \leqq L2 < L$) columns in the block code from the storing unit and transferring the read code sequences to the error detecting unit until all L columns have been processed, the column direction transferring unit may transfer all code in the L2 columns from the storing unit to the calculating unit by repeatedly reading and transferring sections of L2 consecutive codes in the row direction on the R rows in order, shifting a read position by L2 codes after reading all codes in the L2 columns, and when codes have been transferred by the column direction transferring unit, the error detecting unit may perform error detecting for the code sequences in the L2 columns in parallel, treating the received codes as a series where each code corresponds to a code sequence in a different column in the L2 columns.

With the stated construction, error correction in the column direction can also be performed in parallel for a plurality of code sequences. This error correction in the column direction is also performed by repeatedly scanning parts of the codes on each row. Accordingly, compared with the case where all of the codes on a row are scanned, a lower average input rate can be used when inputting codes into the error correction circuit for each row, and a smaller queue buffer can be used in the error correction circuit for each row, even when codes are read and error correction is performed at the same rate as before.

Here, R1 and L2 may be such that R1=L2=j, and the error detecting unit may include: j error detecting units that each perform error detection for one code sequence; and a distributing unit for repeatedly distributing each L1-code-wide section of codes that is received from the row direction transferring unit to one of the j error detecting units selected in order, and for repeatedly distributing each code that forms part of an L2 code-wide section received from the column direction transferring unit to a different error detecting unit in the j error detecting units in order, wherein the j error detecting units may be independent of one another and may each detect errors in parallel with transfer of codes by the row direction transferring unit and the column direction transferring unit.

With the stated construction, the number of rows that are subject to parallel processing during the error correction in the row direction is equal to the number of columns that are subject to parallel processing during the error correction in the column direction. This makes the number of separate error detection units equal for both directions, and means that the error detecting unit can be used to its utmost potential during the error correction in either direction.

Here, each of the j error detecting units may complete an error detection for an L1-code-wide section in a time that is shorter than an interval at which L1-code-wide sections are distributed to the error correcting unit by the distributing unit, and may complete an error detection for one code in an L2-code-wide section in a time that is shorter than an interval at which codes in L2-code-wide sections are distributed to the error correcting unit by the distributing unit.

With the stated construction, during error correction in the column direction, the input rate of codes into each error detecting unit (i.e., the number of codes per unit time) is within the processing ability of each error detecting unit (the number of codes per unit time for which error detecting can be performed). This means that each error detecting unit does not require a large queue buffer for storing the inputted codes.

Here, the values R1=L1=L2=j may be used.

With the stated construction, the read order of product code is the same regardless of whether error correction is being performed in the row direction or in the column direction. This means the control circuit of the transfer unit that accesses the storing unit can be simplified.

The stated primary object can also be achieved by an error correcting apparatus that repeatedly performs calculations that are required for error correction on code sequences in a row direction and column direction in block code of R rows and L columns, the error correcting apparatus including: a storing unit for storing the block code; a calculating unit for performing calculations for correcting errors in the block code in units of one of (a) one row and (b) one column; and a transfer unit, including a column direction transferring unit for repeatedly reading code sequences on L2 (where R1 is an integer such that $2 \leqq L2 < L$) columns in the block code from the storing unit and transferring the read code sequences to the calculating unit until all L columns have been read and transferred, the column direction transferring unit transferring the code sequences in the L2 columns from the storing unit to the calculating unit by repeatedly reading and transferring sections of L2 consecutive codes on the R rows in order, shifting a read position by L2 codes after reading all codes in the L2 columns, wherein when codes have been transferred by the column direction transferring unit, the calculating unit performs the calculations for the code sequences in the L2 columns in parallel, treating successive codes as belonging to code sequences in different columns in the L2 columns.

With the stated construction, error correction in the row direction is performed in parallel for a plurality of code sequences. A zigzag scanning order is followed for a plurality of small blocks that are obtained by dividing the code sequences on a plurality of rows in the row direction. This is to say, the error correction proceeds in parallel by repetitively scanning only part of the code sequences on different rows. Compared with when error correction that scans the entire code sequence on one line at a time is performed, the present method can use a lower average speed when inputting into the error correction circuit for each row and can use smaller circuitry, such as for the queue buffer in the error correction circuit for each line, even when codes are read and error correction is performed at the same rate as before. Scanning is performed for sequences of codes on a same row, so that if the block code is stored in a storage device like a DRAM that uses two-dimensional address, the scanning will access consecutive column addresses on the same row and so will read the codes at high speed.

By using the characteristic components of the above error correcting apparatus for error correction in the row direction to perform error correction in the column direction, the same effects can be achieved as when performing error correction in the row direction.

The stated primary object can also be achieved by an error detecting apparatus that performs error correction on codes received from a first external apparatus and outputs the corrected codes to a second external apparatus, the error detecting apparatus including: a storing unit including a storage area for storing the codes; an error detecting unit for detecting errors in sections of a predetermined number of codes; an error correcting unit for correcting sections, in which the error detecting unit has detected an error, of a predetermined number of codes in the storing unit; a first transfer unit for transferring codes outputted by the first external apparatus in parallel to the storing unit and to the error detecting unit so that the outputted codes are stored in the storing unit and simultaneously subjected to error detection by the error detecting unit; a second transfer unit for transferring a section of a predetermined number of codes, in which the error detecting unit has detected an error, from the storing unit to the error correcting unit, a third transfer unit for transferring a section of a predetermined number of codes that does not contain any uncorrected errors from the storing unit to the second external apparatus; and a transfer control unit for controlling transfers of codes so that transfer is exclusively performed by one of the first to third transfer unit.

With the above construction, the codes outputted by the first external apparatus are subjected to error detection in parallel with the storing of the codes into the storing unit. Compared with conventional methods where codes are read out and subjected to error detection after first being stored in the storing unit, error correction can be completed in a shorter time and with fewer accesses to the storing unit. This achieves an error correcting apparatus that operates at high speed but with low power consumption.

Here, the error detecting unit may include a detection result recording unit that records detection results showing whether an error exists in a section of codes, and the error correcting unit may refer to the detection results in the detection result recording unit and control the second transfer unit so that only sections of codes for which the error detecting unit has detected an error are transferred from the storing unit to the error correcting unit.

With the stated construction, code sequences that are not found to contain errors during the error detection performed in parallel with the storage into the storing unit are not subjected to transfer from the storing unit to the error correcting unit or to error correction by the error correcting unit. Accordingly, error correction can be performed at high speed and with fewer accesses to the storing unit.

Here, the first external apparatus may repeatedly output code sequences that form rows in block code composed of R rows by L columns, the block code may be product code, code sequences in the row direction and column direction that compose the block code may include information codes and error correction codes, and the error correcting unit may perform error correction for code sequences in one of (a) a row direction and (b) a column direction, and when performing error correction for code sequences in the row direction, may refer to the detection results in the detection result recording unit and control the second transfer unit so that only code sequences in the row direction for which the error detecting unit has detected errors are transferred from the storing unit to the error correcting unit.

With the stated construction, the error correcting apparatus of the present invention can be used where high-speed error correction is required, such as for a data communication device or a disc drive (e.g., an optical disc reader).

Here, the error detecting unit may accumulatively store detection results in the detection result recording unit for all code sequences in the row direction that compose one set of block code, and when performing error correction for code sequences in the column direction, the error correcting unit may refer to the detection results in the detection result recording unit and control the second transfer unit so that the second transfer unit transfers code sequences in the column direction in a block from the-storing unit to the error correcting unit only if the error detecting unit has detected at least one error in the block.

With the stated construction, when no errors are found in any of the code sequences in the row direction in one set of block code, the error detection and error correction processes are skipped for the code sequences in the column direction in the block code. When errors are rarely found in sets of block code, such as when sets of block code are sequentially read from a storage medium like an optical disc, this skipping of the error detection and error correction raises the average read speed.

Here, the second transfer unit may include a row direction transferring unit for repeatedly reading code sequences on R1 (where R1 is an integer such that $2 \leqq R1 < R$) rows where errors have been detected from the storing unit and transferring the read code sequences to the error correcting unit, until no code sequences on rows that contain errors remain in the block code, the row direction transferring unit may transfer the code sequences on the R1 rows from the storing unit to the calculating unit by repeatedly reading and transferring sections of L1 consecutive codes (where L1 is an integer such that $2 \leqq L1 < L$) on the R1 rows in order, shifting a read position by L1 codes after reading L1 consecutive codes on each of the R1 rows, and when codes have been transferred by the row direction transferring unit, the error correcting unit may perform the calculations for the code sequences on the R1 rows in parallel, treating the received codes as L1-code-wide sections of the code sequences on different rows in the R1 rows.

With the stated construction, the error correction for a plurality of code sequences in the row direction is performed in parallel by repeatedly performing error correction for small blocks of code. Compared with when error correction is simply performed in parallel, lower processing performance is required of the error correcting unit even though the data is scanned and subjected to error correction at the same rate. The size of the circuitry can also be reduced.

Here, the second transfer unit may further include a column direction transferring unit for repeatedly reading code sequences in L2 (where L is an integer such that $2 \leqq L2 < L$) columns in a block where an error has been detected from the storing unit and transferring the read code sequences to the error correcting unit, until code sequences in all L columns have been transferred, the column direction transferring unit may transfer all code in the L2 columns from the storing unit to the error correcting unit by repeatedly reading and transferring sections of L2 consecutive codes in the row direction on the R rows in order, shifting a read position by L2 codes after reading all codes in the L2 columns, and when codes have been transferred by the column direction transferring unit, the error correcting unit may perform error detection for the code sequences in the L2 columns in parallel, treating the received codes as a series where each code corresponds to a code sequence in a different column in the L2 columns.

With the stated construction, error correction in both the row direction and the column direction are performed in parallel, so that a high-speed error correcting apparatus can be achieved with a relatively small-scale circuit.

Here, transfer of codes from the first external apparatus to the storing unit by the first transfer unit, transfer of codes from the storing unit to the error correcting unit by the second transfer unit, and transfer of codes from the storing unit to the second external apparatus by the third transfer unit may all be transfers that are accompanied by direct memory access (DMA) to the storing unit, the transfer control unit may have DMA transfer by the first transfer unit performed with a highest priority out of DMA transfers by the first to third transfer unit, and when DMA transfer by the first transfer unit becomes necessary, the transfer control unit may have DMA transfer performed by the first transfer unit immediately if DMA transfer is not presently being performed by any of the first to third transfer unit and, if DMA transfer is presently being performed by one of the first to third transfer unit, may allow a present DMA transfer to end before having DMA transfer performed by the first transfer unit.

With the stated construction, buffering of codes in the storing unit is given the highest priority, so that when the error correcting apparatus of the present invention is adopted in an optical disc reader or other such reading apparatus, codes can be sequentially read from the optical disc by an optical pickup.

Here, the transfer control unit may have DMA transfer performed by the second transfer unit with a lowest priority out of the first to third transfer unit, so that when DMA transfer by the second transfer unit becomes necessary, the transfer control unit may only have DMA transfer performed by the second transfer unit if DMA transfer is not being performed by any of the first to third transfer units.

With the stated construction, error detection is performed in parallel with the buffering of codes in the storing unit. As a result, exclusive access control is made to the storing unit which considers (1) the improvements in error correction speed due to the performance of error detection in parallel with the buffering in the storing unit and (2) the improvements in error correction speed due to the parallel processing of a plurality of codes sequences.

Here, the error correcting unit may specify an error code in a code sequence transferred by the second transfer unit and then rewrite a corresponding error code in the storing unit under control by the transfer control unit, the transfer control unit only allowing the error correcting unit to rewrite the corresponding error if DMA transfer is not being performed by any of the first to third transfer units.

With the stated construction, exclusive control is performed so as to allow balanced access to a single storing unit by four different processes. This means an error correcting apparatus with superior cost performance can be achieved.

The stated primary object can also be achieved by an error detecting apparatus that performs error correction on codes received from a first external apparatus and outputs the corrected codes to a second external apparatus, the error detecting apparatus including: a storing unit including a storage area for storing the codes; an error correcting unit for detecting error codes in sections of a predetermined number of codes and correcting the error codes in the storing unit; a code selecting unit for selecting one of codes sent from the first external apparatus and codes sent from the storing unit and sending the selected codes to the error correcting unit to have the error correcting unit perform error detection and error correction on the selected codes; a first transfer unit for transferring codes outputted by the first external apparatus in parallel to the storing unit and the code selecting unit so that the outputted codes are stored in the storing unit and simultaneously selected by the code selecting unit and sent to the error correcting unit where error detection and error correction are performed on the transferred codes; a second transfer unit for transferring a section of a predetermined number of codes from the storing unit to the code selecting unit so that the error correcting unit performs error detection and error correction on the transferred codes; a third transfer unit for transferring a section of a predetermined number of codes that do not contain any uncorrected errors from the storing unit to the second external apparatus; and transfer control unit for controlling transfers of codes so that transfer is exclusively performed by one of the first to third transfer units.

With the above construction, the codes outputted by the first external apparatus are inputted via the code selecting unit into the error correcting unit in parallel with the storing of the codes into the storing unit. Compared with conventional techniques where codes are first stored into the storing unit and are then read out and inputted into the error correcting unit, the overall processing required for error correction can be completed in a shorter time and with fewer accesses to the storing unit. This means that an error correction apparatus that operates at high speed and small-scale circuitry can be realized.

Here, the first external apparatus may repeatedly output code sequences that form rows in block code composed of R rows by L columns, the block code may be product code, and code sequences in the row direction and column direction that compose the block code may include information codes and error correction codes, the first transfer unit may transfer code sequences in a row direction that are repeatedly outputted by the first external apparatus in parallel to the storing unit and the code selecting unit to have the code sequences stored in the storing unit and simultaneously selected by the code selecting unit and sent to the error correcting unit where error detection and error correction are performed on the transferred code sequences, and the second transfer unit may transfer code sequences in the column direction in the block code to the code selecting unit so that the code sequences are selected by the code selecting unit and sent to the error correcting unit where error detection and error correction are performed for the code sequences.

The stated construction realizes an error correcting apparatus that is well-suited to use in a device, such as an optical disc reader or a data communication device, that demands high-speed error correction for product code.

Here, the error correcting unit may include: an error detecting unit for detecting whether error codes are present in a code sequence on one of (a) one row and (b) one column; and an error updating unit for updating, when the error detecting unit finds an error code, a code in the storing unit that corresponds to the error code using a corrected value, the error detecting unit may include: a row direction detection result recording unit for recording results of error detection for code sequences in the row direction that are transferred by the first transfer unit from the first external apparatus to the error detecting unit; and a column direction detection result recording unit for recording results of error detection for code sequences in the column direction that are transferred by the second transfer unit from the storing unit to the error detecting unit, and the error code updating unit may use the detection results in the row direction detection result recording unit and in the column direction detection result recording unit to update codes in the storing unit.

With the above construction, the results of the error detection in the row direction are stored separately to the results of the error detection in the column direction. By using these results, the code updating unit and other components that operate following the error detection may operate with lower processing speeds.

Here, when performing error detection in the row direction, the error detecting unit may accumulate detection results for all code sequences in the row direction that compose one set of block code in the row direction detection result recording unit, and when performing error detection in the column direction, the error detecting unit may refer to the detection results recorded in the row direction detection result recording unit and control the second transfer unit so that only code sequences in the column direction that compose a set of block code that contains an error are sent from the storing unit to the error correcting unit.

With the stated construction, when no errors are found in any of the code sequences in the row direction that compose a set of block code, error detection and error correction are not performed for the code sequences in the column direction that compose the block. This raises the average data read speed.

Here, the transfer control unit may have—(a) a transfer of a code sequence of one row from the first external apparatus to the storing unit by the first transfer unit, and (b) a transfer of a code sequence for one column from the storing unit to the code selecting unit by the second transfer unit—executed alternately in units of parts of the transferred code sequences, the error detecting unit may switch between (i) error detection for a code sequence in the row direction sent from the first external apparatus by the first transfer unit and (ii) error detection for a code sequence in the column direction sent from the storing unit by the second transfer unit in units of parts of the code sequences so as to perform error detection for code sequences in the row direction and code sequences in the column direction in parallel, the error detecting unit may store results of the error detection in the row direction in the row direction detection result recording unit and results of the error detection in the column direction in the column direction detection result recording unit, and the error code updating unit may sequentially refer to the detection results recorded in the row direction detection result recording unit and in the column direction detection result recording unit and successively update error codes in the storing unit in the row direction and error codes in the storing unit in the column direction.

With the stated construction, the code updating unit can perform the error correction in the row direction and the error correction in the column direction sequentially, not in parallel. As a result, a smaller-scale circuit can be used.

Here, the second transfer unit may include a column direction transferring unit for repeatedly reading code sequences in L2 (where L2 is an integer such that $2 \leqq L2 < L$) columns in a block and transferring the read code sequences to the error correcting unit via the code selecting unit until all L columns in the block code have been transferred, wherein the column direction transferring unit may transfer the code sequences in the L2 columns from the storing unit to the code correcting unit by repeatedly reading and transferring sections of L2 consecutive codes in the row direction on the R rows in order, shifting a read position by L2 codes after reading all codes in the L2 columns, and, when codes have been transferred by the column direction transferring unit, the error correcting unit may perform error correction for the code sequences in the L2 columns in parallel, treating the received codes as a series where each code corresponds to a code sequence in a different column in the L2 columns.

With the stated construction, the error correction of a plurality of code sequences in the row direction is performed not through parallel processing but by repeatedly performing error correction on small blocks. Compared with when parallel processing is used, lower processing performance and smaller-scale circuits can be used, even when codes are scanned and error correction is performed at the same rate.

Access to the storing unit is achieved using DMA, and scheduling is performed according to a predetermined priority list. Exclusive control is performed so as to allow balanced access to a single storing unit by four different processes. This means an error correcting apparatus with superior cost performance can be achieved.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings:

FIG. 29 is a timing chart showing the internal processing of the optical disc control unit 2100;

FIG. 31 is a timing chart for the processing of rows by the error correcting unit 2130 when performing error correction in the C1 direction;

FIG. 38 is a timing chart showing the internal processing of the optical disc control unit 3100 when consecutively processing data in a plurality of blocks;

FIG. 39 shows the timing chart of FIG. 38 in more detail; and

FIG. 40 is a timing chart showing the processing of the error correcting unit 3130 for code sequences in the row and column directions.

DESCRIPTION OF THE PREFERRED EMBODIMENTS

Several preferred embodiments of the present invention are described below with reference to the drawings.

First Embodiment

The first embodiment of the present invention relates to a high-speed error correction apparatus that corrects error for four code sequences in parallel in either the row or column direction.

Figure 5:
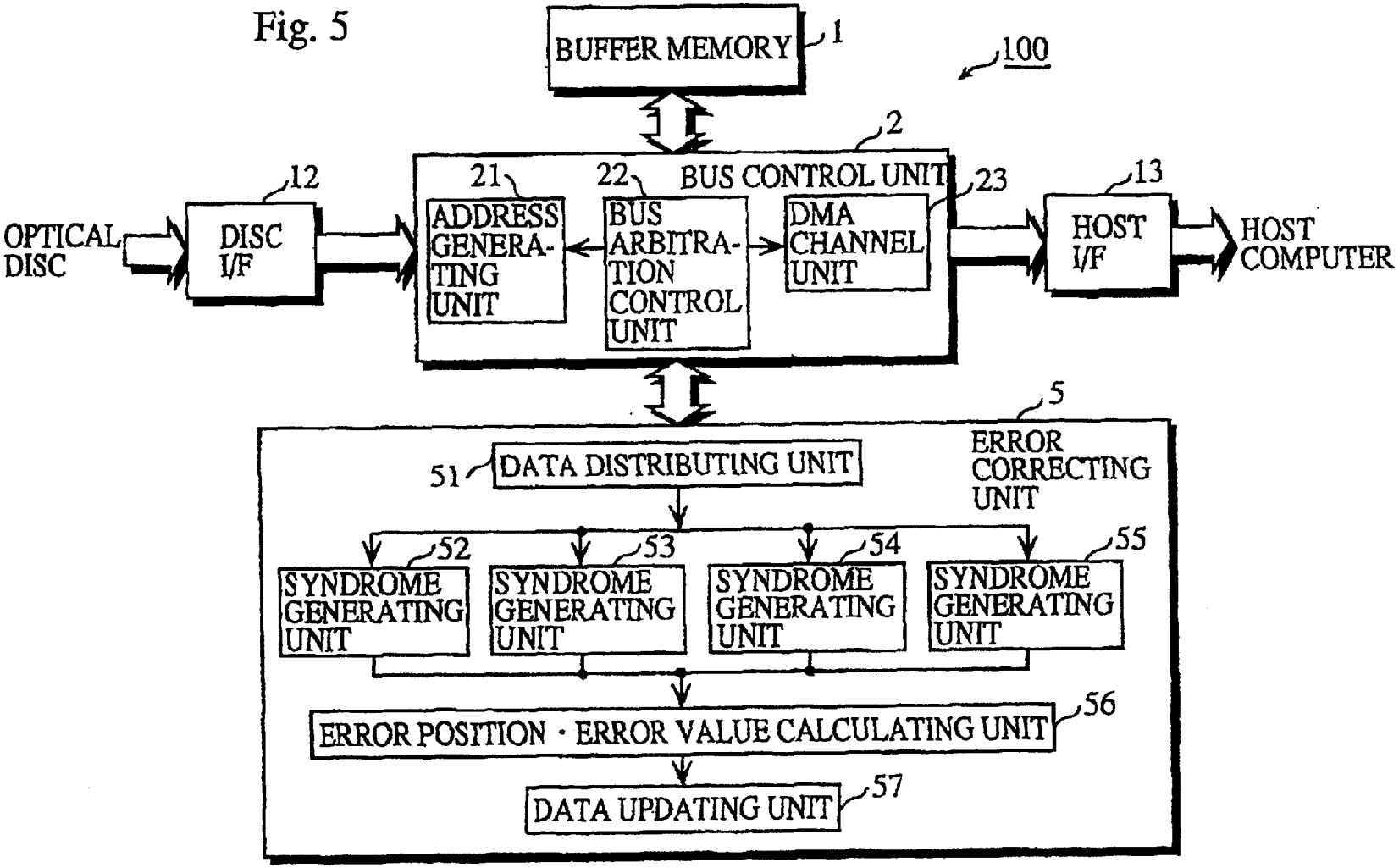
FIG. 5 is a block diagram showing the composition of the error correction apparatus 100 in the first embodiment of the present invention.

FIG. 5 is a block diagram showing the composition of the error correction apparatus 100 in this first embodiment. The error correction apparatus 100 is installed in an optical disc drive or the like, and corrects errors in data that has been read from an optical disc. The error correction apparatus 100 includes a buffer memory 1, three processing blocks that access the buffer memory 1 (the disc interface unit 12, the error correcting unit 5, and the host interface unit 13), and a bus control unit 2 for controlling exclusive access by these processing blocks. Note that the arrows in FIG. 5 show the flow of the data that is subjected to error correction. This error correction apparatus 100 uses Reed-Solomon codes as the error correction codes and product codes as the code structure.

The buffer memory 1 is a semiconductor memory, such as a DRAM, that has storage areas that are specified using a two-dimensional address (a row address and a column address). The buffer memory 1 has sufficient storage capacity for temporarily storing a plurality of blocks that will be subjected to error correction.

The disc interface unit 12 is an interface circuit that relays data that has been read from an optical disc or other storage medium and writes the data into the buffer memory 1.

The error correcting unit 5 reads the data that the disc interface unit 12 has written into the buffer memory 1 and detects whether any errors are present in the data. On finding an error, the error correcting unit 5 corrects the error in the buffer memory 1. This error correcting unit 5 simultaneously corrects errors in four data sequences in parallel. As shown in FIG. 5, the error correcting unit 5 includes a data distributing unit 51, four syndrome generating units 52~55, an error position error value calculating unit 56, and a data updating unit 57.

The data distributing unit 51 distributes data that has been transferred from the buffer memory 1 to one of the four syndrome generating units 52~55. When doing so, the data distributing unit 51 sends data that belongs to the same code sequence to the same syndrome generating unit. The four syndrome generating units 52~55 all have the same construction. Whenever distributed data is inputted, the syndrome generating units 52~55 perform a product calculation. When an entire data sequence including ten elements of parity data has been inputted, the syndrome generating units 52~55 each generate ten syndromes.

The error position.error value calculating unit 56 judges whether any non-zero elements are present in any of the ten syndromes generated by each of the syndrome generating units 52~55 in order. When non-zero elements are present in the ten syndromes generated by a syndrome generating unit, the error position.error value calculating unit 56 uses the syndromes to calculate the error position and error value. To do so, the error position-error value calculating unit 56 calculates coefficients for each expression to specify an error position polynomial and an error value polynomial using a Euclidean method or the like. The error position.error value calculating unit 56 then finds the root (error position) of the error position polynomial using a chain search or other method, before finding the error value using the error value polynomial.

The data updating unit 57 reads error data from the buffer memory 1 according to the error position calculated by the error position.error value calculating unit 56 and calculates a logical XOR for the read error data and the error value calculated by the error position-error value calculating unit 56. The data updating unit 57 then writes the resulting value into the buffer memory 1 at the error position. Note that in the error correcting unit 5, only the syndrome generating units 52~55 operate in parallel, with the other circuits (the error position.error value calculating unit 56 and the data updating unit 57) not operating in parallel. This is because ten product calculations by one of the four syndrome generating units 52~55 are required for each data element regardless of whether an error is present in the data. The calculation processing thereafter is performed using the ten syndromes produced for each code sequence, so that little further calculation is required.

The host interface unit 13 is an interface unit for reading data that has been processed by the error correcting unit 5 from the buffer memory 1 and outputting the data to a host, such as a computer.

The bus control unit 2 is a control circuit for performing data transfer on an 8-bit data bus between the buffer memory 1, and any of the disc interface unit 12, the error correcting unit 5, and the host interface unit 13. The bus control unit 2 includes an address generating unit 21, a bus arbitration control unit 22, and a DMA channel unit 23. The bus arbitration control unit 22 allows exclusive access to the buffer memory 1. The address generating unit 21 generates and outputs an address for accessing the buffer memory 1. The DMA channel unit 23 establishes a bus connection between the buffer memory 1 and one of the disc interface unit 12, the error correcting unit 5, and the host interface unit 13, and has data transfer performed according to DMA (Direct Memory Access).

Figure 6:
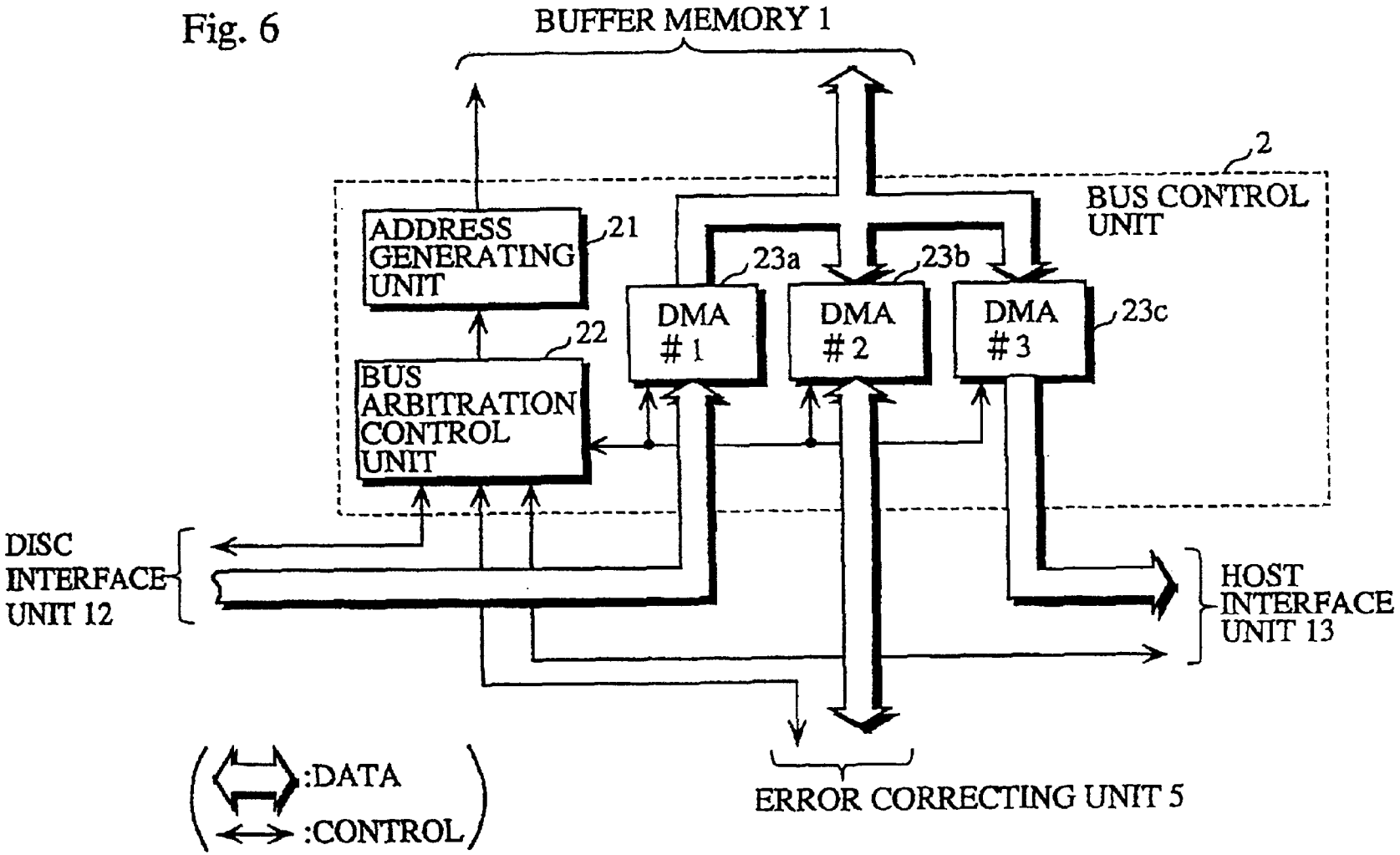
FIG. 6 is a block diagram showing the detailed composition of the bus control unit 2 in the error correction apparatus 100.

FIG. 6 is a block diagram showing the detailed composition of the bus control unit 2. In FIG. 6, the three DMA channels 23a~23c are DMA controllers that compose the DMA channel unit 23 shown in FIG. 5. This bus control unit 2 has a function for exclusively permitting one of three DMA to the buffer memory 1. This means that when the bus arbitration control unit 22 receives requests for access to the buffer memory 1 from the disc interface unit 12, the error correcting unit 5, and the host interface unit 13, the bus arbitration control unit 22 only allows one of these requests according to a scheduling procedure and priority list that are decided in advance.

The bus arbitration control unit 22 enables the first DMA channel 23a and outputs a control signal that allows data transfer by the disc interface unit 12. The bus arbitration control unit 22 also has the address generating unit 21 generate write addresses for the buffer memory 1 and allows the disc interface unit 12 to input data into the buffer memory 1. This data transfer stores data that has been read from the storage medium into the buffer memory 1 via the disc interface unit 12.

In the same way, the bus arbitration control unit 22 enables the second DMA channel 23b and outputs a control signal that allows data transfer by the error correcting unit 5. The bus arbitration control unit 22 also has the address generating unit 21 generate read addresses or write addresses for the buffer memory 1 and allows the error correcting unit 5 read data from or write data into the buffer memory 1. This data transfer for correcting errors allows the error correcting unit 5 to read data from the buffer memory 1 or to write corrected data back into the buffer memory 1.

In the same way, the bus arbitration control unit 22 enables the third DMA channel 23c and outputs a control signal that allows data transfer by the host interface unit 13. The bus arbitration control unit 22 also has the address generating unit 21 generate a read address for the buffer memory 1 and allows the host interface unit 13 to read data from the buffer memory 1. This data transfer for outputting data allows host interface unit 13 to read data from the buffer memory 1 and has the data in the buffer memory 1 outputted to a host via the host interface unit 13.

Note that the address generating unit 21 performs high-speed access to the buffer memory 1 during the three DMA transfers using page mode. So long as a page hit is achieved, a constant row address (RAS—Row Address Select) can be outputted to the buffer memory 1, with the address generating unit 21 only incrementing the column address (CAS—Column Address Select) by the required number of data elements.

Figure 7:
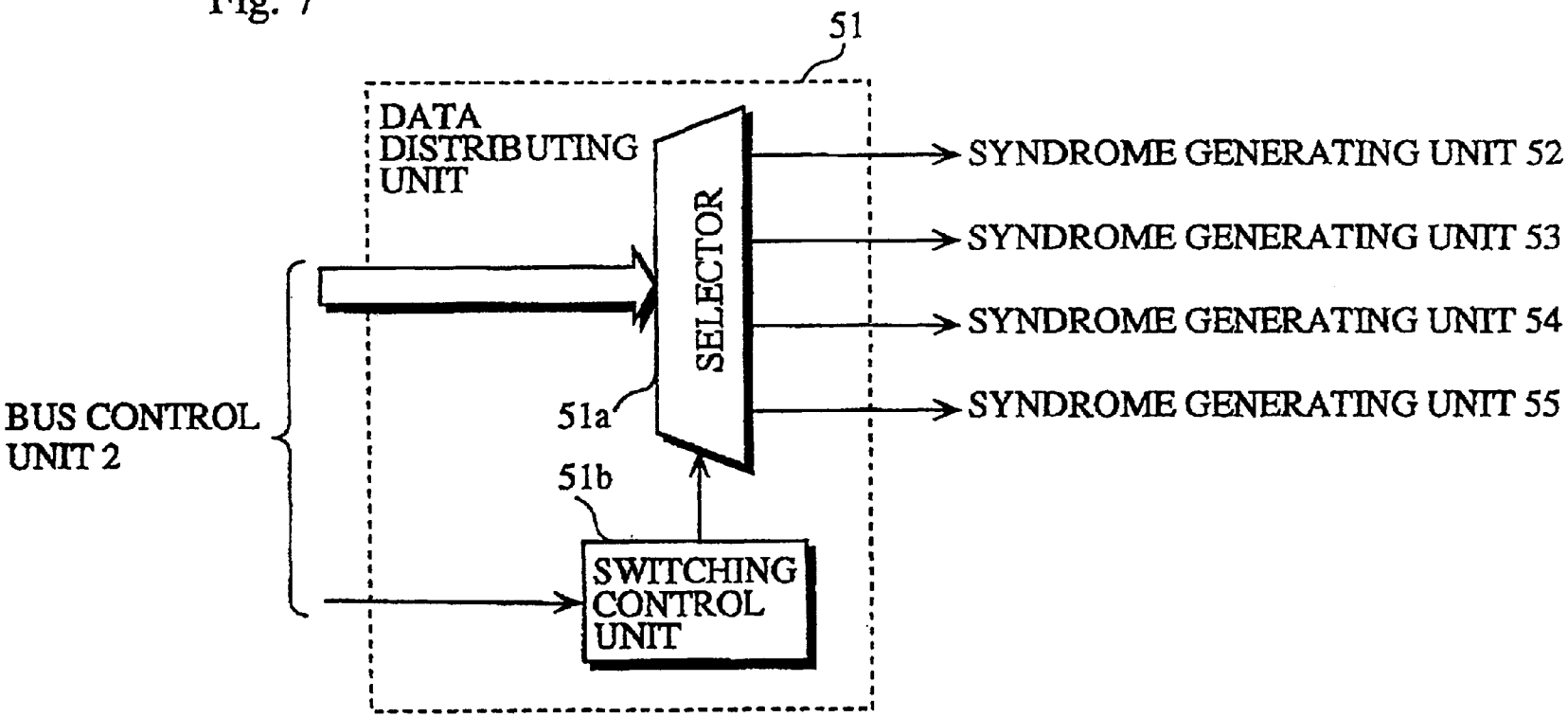
FIG. 7 is a block diagram showing the detailed composition of the data distributing unit 51 of the error correction apparatus 100.

FIG. 7 is a block diagram showing the detailed composition of the data distributing unit 51. The data distributing unit 51 includes a selector 51a and a switching control unit 51b. The selector 51a allows data sent by the bus control unit 2 to pass to one of the syndrome generating units 52~55. The switching control unit 51b controls the distribution of data by selector 51a according to instructions from the bus control unit 2. Using in built counter logic, the switching control unit 51b outputs control signals to the selector 51a in synchronization with the input of data into the selector 51a. However, the switching control unit 51b controls the selector 51a differently depending on whether error correction is performed in the row or column direction. This is described in more detail later in this specification.

Figure 8:
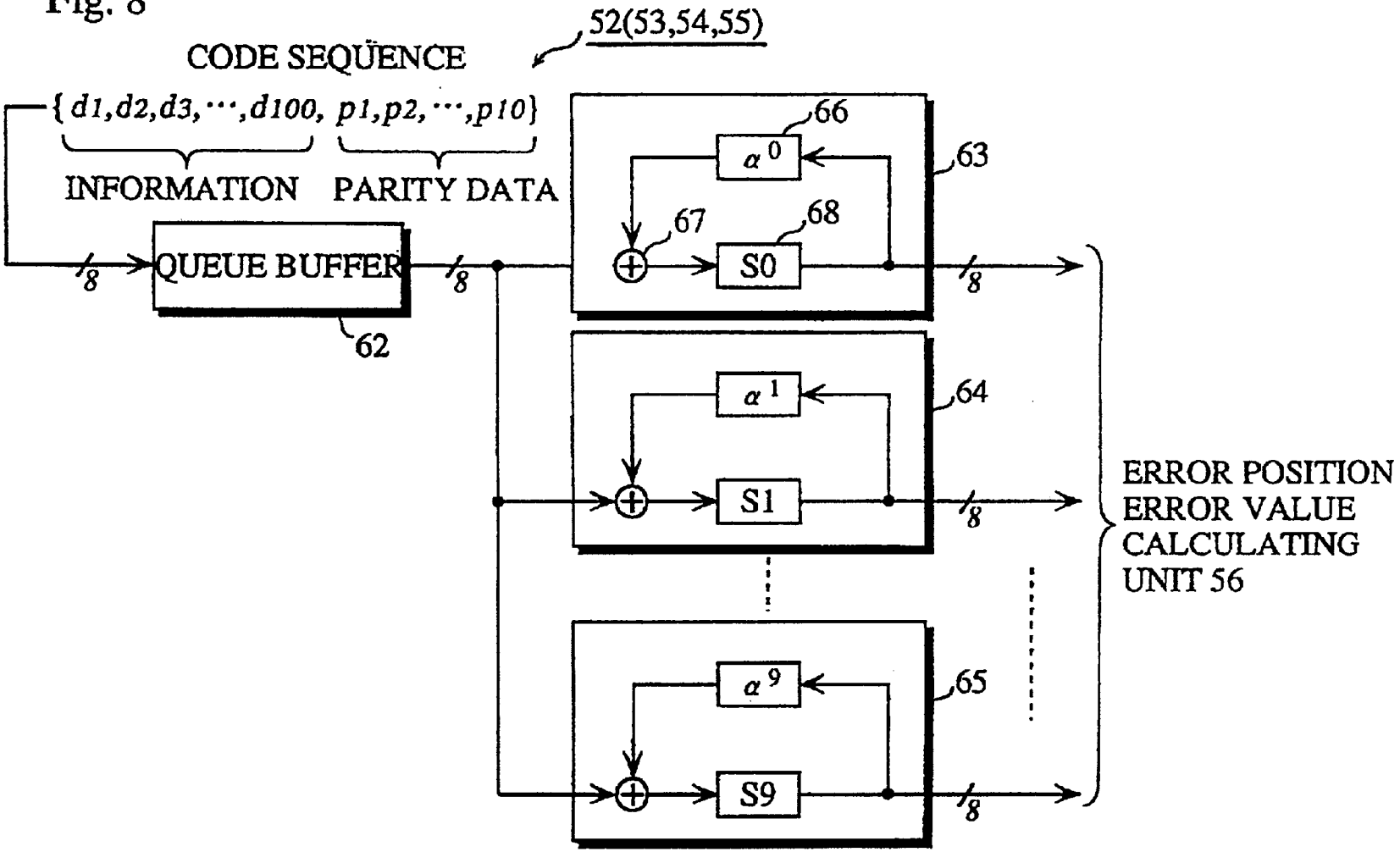
FIG. 8 is a block diagram showing the detailed composition of one syndrome generating unit 52 (53, 54, 55) in the error correction apparatus 100.

FIG. 8 is a block diagram showing the detailed composition of one syndrome generating unit 52 (53, 54, 55). The syndrome generating unit 52 includes a queue buffer 62 and ten types of syndrome calculating units 63~65. The queue buffer 62 temporarily stores up to eight inputted data elements in FIFO (first-in first-out) format. The syndrome calculating units 63~65 are connected in parallel to the output of the queue buffer 62 and are circuits that each repeatedly calculate a product-sum. Each syndrome calculating unit includes a register 68 for storing one product-sum value, a Galois field multiplier 66 for reading a product-sum value stored in the register 68 and multiplying it by a unique coefficient, and a Galois field adder 67 for adding the next inputted data element to the multiplication result of the Galois field multiplier 66.

The oldest data element d in the queue buffer 62 is read and is inputted into the ten syndrome calculating units 63~65 in parallel. In each of the syndrome calculating units 63~65, the product-sum $d+Sn*\alpha n$ is calculated and the result is stored in the register 68 to update Sn. As one example, suppose that a code sequence including 100 bytes of information numbered d1~d100 and 10 pieces of parity data numbered p1~p10 is sequentially inputted into the syndrome generating unit 52. This data is supplied in parallel to the ten syndrome calculating units 63~65 via the queue buffer 62. Focusing on the syndrome calculating unit 63, the first information element d1 is inputted first and is stored as it is in the register 68. When the next information element d2 is inputted, the syndrome calculating unit 63 calculates the product-sum d2+d1*α0 and stores the result in the register 68.

As described above, the syndrome calculating units 63~65 calculate a product-sum every time a data element is inputted, so that when the input of the last parity data element p10 has been inputted and processed, the data in the register 68 is the syndrome S0. The same calculation is performed in parallel by the other syndrome calculating units 64~65 so that ten types of syndrome S0~S9 are simultaneously generated.

The operation of the error correction apparatus 100 is described below.

Figure 1:
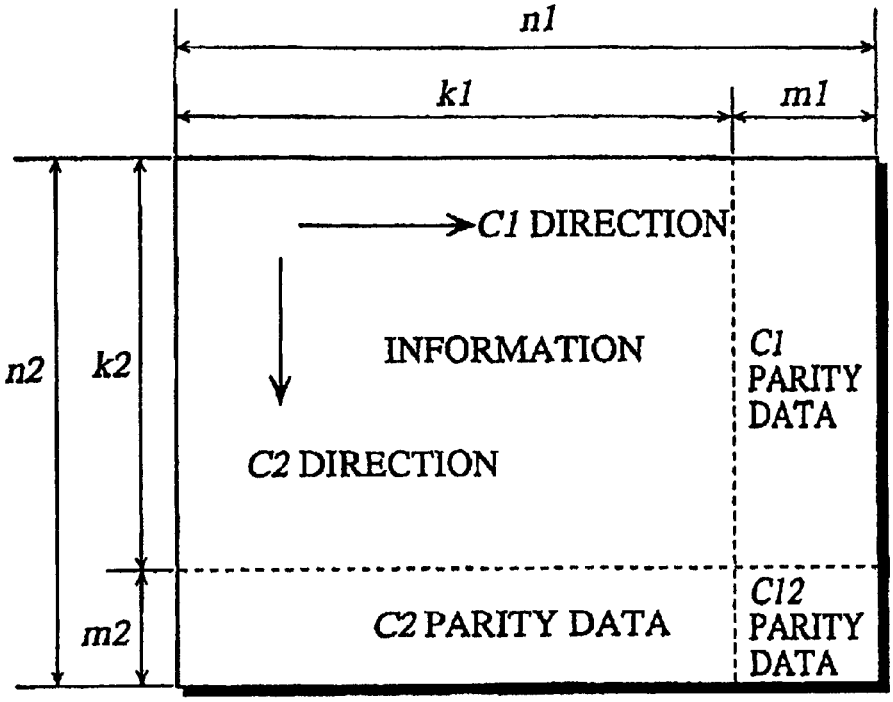
FIG. 1 shows the data structure of product code.
Figure 9:
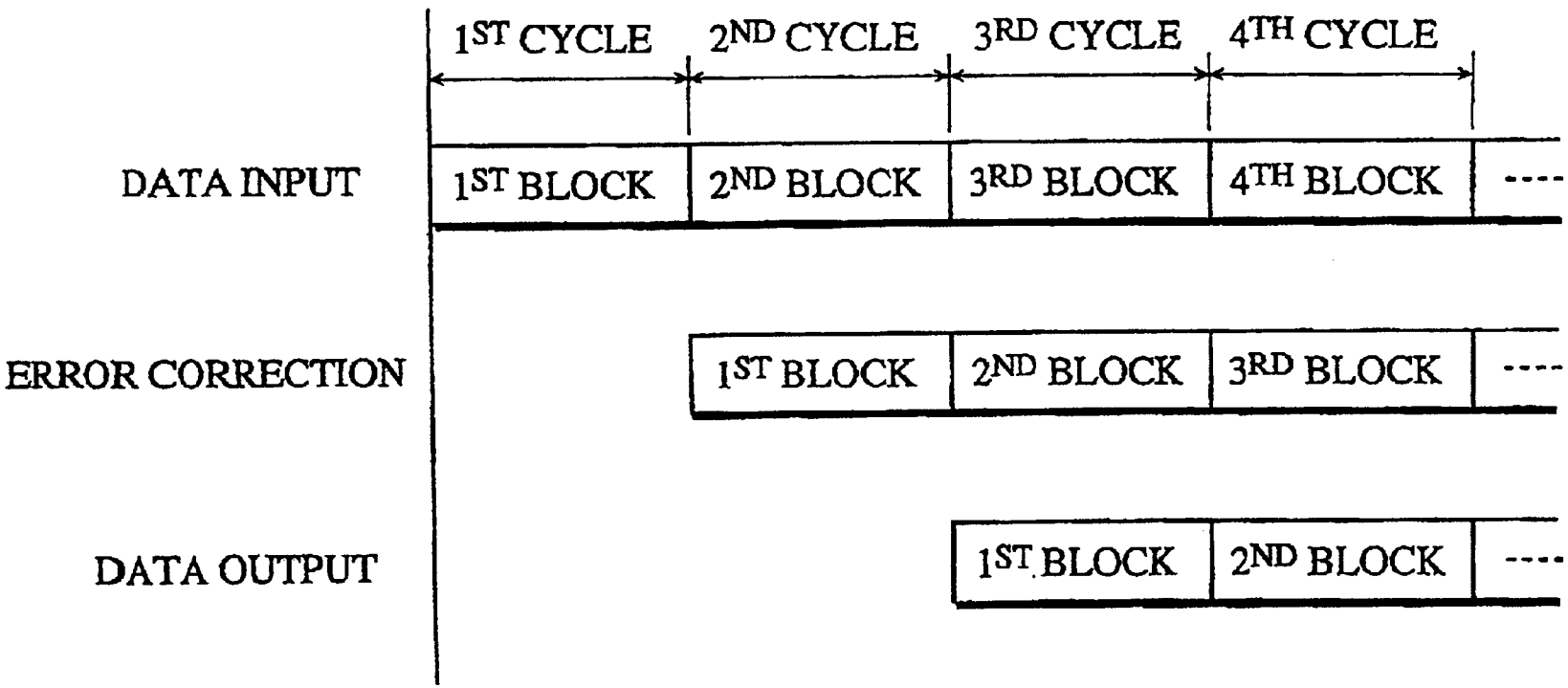
FIG. 9 is a timing chart for the major processes (data input, error correction, data output) performed by the error correction apparatus 100.

FIG. 9 is a timing chart for the major processes (data input, error correction, data output) performed by the error correction apparatus 100. This shows the flow of the processing when code sequences in the product code shown in FIG. 1 are sequentially processed as a plurality of blocks. Note that the $n^{th}$ block in FIG. 9 corresponds to all of the data in one set of product code shown in FIG. 1. The legends "data input", "error correction", and "data output" correspond to the operations of the bus control unit 2 when controlling data input, the data transfer performed for error correction, and data output.

In the first cycle, data input is performed for the first block. In the second cycle, data input is performed for the second block and error correction is performed for the first block in parallel. In the third cycle, data input is performed for the third block, error correction is performed for the second block, and data output is performed for the first block in parallel. In the fourth and succeeding cycles, data input is performed for a new block, error correction is performed for the immediately preceding block, and data output is performed for the preceding block that has just been subjected to error correction. These operations are performed in parallel.

As described above, the bus control unit 2 controls three kinds of transfer so that every block of data is subjected to three kinds of processing in what resembles a pipeline architecture. These three kinds of processing are data transfer from the disc interface unit 12 to the buffer memory 1, data transfer between the buffer memory 1 and the error correcting unit 5, and data transfer from the buffer memory 1 to the host interface unit 13. In these three kinds of data transfer, the buffer memory 1 is either the transmitter or recipient of data, even through the buffer memory 1 has only one input/output port. However, the bus control unit 2 has a preset priority list for the three types of data transfer and so can only allows one of the data transfers at any given instant. By switching between the three types of data transfer using time division, the bus control unit 2 performs control to have the data transfers performed using what appears to be parallel processing.

Figure 10:
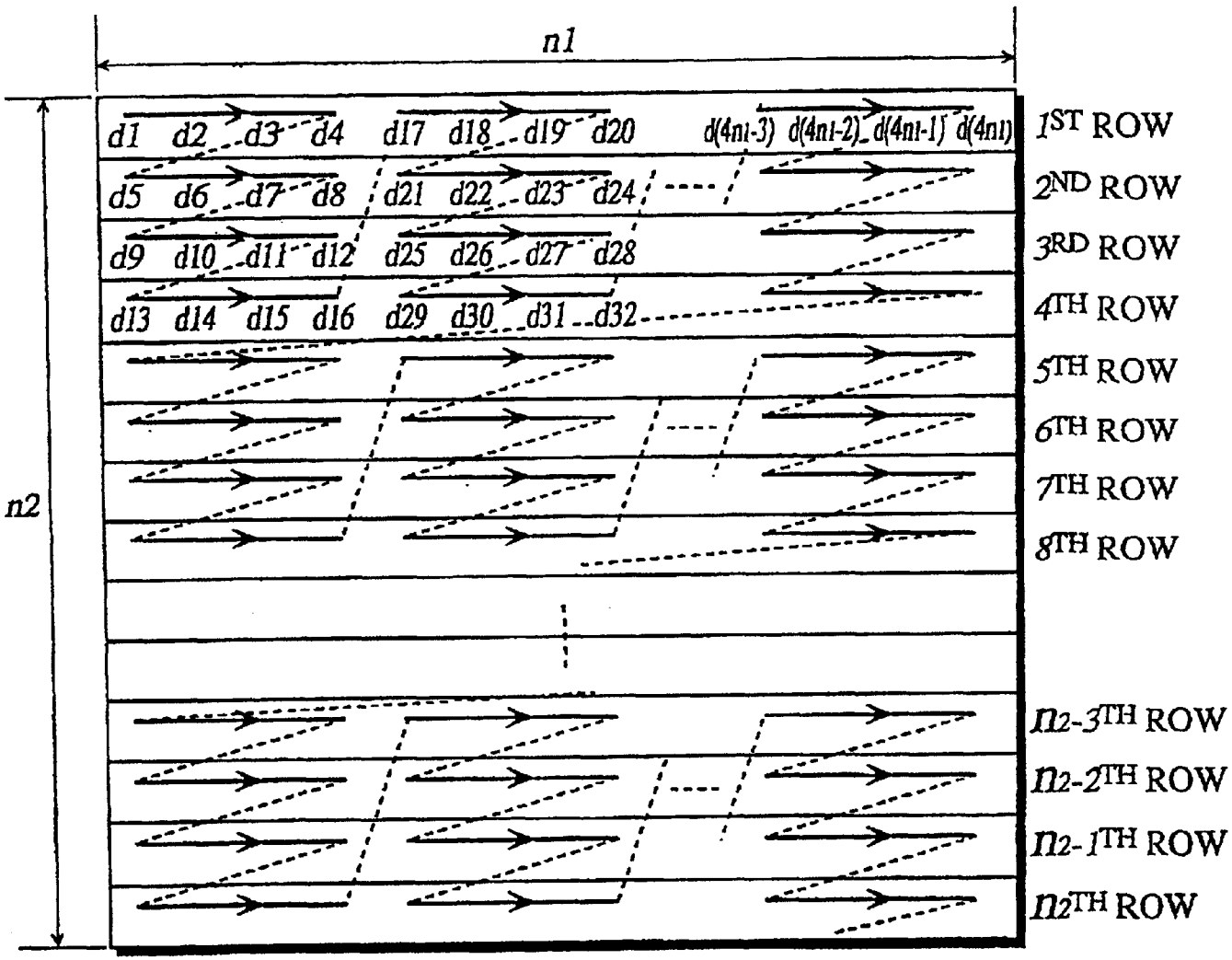
FIG. 10 shows the read order of the product code within the buffer memory 1 when performing error correction in the C1 direction.

FIG. 10 shows the read order of the product code within the buffer memory 1 when performing error correction in the C1 direction. The bus arbitration control unit 22 enables the second DMA channel 23b and notifies the error correcting unit 5 that data for the error correction in the C1 direction will be sent. Next, by having the read addresses outputted in a predetermined order from the address generating unit 21 to the buffer memory 1, the bus control unit 2 has the data in the buffer memory 1 transferred to the error correcting unit 5.

The bus control unit 2 consecutively reads four bytes of data on the first row (data d1~d4) of the buffer memory 1 and transfers this data to the error correcting unit 5. The bus control unit 2 then consecutively reads and transfers four bytes of data on the second row (data d5~data d8). The bus control unit 2 then consecutively reads and transfers four bytes of data on the third row (data d9~data d12). The bus control unit 2 then consecutively reads and transfers four bytes of data on the second row (data d13~data d16). The processing then returns to the first row and the bus control unit 2 reads and transfers four bytes of data (data d17~d20). This reading and transferring continue until all of the data on the first to fourth rows has been read and transferred, at which point the processing advances to the fifth-eighth rows that are read and transferred in the same way. By doing so, the processing for reading and transferring four rows of data in parallel is repeated until every row in the block has been transferred.

Note that the bus control unit 2 performs the reading and transferring of four consecutive bytes in the row direction by successively performing an indivisible process using a DMA mode. This means that memory access to the buffer memory 1 cannot be made for other processes such as data input and data output while this data transfer is being performed. Since four consecutive data elements in the row direction will always be stored in consecutive addresses in the buffer memory 1, high-speed access to the DRAM is performed by achieving page hits.

Figure 11:
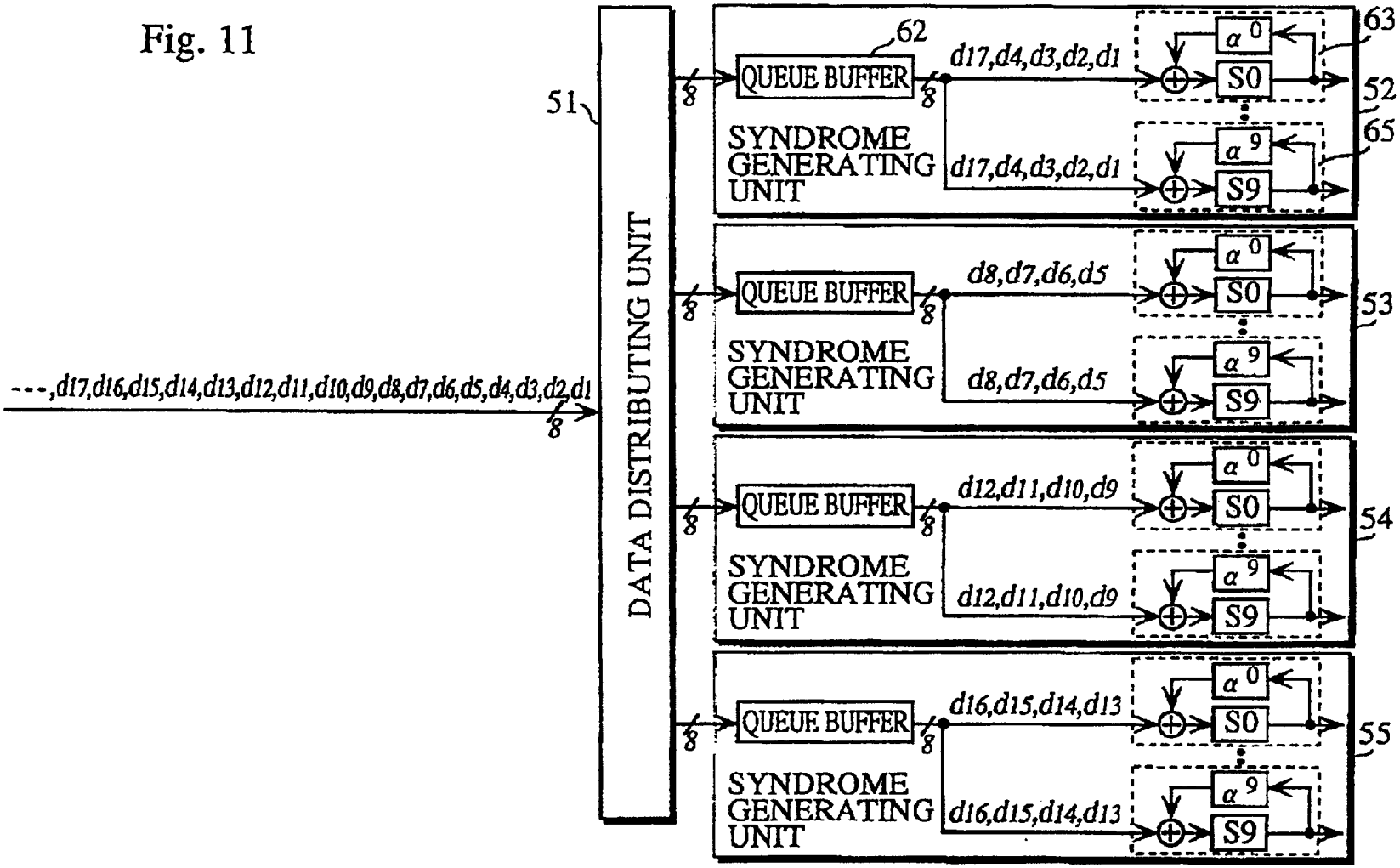
FIG. 11 shows the operation of the data distributing unit 51 when data is transferred from the buffer memory 1 in the order shown in FIG. 10.

FIG. 11 shows the operation of the data distributing unit 51 in the error correcting unit 5 when data is transferred from the buffer memory 1 in the order shown in FIG. 10. On being instructed to start the error correction in the C1 direction by the bus control unit 2, the switching control unit 51b controls the selector 51a and so has the data sent from the bus control unit 2 distributed in the following way.

The data distributing unit 51 distributes the four bytes of data d1~d4 on the first row it receives first to the syndrome generating unit 52. The data distributing unit 51 then distributes the four bytes of data d5~d8 on the second row it receives next to the syndrome generating unit 53, the four bytes of data d9~d12 on the third row to the syndrome generating unit 54, and four bytes of data d13~d16 on the fourth row to the syndrome generating unit 53. In the same way, data distributing unit 51 distributes the four bytes of data d17~d20 on the first row it receives next to the syndrome generating unit 52. Accordingly, during error correction in the C1 direction, data is repeatedly sent in four-byte units from the buffer memory 1 via the bus control unit 2, with the data distributing unit 51 distributing each four-byte set of data to one of the four syndrome generating units 52~55 that is selected in order.

Figure 12:
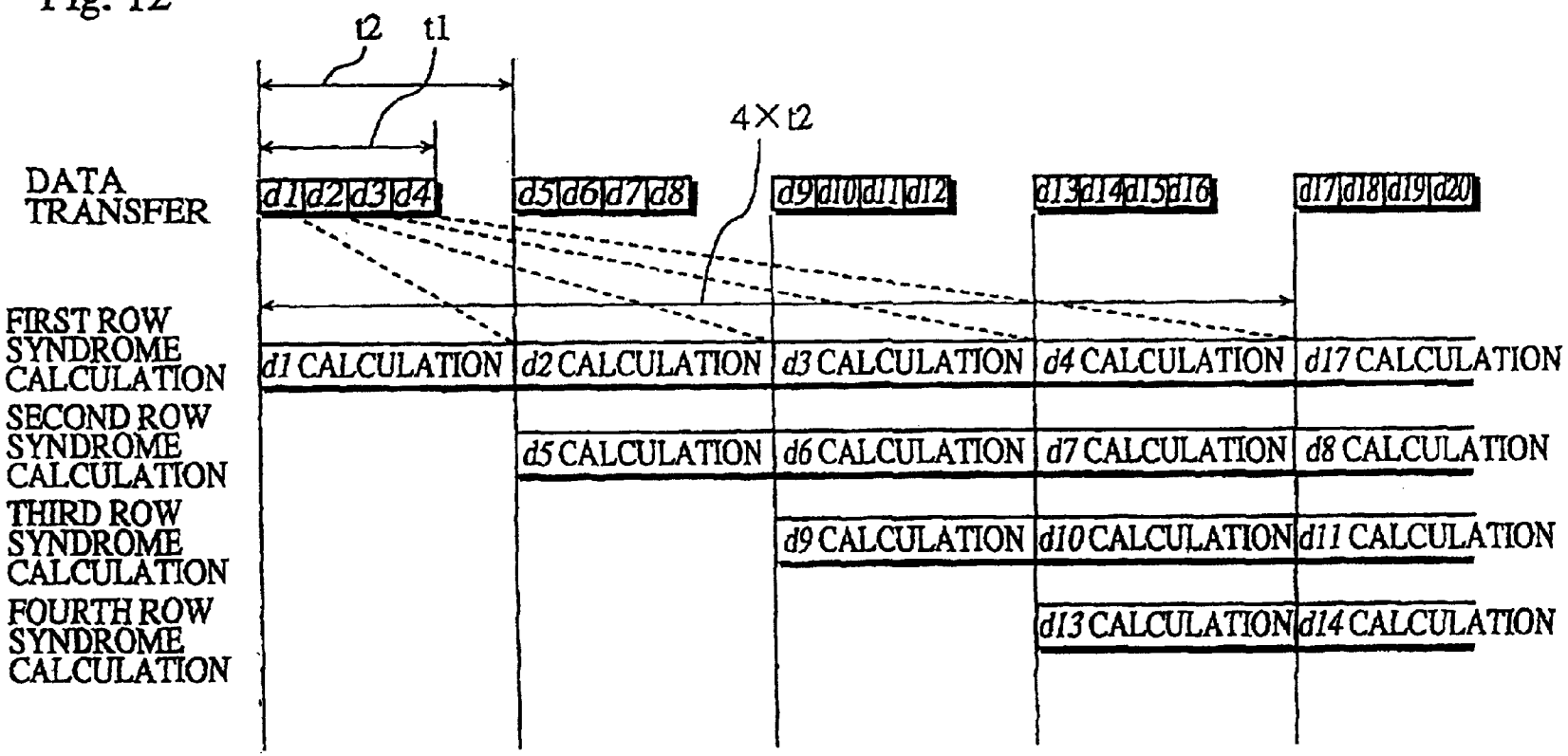
FIG. 12 shows the timing of the data transfer from the buffer memory 1 to the error correcting unit 5 and of the product-sum calculation by the four syndrome generating units 52~55 during the error correction in the C1 direction.

FIG. 12 shows the timing of the data transfer from the buffer memory 1 to the error correcting unit 5 and of the product-sum calculation by the four syndrome generating units 52~55 during the error correction in the C1 direction.

The reading of each four-byte unit of data (such as data d1~d4 or d5~d8) from the buffer memory 1 and transfer to the error correcting unit 5 takes time t1. The transfer of a four-byte unit of data is repeated at intervals of t2 in FIG. 12. The reason an interval is required between the end of data transfer for a first four-byte unit of data and the start of data transfer for the next four-byte unit of data is that these units of data exist on different rows in the buffer memory 1, meaning that there is the risk of a page miss whenever a next four-byte unit of data is read. Accordingly, it is assumed that the bus control unit 2 will need to output a new row address to the buffer memory 1 when accessing a first byte in a next four-byte unit of data.

The four syndrome generating units 52~55 respectively calculate syndromes for the first to four rows and calculate four product-sum values that are required for the inputted four bytes within a period that is four times t2. As one example, the syndrome generating unit 52 performs a product-sum calculation for the four bytes of data d1~d5 within four times t2. Focusing on syndrome generating unit 52, the data that is inputted after data d1~d5 is data d17~d20, with the interval between the input of these four-byte units of data being four times t2. Accordingly, the calculation of the product-sum for a four-byte unit of data only needs to be completed within four times t2. Provided that the calculation speed is sufficient for this condition to be satisfied, the amount of data that will accumulate in the queue buffer 62 that precedes the syndrome generating units 52~55 will not exceed a maximum of four bytes, not even momentarily.

The syndrome generating units 52~55 each need to complete a product-sum calculation of one byte in time t2, so that the syndrome calculation may be performed at a speed that is ¼ of the data transfer speed (4/t2). The processing for a plurality of different code sequences proceeds in parallel for small data units (four bytes), so that compared with methods where one code sequence is processed at a time, the syndrome calculation can be performed at a slower speed and a smaller queue buffer can be used. Putting this another way, the effective transfer speed from the buffer memory 1 to the error correcting unit 5 is raised in comparison with conventional techniques and error correction can be performed for four sequences in parallel with a smaller circuit size than the case where a plurality of error correction circuits are provided.

Note that by increasing the number of data elements consecutively read from the same code sequence, more page hits can be achieved when transferring data from the DRAM. When doing so, increasing the parallelism of the error correction is preferable. If the number of bytes that are transferred from consecutive memory addresses is increased in keeping with the degree of parallelism of the error correction processing, the circuit scale can be reduced with regard to the processing load for one code sequence. This means efficient error correction can be performed in parallel.

Figure 13:
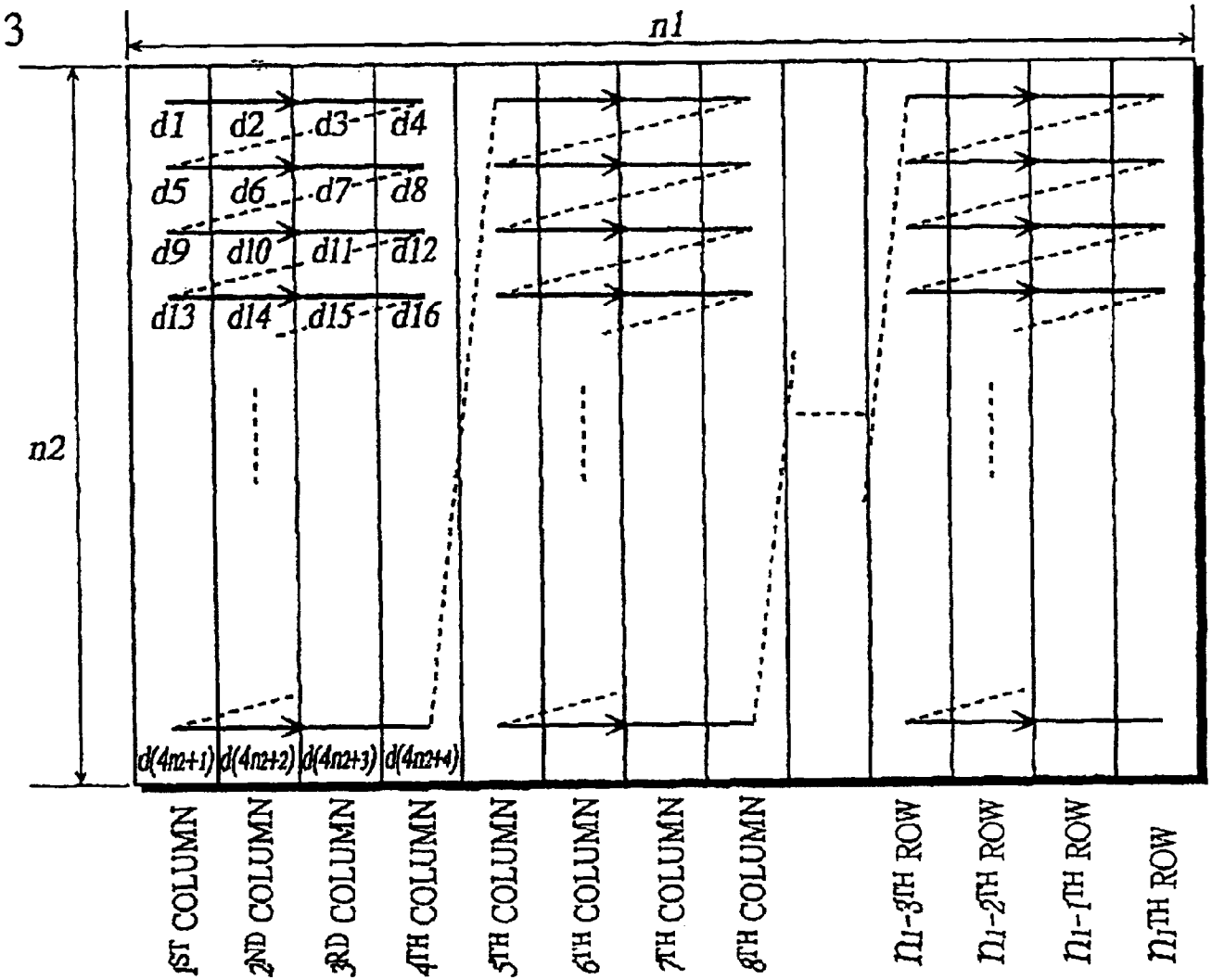
FIG. 13 shows the read order for the product codes in the buffer memory 1 when error correction is performed in the C2 direction.
Figure 14:
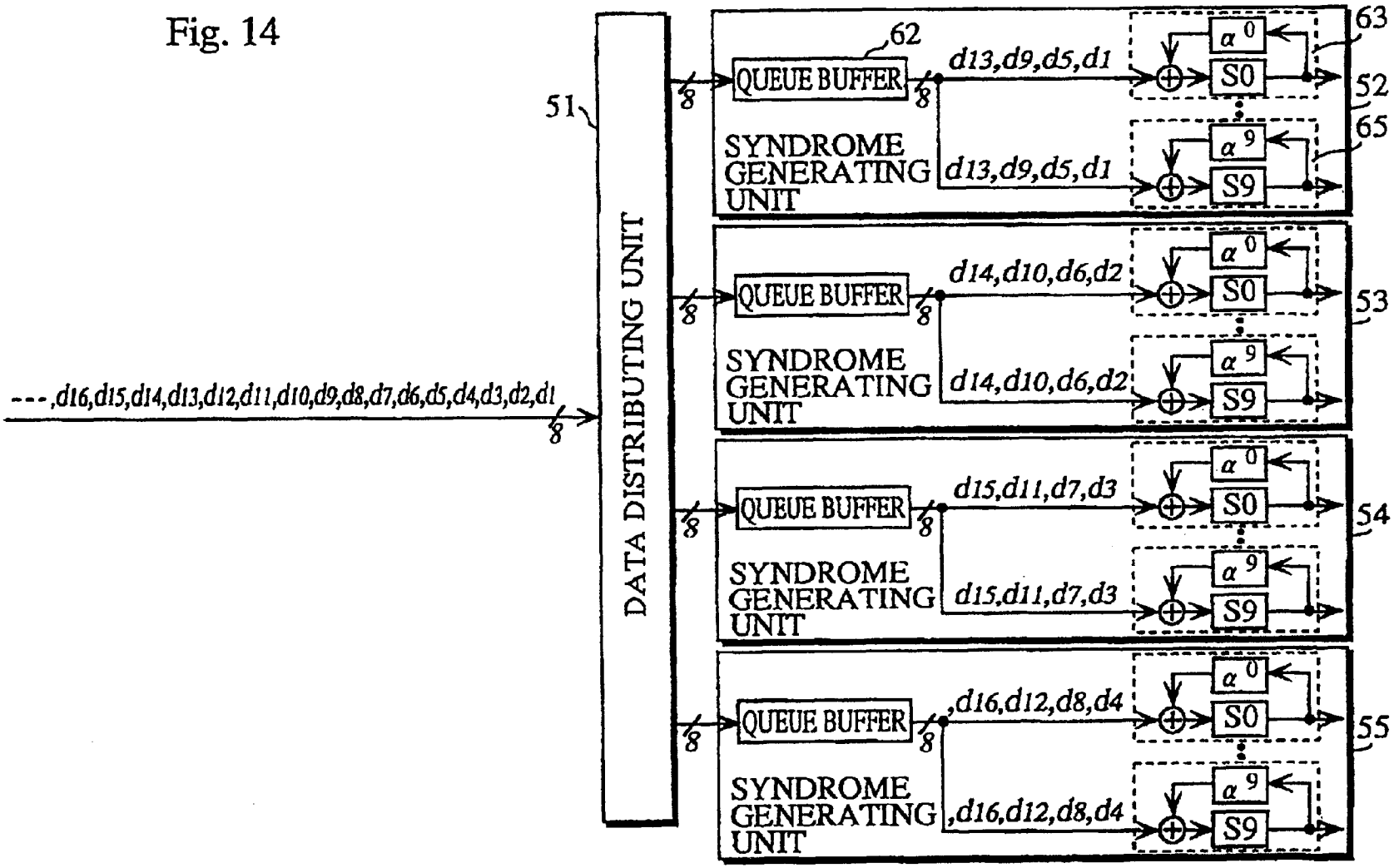
FIG. 14 shows the operation of the data distributing unit 51 when data is transferred from the buffer memory 1 in the order shown in FIG. 13.
Figure 15:
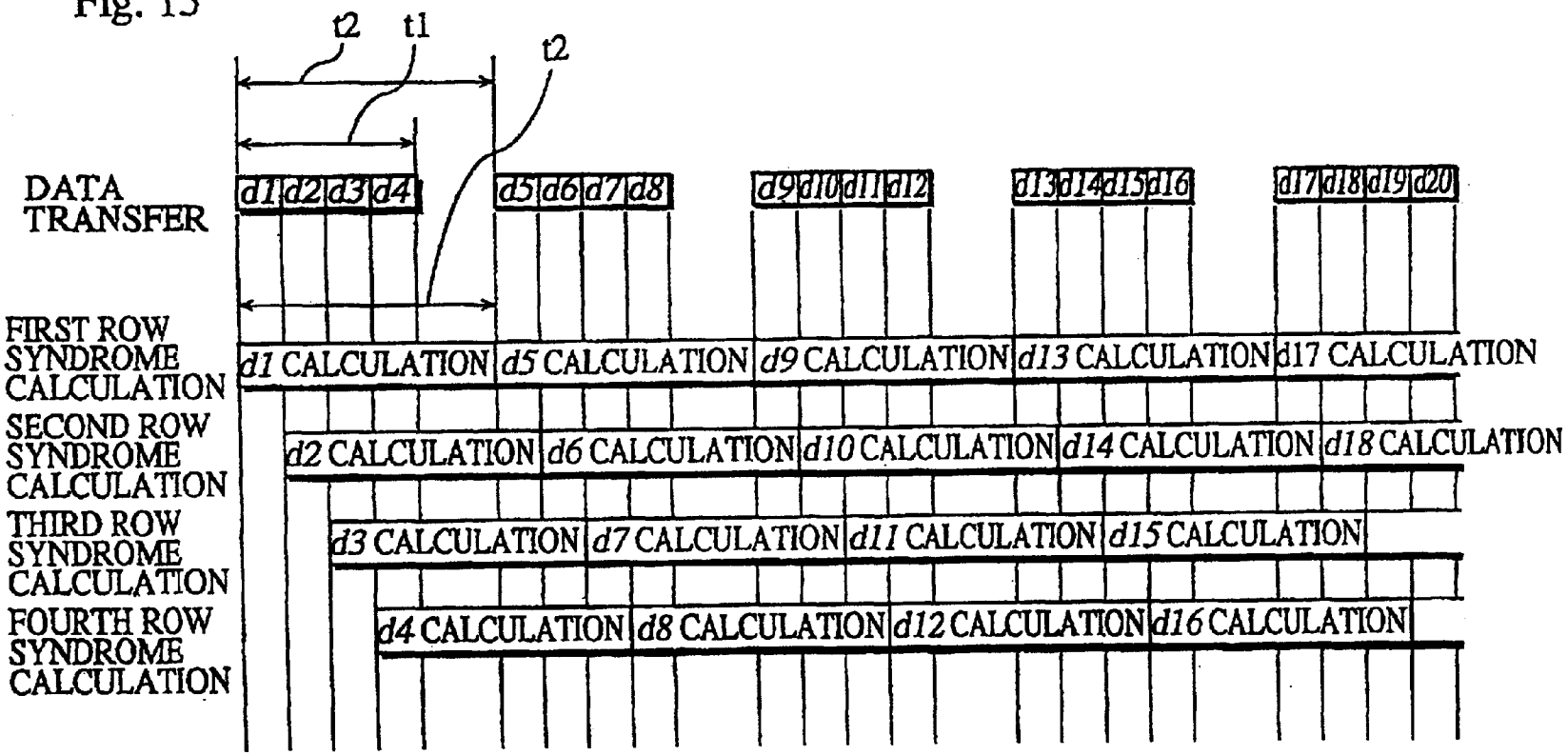
FIG. 15 shows the timing of the data transfer from the buffer memory 1 to the error correcting unit 5 and of the product calculation by the four syndrome generating units 52~55 during the error correction in the C2 direction.

The following is an explanation of the operation of the error correction apparatus 100 when performing error correction in the C2 direction, with reference to FIGS. 13~15.

FIG. 13 shows the read order for the product codes in the buffer memory 1 when error correction is performed in the C2 direction. The bus arbitration control unit 22 enables the second DMA channel 23b and notifies the error correcting unit 5 that data transfer will be performed for the error correction in the C2 direction. Next, by having the address generating unit 21 output read addresses in a predetermined order to the buffer memory 1, the bus control unit 2 has the data in the buffer memory 1 transferred to the error correcting unit 5.

The bus control unit 2 consecutively reads four bytes of data on the first row (data d1~d4) of the buffer memory 1 and transfers this data to the error correcting unit 5. The bus control unit 2 then consecutively reads and transfers four bytes of data on the second row (data d5~data d8). This reading and transfer of the first four bytes of data are repeated for all of the data on the first four rows. In this way, the transfer of data in four code sequences in the C2 direction is completed. The same reading and transfer are performed for all of the data in columns 5~8 in four-byte units. In this way, this reading and transfer in parallel of all of the data in four columns are repeated until all of the columns in one block have been transferred.

In the same way as when performing data transfer in the C1 direction, the bus control unit 2 reads and transfers four bytes of data that are consecutive in the row direction using DMA mode so that processing units that cannot be further divided into shorter time slots are continuously performed. In other words, the bus control unit 2 prohibits access to the buffer memory 1 for other processing (data input, data output) during each of these data transfers, and so can make high-speed access to the DRAM by achieving page hits.

FIG. 14 shows the operation of the data distributing unit 51 in the error correcting unit 5 when data is transferred from the buffer memory 1 in the order shown in FIG. 13. On being instructed to start the error correction in the C1 direction by the bus control unit 2, the switching control unit 51b controls the selector 51a and so has the data that has been received from the bus control unit 2 distributed in the following way.

The data distributing unit 51 distributes the four bytes of data d1~d5 on the first row it receives first to the syndrome generating units 52~55 in order. In detail, the data distributing unit 51 sends data d1 to syndrome generating unit 52, data d2 to syndrome generating unit 53, data d3 to syndrome generating unit 54, and data d4 to syndrome generating unit 55. The data distributing unit 51 operates in the same way for data d5~d8, so that the four bytes of data are respectively inputted into a different one of the syndrome generating units 52~55 in order. In this way, the data distributing unit 51 repeats a process distributing each byte in the received four byte units to the syndrome generating units 52~55 when error correction is to be performed in the C2 direction.

As a result, the data d1, d5, . . . that belongs to the first column is inputted into the syndrome generating unit 52, the data d2, d6, . . . that belongs to the second column is inputted into the syndrome generating unit 53, the data d3, d7, . . . that belongs to the third column is inputted into the syndrome generating unit 54, the data d4, d8 . . . that belongs to the fourth column is inputted into the syndrome generating unit 55. In the same way, data that belongs to the fifth column is inputted into the syndrome generating unit 52, data that belongs to the sixth column is inputted into the syndrome generating unit 53, data that belongs to the seventh column is inputted into the syndrome generating unit 54, and data that belongs to the eighth column is inputted into the syndrome generating unit 55.

FIG. 15 shows the timing of the data transfer from the buffer memory 1 to the error correcting unit 5 and of the product calculation by the four syndrome generating units 52~55 during the error correction in the C1 direction.

The reading of each four-byte unit of data (such as data d1~d5 or d5d8) from the buffer memory 1 and transfer to the error correcting unit 5 takes time t1. The transfer of a four-byte unit of data is repeated an interval of t2, in the same way as in the processing in the C1 direction shown in FIG. 12.

The four syndrome generating units 52~55 respectively calculate a syndrome for the first to fourth columns, and each calculate a product-sum for each byte of data within a period equal to time t2. As one example, the syndrome generating unit 52 that calculates the syndrome for the first column calculates a sum-product for the one-byte data d1 that is inputted first within the time t2. The syndrome generating unit 52 similarly calculates a sum-product for the one-byte data d5 that is inputted next within time t2. By focusing on the syndrome generating unit 52, this restriction is due to one byte of data being inputted in t2 intervals. Provided this calculation speed can be maintained, the amount of data that accumulates in the queue buffer that is provided in front of the syndrome generating units 52~55 will not exceed one byte, not even momentarily.

As described above, the syndrome generating units 52~55 only need to calculate a product-sum value for one byte in time t2, which is the same processing speed as when performing error correction in the C1 direction. While data is inputted into the syndrome generating units 52~55 in bursts during the error correction in the C1 direction, data is inputted uniformly (at a steady rate of one byte per time t2) during the error correction in the C2 direction, so that there is no need to provide a queue buffer in front of each of the syndrome generating units 52~55.

As described above, this first embodiment sets the number of data elements consecutively read from one address in the buffer memory 1 (which is to say, data on the same row in the product code) and transferred to the error correcting unit 5 equal to the number of calculations performed in parallel by the error correcting unit 5. As a result, the relation between the read speed from the buffer memory 1 and the calculation speed for the product-sum values for each syndrome generating unit becomes equal for the error correction in both the C1 and C2 directions. This means that only a small queue buffer needs to be provided before the syndrome generating units. With this construction, the control procedure performed by the bus control unit 2 to realize the full processing potential of each syndrome generating unit becomes uniform for the error correction in both the C1 and C2 directions. This enables an error correction apparatus that performs high-speed error correction with a small-scale circuit to be realized.

This apparatus is well balanced between the error correction in the C1 direction and the error correction in the C2 direction, and so can reduce redundancy in the circuitry required for the error correction apparatus.

The read orders shown in FIG. 10 and FIG. 13 assume that the number of bytes in the code sequence in the row direction is a multiple of four, although the error correction apparatus 100 can still perform error correction correctly even if this is not the case. As one example, if division of the number of bytes in the code sequence in the row direction leaves a remainder of two, the reading order of product code in the buffer memory 1 will be as follows.

Figure 16:
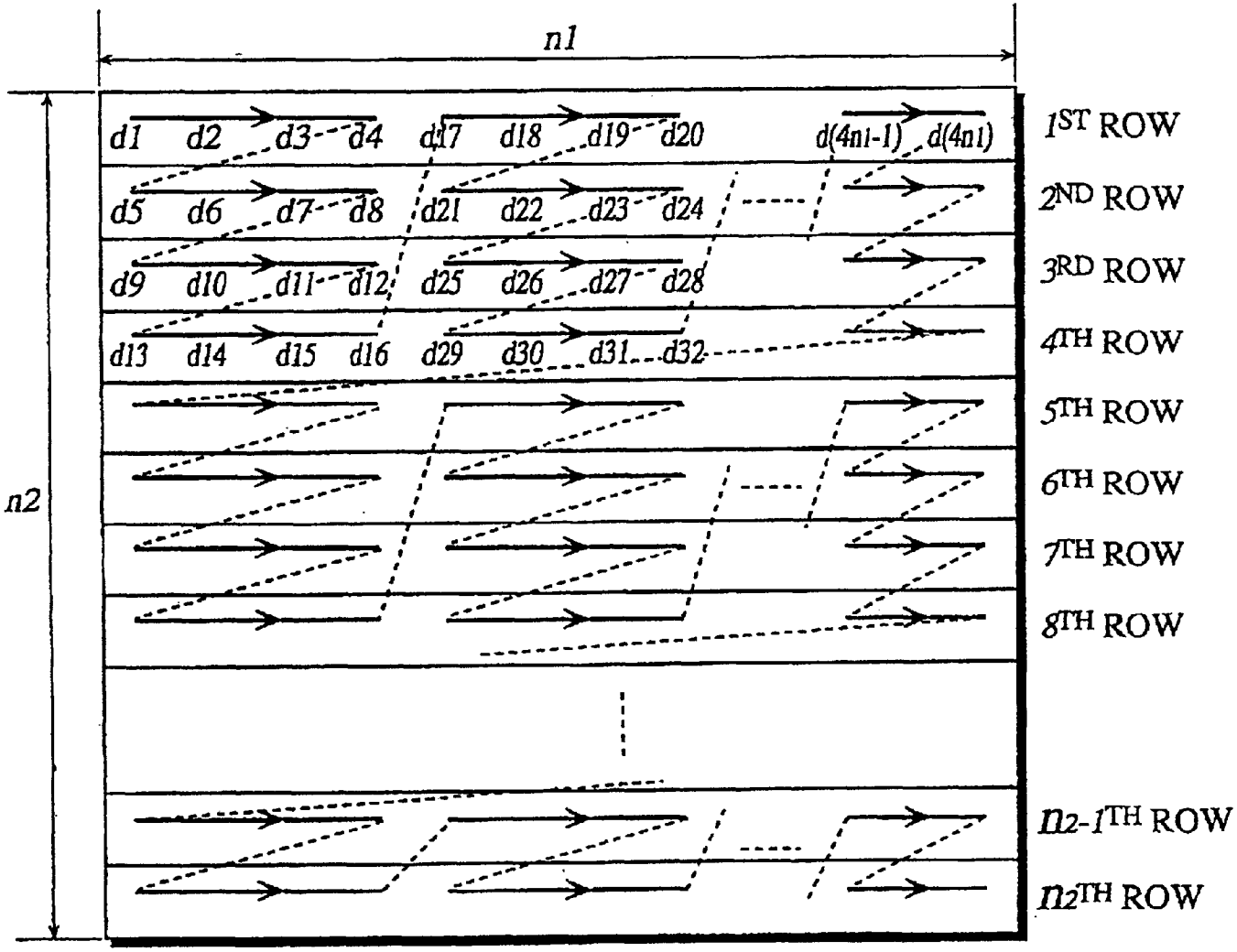
FIG. 16 shows the processing order for the end part of code sequences in the C1 direction.
Figure 17:
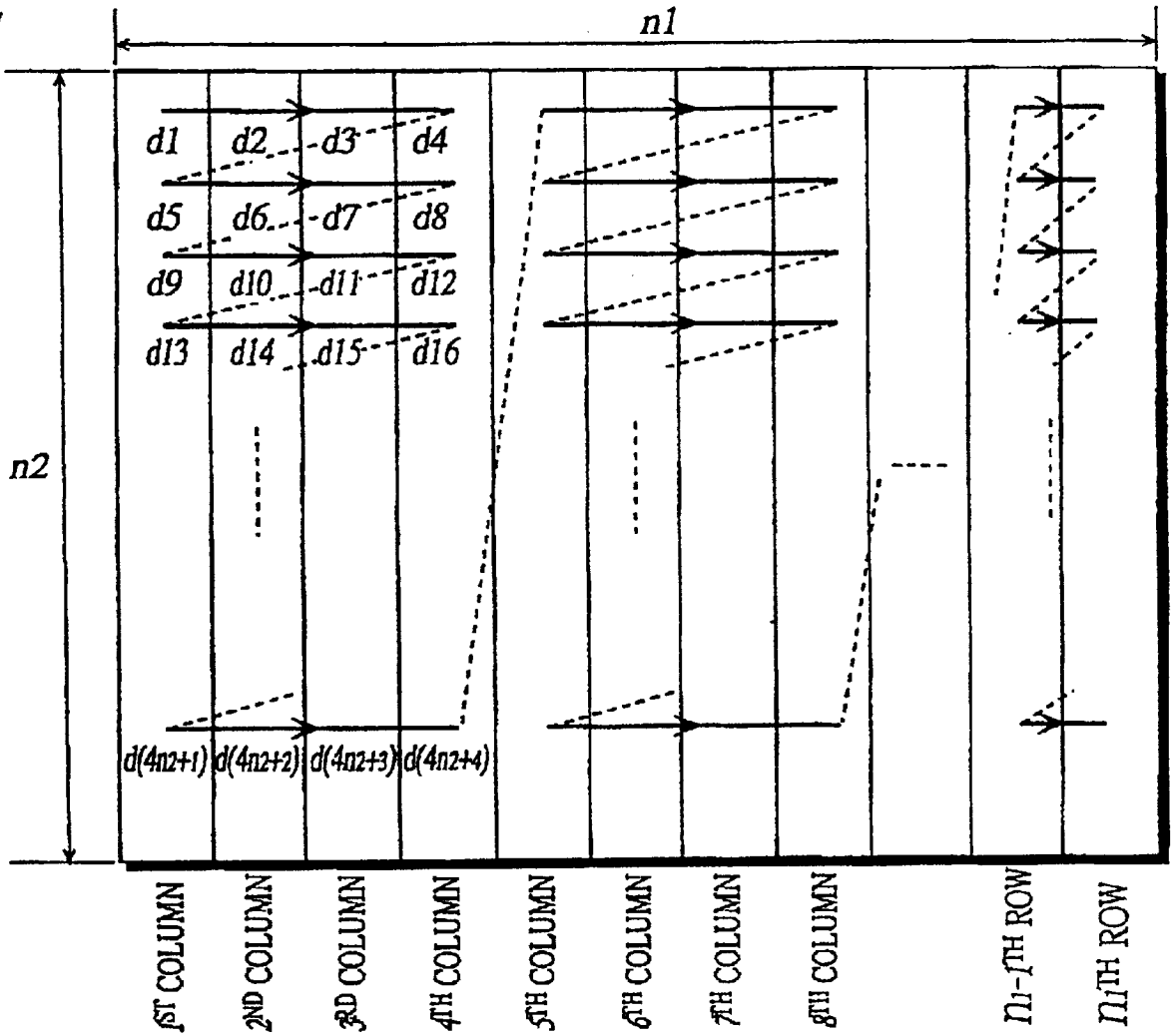
FIG. 17 shows the processing order for the end part of code sequences in the C2 direction.

FIG. 16 shows the processing order for the product code in the buffer memory 1 when performing error correction in the C1 direction, when division of the number of bytes in the code sequence in the row direction leaves a remainder of two. When reading all but the last two columns in the code sequence, the bus control unit 2 repeatedly reads and transfers four bytes at a time from four consecutive columns as before. For the final two columns, the bus control unit 2 repeatedly reads and transfers two bytes at a time from two columns. The data distributing unit 51 performs the same operation as before, and so on receiving a four-byte unit of data, distributes the four-byte data to one of the syndrome generating units 52~55 in order. On receiving a two-byte unit of data, the data distributing unit 51 similarly distributes the two-byte data to one of the syndrome generating units 52~55 in order.

This amendment to the read order used by the bus control unit 2 and the distributing order used by the data distributing unit 51 can be easily realized by changing the respective control procedures of the bus arbitration control unit 22 in the bus control unit 2 and switching control unit 51b in the data distributing unit 51.

This first embodiment describes an apparatus that calculates syndromes in parallel for four code sequences, although the number of calculations that are performed in parallel need not be four. As one example, two or eight calculations may be performed in parallel. This means that the error correction apparatus 100 of this first embodiment may include two or eight syndrome generating units as necessary.

Figure 18:
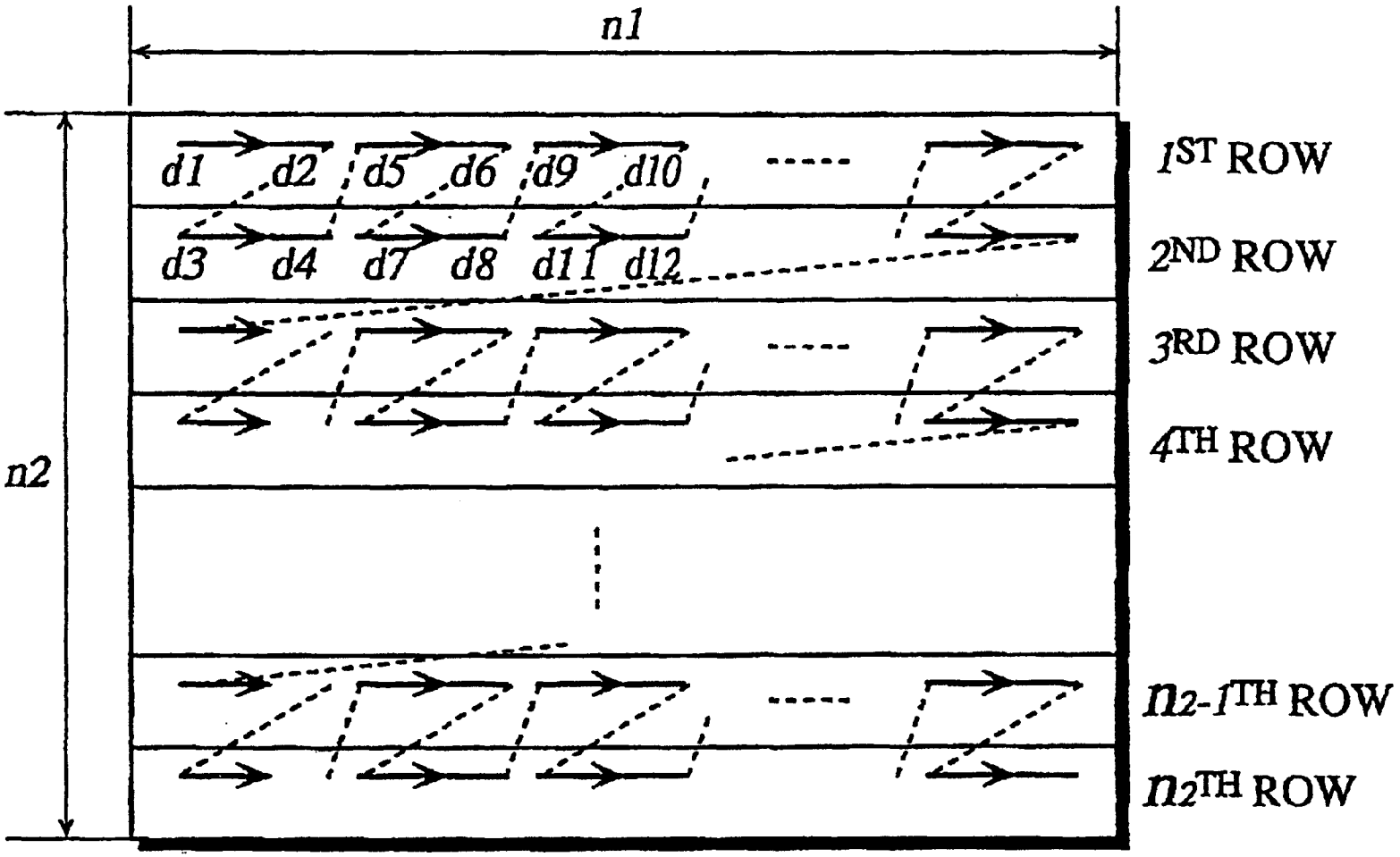
FIG. 18 shows the read order for the product codes in the buffer memory 1 when error correction is performed in the C1 direction for two adjacent rows.
Figure 19:
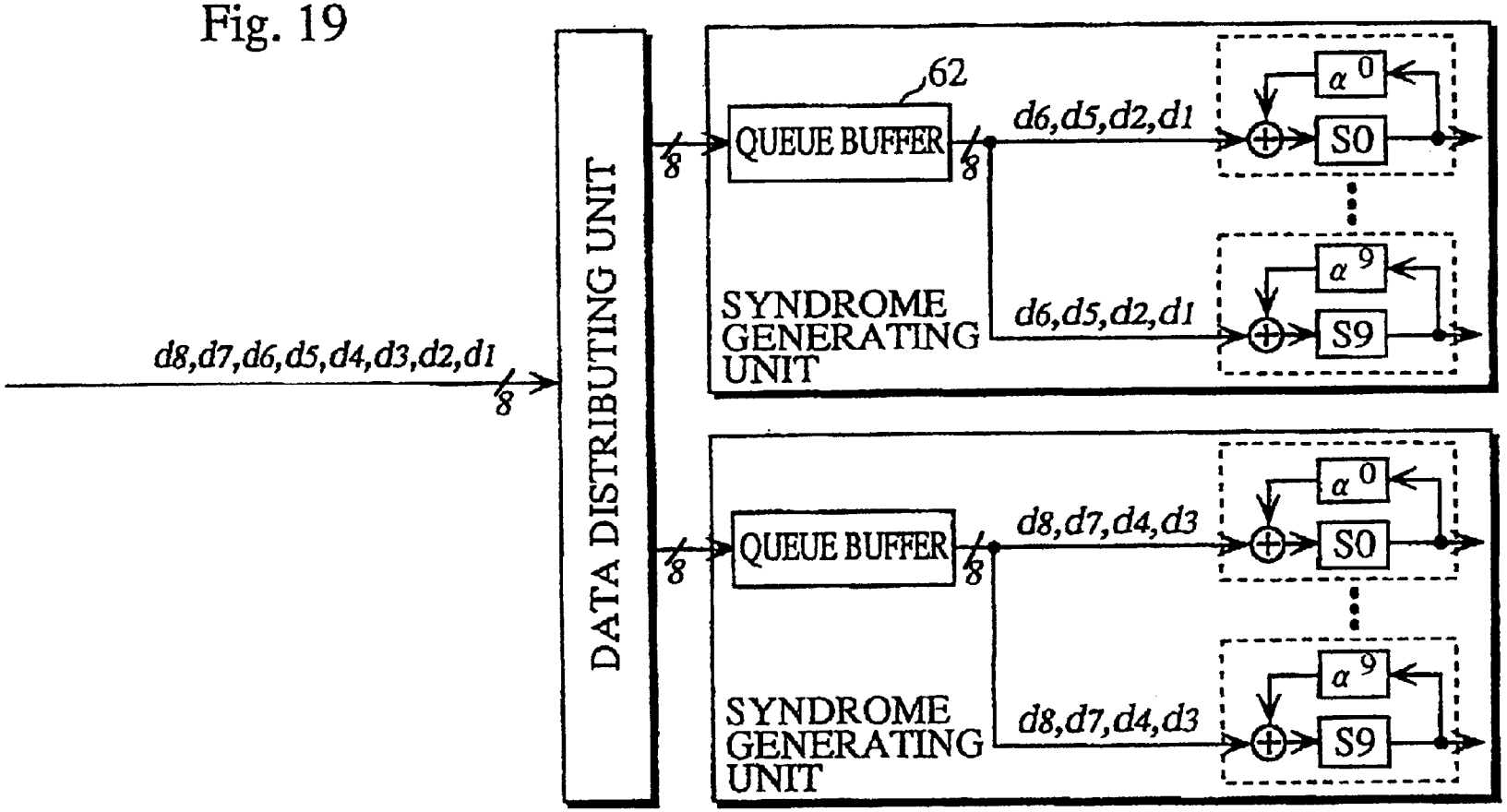
FIG. 19 shows the operation of the data distributing unit 51 when error correction is performed in the C1 direction for two adjacent rows.
Figure 20:
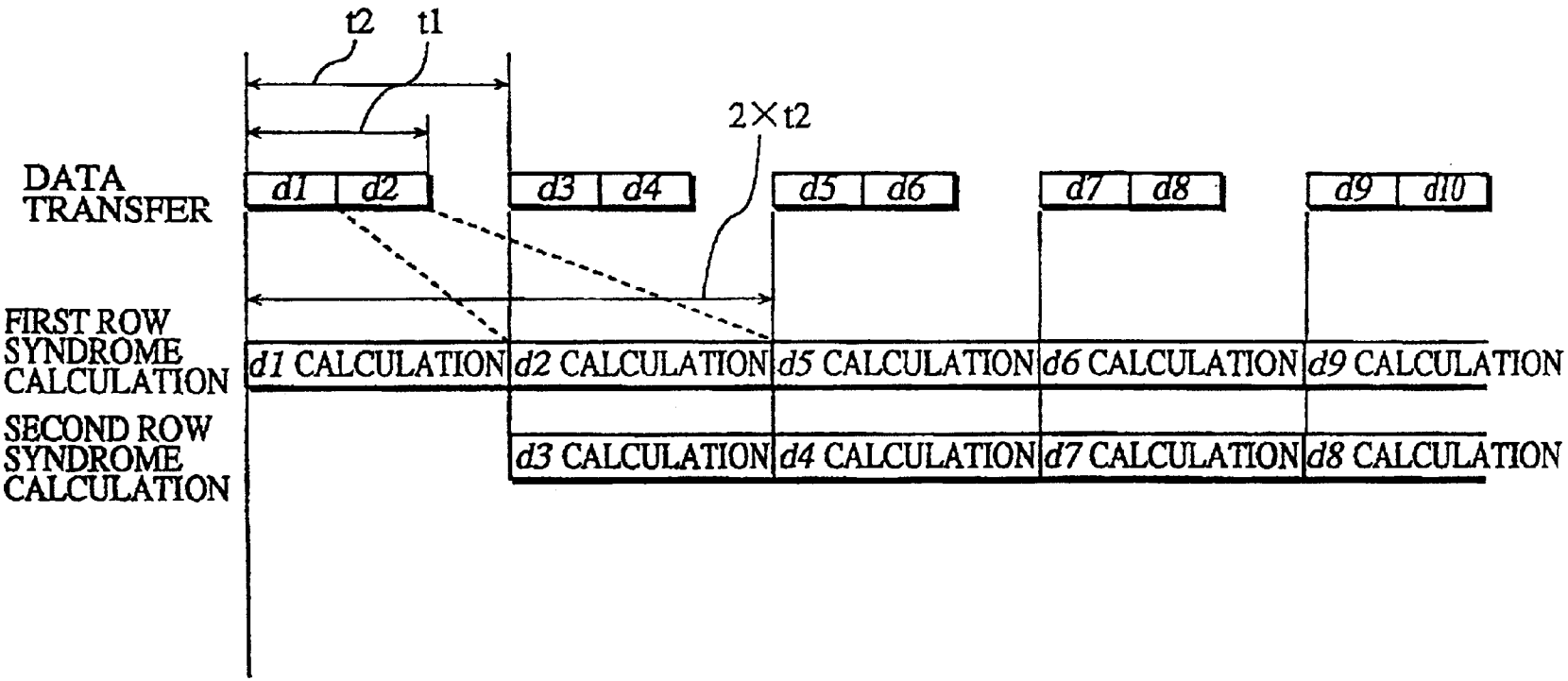
FIG. 20 shows the timing of the data transfer and the syndrome calculation when error correction is performed in the C1 direction for two adjacent rows.

FIGS. 18, 19, and 20 show the operation for error correction for a C1 direction in an error correction apparatus that performs two error correction processes in parallel. These figures respectively show the read order for reading data from the buffer memory, the operation of the data distributing unit when inputting data into the respective error correcting units when data is inputted in the illustrated order, and the timing of data transfer and syndrome calculation.

Figure 21:
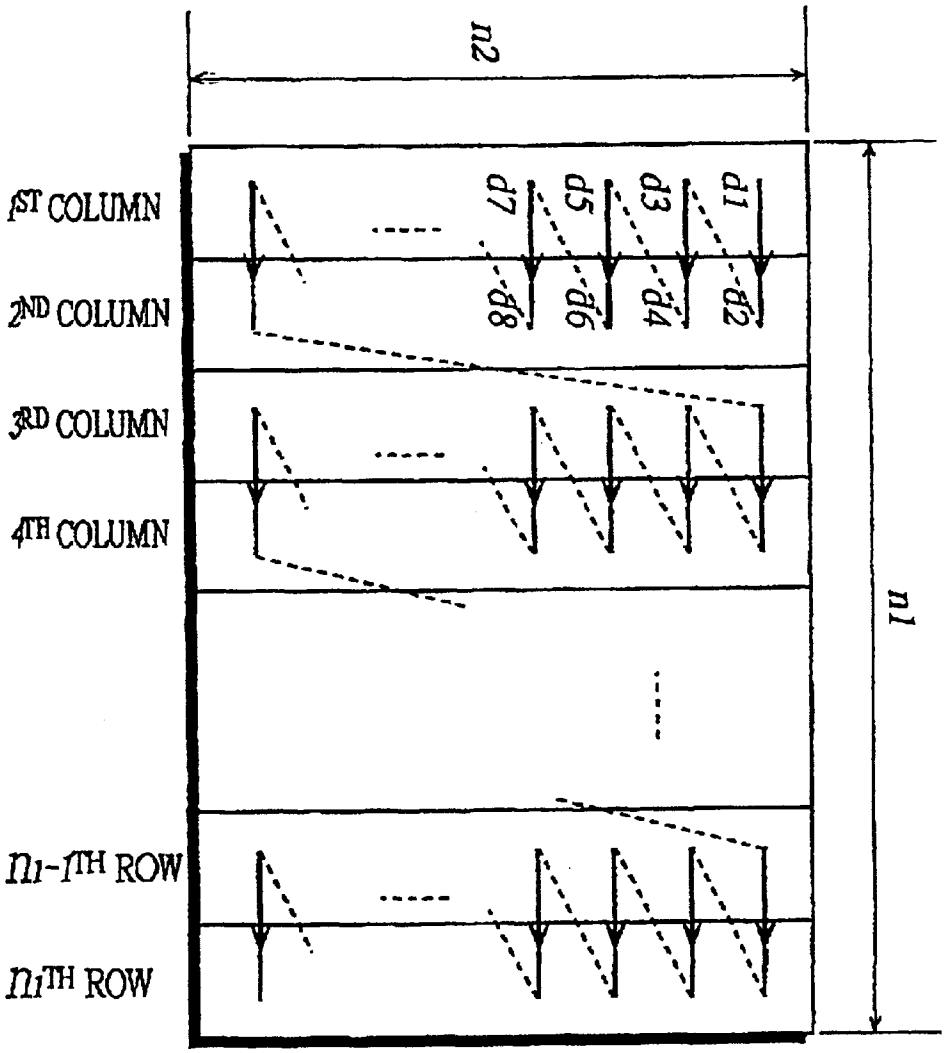
FIG. 21 shows the read order for the product codes in the buffer memory 1 when error correction is performed in the C2 direction for two adjacent columns.
Figure 22:
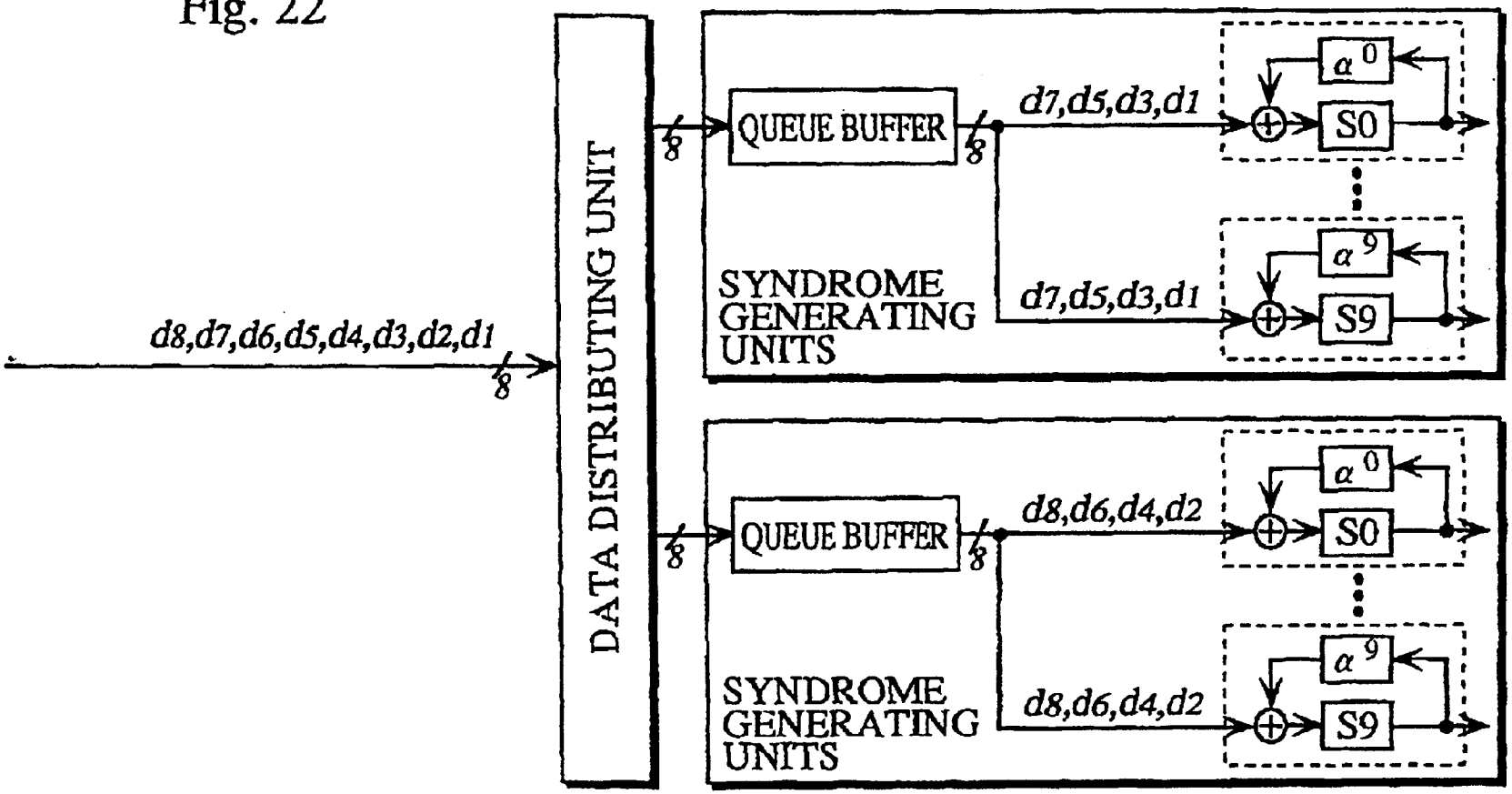
FIG. 22 shows the operation of the data distributing unit 51 when error correction is performed in the C2 direction for two adjacent columns.
Figure 23:
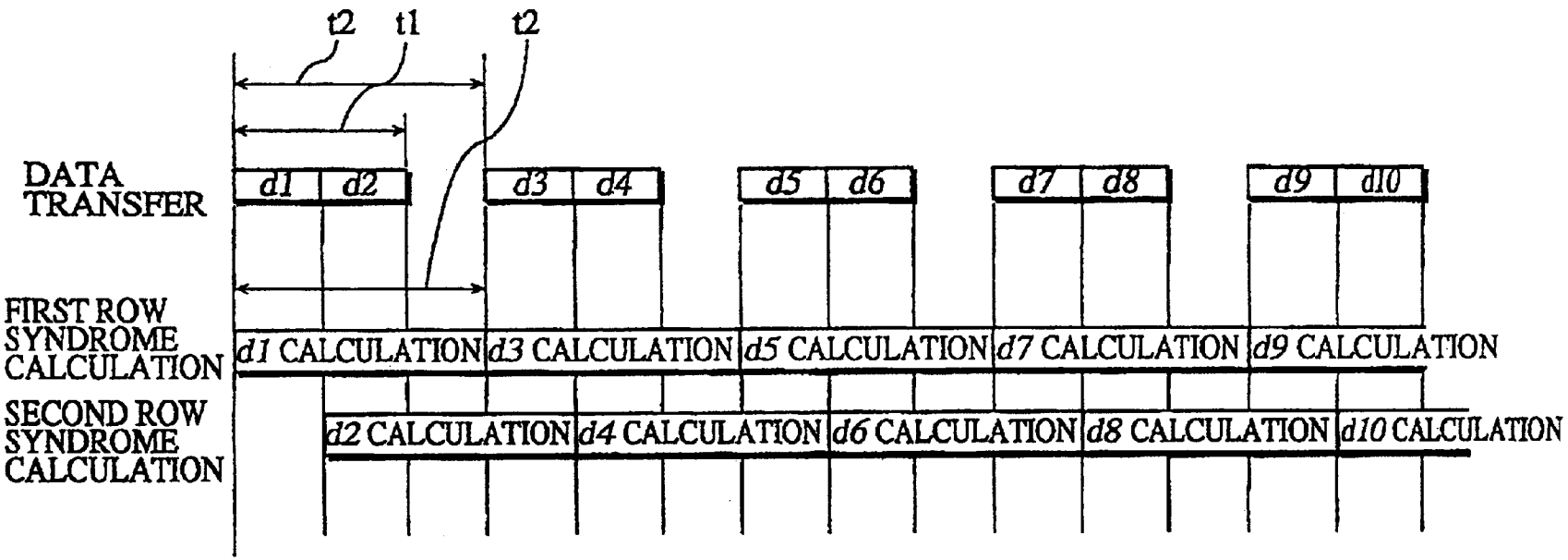
FIG. 23 shows the timing of the data transfer and the syndrome calculation when error correction is performed in the C2 direction for two adjacent columns.

In the same way, FIGS. 21, 22, and 23 show the operation for error correction in the C2 direction in an error correction apparatus that performs two error correction processes in parallel. These figures respectively show the read order for reading data from the buffer memory, the operation of the data distributing unit when inputting data into the respective error correcting units when data is inputted in the illustrated order, and the timing of data transfer and syndrome calculation.

This first embodiment describes a system where errors detected in data read from a storage medium such as an optical disc are corrected and corrected data is outputted to a host computer. However, the opposite data flow is also possible, so that a host computer may output data which is assigned parity data and written onto a storage medium such as an optical disc. This is because the present invention relates to technique where all of the code sequences in product code, which is temporarily stored in a buffer memory provided on a data path between a host computer and storage medium, are efficiently read and transferred to a third device (a separate processing device to the host computer and storage medium) so that the third device can perform code processing in the C1 direction and the C2 direction in high speed and with small-scale circuitry.

In more detail, the four syndrome generating units 52~55 and the error position-error value calculating unit 56 in the error correcting unit 5 may be replaced with a parity data generating circuit, and the data updating unit 57 may be replaced with a parity data writing circuit. By doing so, an error correction apparatus that performs error-related processing, composed of the addition of error correction codes when data is written onto the storage medium and the correction of data when reading data from the storage medium, at high speed can be realized.

In the first embodiment, the bus control unit 2 controls the DMA transfer of one four-byte unit of data from the buffer memory 1 to the error correcting unit 5 and allows other data transfers involving the buffer memory 1 in the interval before the next DMA transfer. However, data transfer for one sixteen-byte unit of data may be achieved through one DMA transfer. During error correction in the C1 direction, the sixteen bytes of data d1~d16 shown in FIG. 10 are transferred from the buffer memory 1 to the error correcting unit 5 in a single DMA transfer. During this data transfer, interrupts due to other data transfers that involve access to the buffer memory 1 are prohibited, so that the data transfer time for 16 bytes, which is to say the time taken to provide each of the four syndrome generating units 52~55 with four bytes of data, will become almost constant, thereby avoiding situations where bottlenecks in data transfer to the error correcting unit 5 cause great reductions in the processing speed of the syndrome calculations.

In this first embodiment, the error correction apparatus 100 is described as having an eight-bit data bus, although a thirty-two-bit data bus may be used instead. By doing so, four bytes of data can be read from the buffer memory 1 and transferred to the error correcting unit 5 by a single memory access. Here, the data distributing unit 51 may divide the thirty-two bit data into eight-bit data units which it then respectively distributes to the four syndrome generating units 52~55.

Finally, in this first embodiment, the error correcting unit 5 only performs the syndrome calculation in parallel, although the operations of the error position-error value calculating unit 56 and the data updating unit 57 that follow the syndrome calculation may also be performed in parallel. By doing so, when a large number of errors occur during the syndrome calculation, it can be ensured that the error processing can be completed within a given time.

Second Embodiment

The second embodiment relates to a high-speed optical disc reading apparatus. In this apparatus, error detection is separate to error correction, and the former being performed in parallel for data that is stored in a buffer memory. Error correction uses the results of the error detection, so that data that does not include errors is not transferred from the buffer memory to the error correcting unit.

Figure 24:
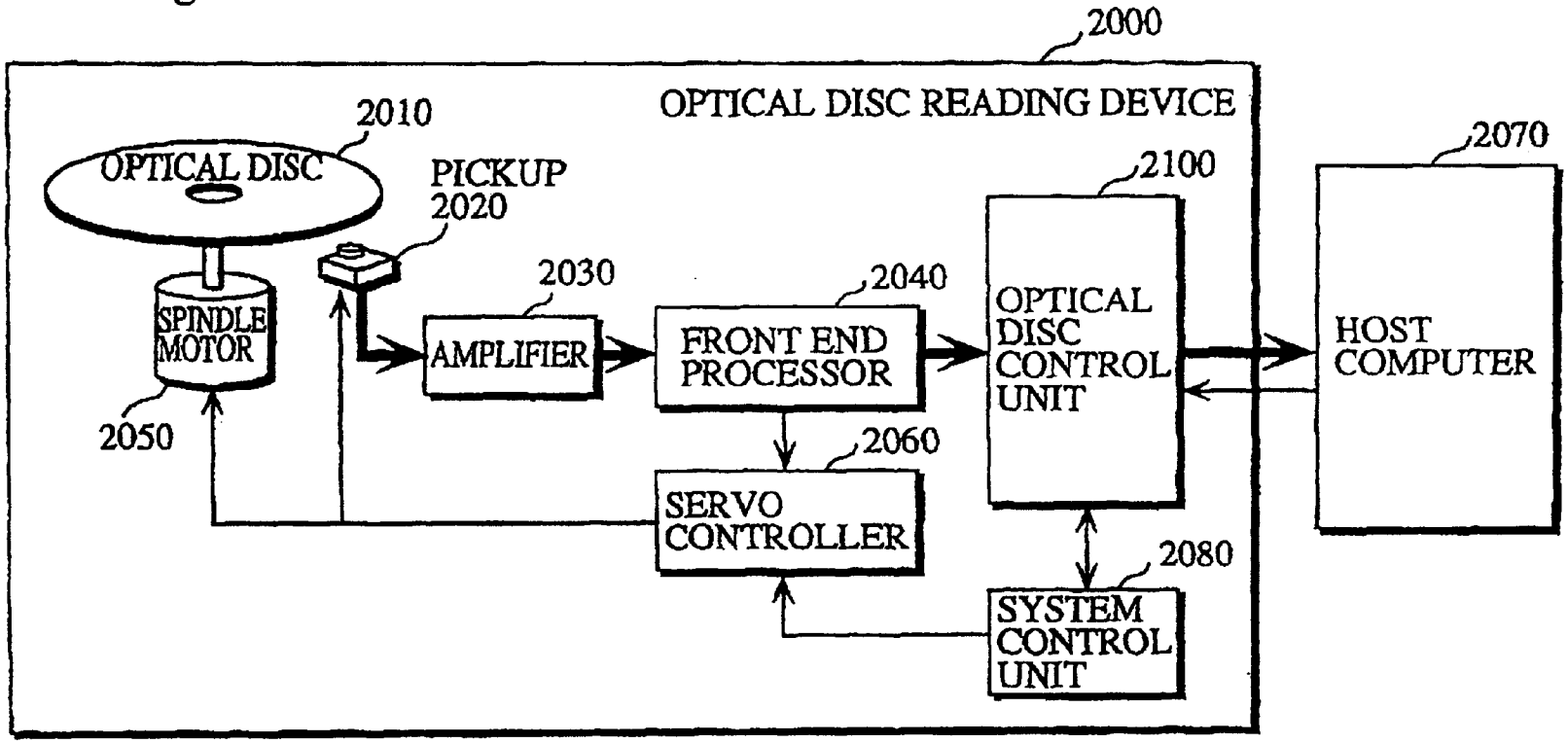
FIG. 24 is a block diagram showing the composition of the optical disc reading device 2000 in the second embodiment of the present invention.

FIG. 24 is a block diagram showing the composition of the optical disc reading device 2000 in the second embodiment of the present invention. This optical disc reading device 2000 reads data that is recorded on the optical disc 2010, performs error correction on the read data and transfers the corrected data to the host computer 2070. As shown in FIG. 24, the optical disc reading device 2000 is composed of a pickup 2020, an amplifier 2030, a front end processor 2040, a spindle motor 2050, a servo controller 2060, and a system control unit 2080.

The system control unit 2080 is a microprocessor that receives data requests including commands from the host computer 2070 via the optical disc control unit 2100. The system control unit 2080 interprets these commands and controls the servo controller 2060 and the optical disc control unit 2100 to realize the functions that correspond to the data requests.

The spindle motor 2050 rotates the optical disc 2010. The servo controller 2060 receives instructions from the system control unit 2080. Based on information it receives from the front end processor 2040, the servo controller 2060 controls the rotation of the spindle motor 2050 and the lens position of the pickup 2020.

The optical disc 2010 is a DVD-ROM. The pickup 2020 exposes the optical disc 2010 to laser light and reads the data on the optical disc 2010 from the reflected light which it converts to electrical signals. The amplifier 2030 amplifies the signals outputted by the pickup 2020 and outputs the result to the front end processor 2040.

The front end processor 2040 performs feedback control for the servo controller 2060, the spindle motor 2050, and the pickup 2020 based on the inputted signals, and outputs stabilized signals to the optical disc control unit 2100. This front end processor 2040 includes an equalizer, an AGC (Automatic Gain Control), and a PLL (Phase Locked Loop) and other such components. Note that the signals outputted by the front end processor 2040 to the optical disc control unit 2100 are modulated data.

The optical disc control unit 2100 informs the system control unit 2080 of the commands in the data requests sent from the host computer 2070. Based on control by the system control unit 2080, the optical disc control unit 2100 demodulates the signals inputted by the front end processor 2040 to obtain the required data, performs error correction on the data, and outputs the result to the host computer 2070.

Note that in FIG. 24, the thick arrows show the flow of data recorded on the optical disc 2010 until it reaches the host computer 2070. These arrows show that the data recorded on the optical disc 2010 passes the pickup 2020, the amplifier 2030, the front end processor 2040, and the optical disc control unit 2100 before reaching the host computer 2070. The data recorded on the optical disc 2010 is composed of the product code shown in FIG. 1 for the first embodiment. Reed-Solomon codes are again used as the error correction codes.

Figure 25:
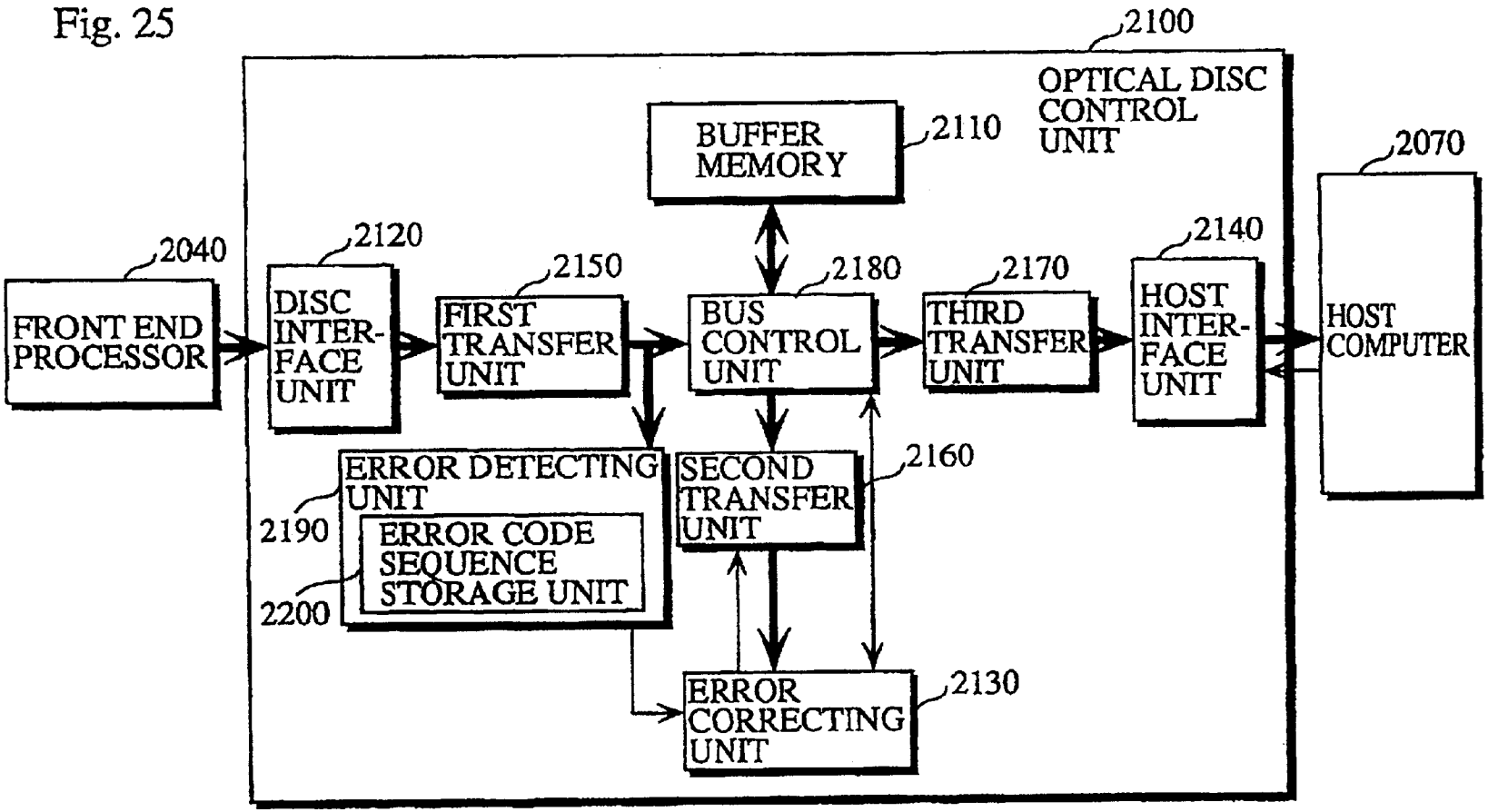
FIG. 25 is a block diagram showing the composition of the optical disc control unit 2100 in the optical disc reading device 2000.

FIG. 25 is a block diagram showing the composition of the optical disc control unit 2100. This optical disc control unit 2100 demodulates the signals it receives from the front end processor 2040, performs error correction, and sends the result to the host computer 2070. The optical disc control unit 2100 includes a buffer memory 2110, a disc interface unit 2120, an error correcting unit 2130, a host interface unit 2140, a first transfer unit 2150, a second transfer unit 2160, a third transfer unit 2170, a bus control unit 2180, an error detecting unit 2190, and an error code sequence storage unit 2200. Note that the thick arrows in FIG. 25 show the data paths when data is written into or read from the buffer memory 2110 using a DMA transfer.

The buffer memory 2110 is a semiconductor memory, such as a DRAM, that has storage areas that are specified using, a two-dimensional address (a row address and a column address). The buffer memory 2110 has sufficient storage capacity for temporarily storing a plurality of sets of the product code shown in FIG. 1.

The disc interface unit 2120 demodulates the signals inputted by the front end processor 2040 and outputs the resulting data to the first transfer unit 2150 so that the data is stored into the buffer memory 2110. Note that when the first transfer unit 2150 transfers data outputted from the disc interface unit 2120 to the buffer memory 2110, the data is inputted in parallel into the error detecting unit 2190.

The error detecting unit 2190 receives data from the disc interface unit 2120 via the first transfer unit 2150 and judges whether errors are present in any of the code sequences in the C1 direction. On detecting an error in a code sequence, the error detecting unit 2190 stores the number of the code sequence into the error code sequence storage unit 2200 that is composed of RAM. Note that the error detecting unit 2190 calculates a predetermined number of syndromes for each code sequence and judges whether a non-zero element exists in one of the syndromes. If so, the error detecting unit 2190 judges that an error is present in the code sequence being processed. In detail, the error detecting unit 2190 includes one of the syndrome generating units 52~55 in the error correcting unit 5 of the first embodiment (a circuit shown in FIG. 8), and a logical AND gate or similar for judging whether the generated syndromes are all zero.

The error correcting unit 2130 only performs error correction in the C1 direction and C2 direction for code sequences where an error has been detected, out of all of the product code that has been transferred from the error correcting unit 2130 and stored in the buffer memory 2110. In detail, the error correcting unit 2130 refers to the numbers stored in the error code sequence storage unit 2200 and only performs error correction for (1) code sequences in the C1 direction where an error has been detected and (2) for all code sequences in the C2 direction in a block in the buffer memory 2110 where an error has been detected.

The host interface unit 2140 is an interface circuit that reads data that has been processed by the error correcting unit 2130 from the buffer memory 2110 via the third transfer unit 2170 and outputs the data to the host computer 2070.

The first transfer unit 2150 is a DMA controller that receives permission from the bus control unit 2180 for transfer requests issued by the disc interface unit 2120. On doing so, the first transfer unit 2150 transfers data from the disc interface unit 2120 to the buffer memory 2110 using DMA and, in parallel, transfers the same data to the error detecting unit 2190.

The second transfer unit 2160 is a DMA controller that receives permission from the bus control unit 2180 for transfer requests issued by the error correcting unit 2130. On doing so, the second transfer unit 2160 transfers data from the error correcting unit 2130 to the buffer memory 2110 using DMA.

The third transfer unit 2170 is a DMA controller that receives permission from the bus control unit 2180 for transfer requests issued by the host interface unit 2140. On doing so, the third transfer unit 2170 transfers data from the buffer memory 2110 to the host interface unit 2140 using DMA.

The bus control unit 2180 controls the first transfer unit 2150, the second transfer unit 2160, and the third transfer unit 2170 according to a predetermined priority list so that DMA transfer is exclusively performed by one of these three transfer units. In addition, the bus control unit 2180 controls standard (non-DMA) access to the buffer memory 2110 by the error correcting unit 2130 when error data in the buffer memory 2110 is rewritten.

Figure 26:
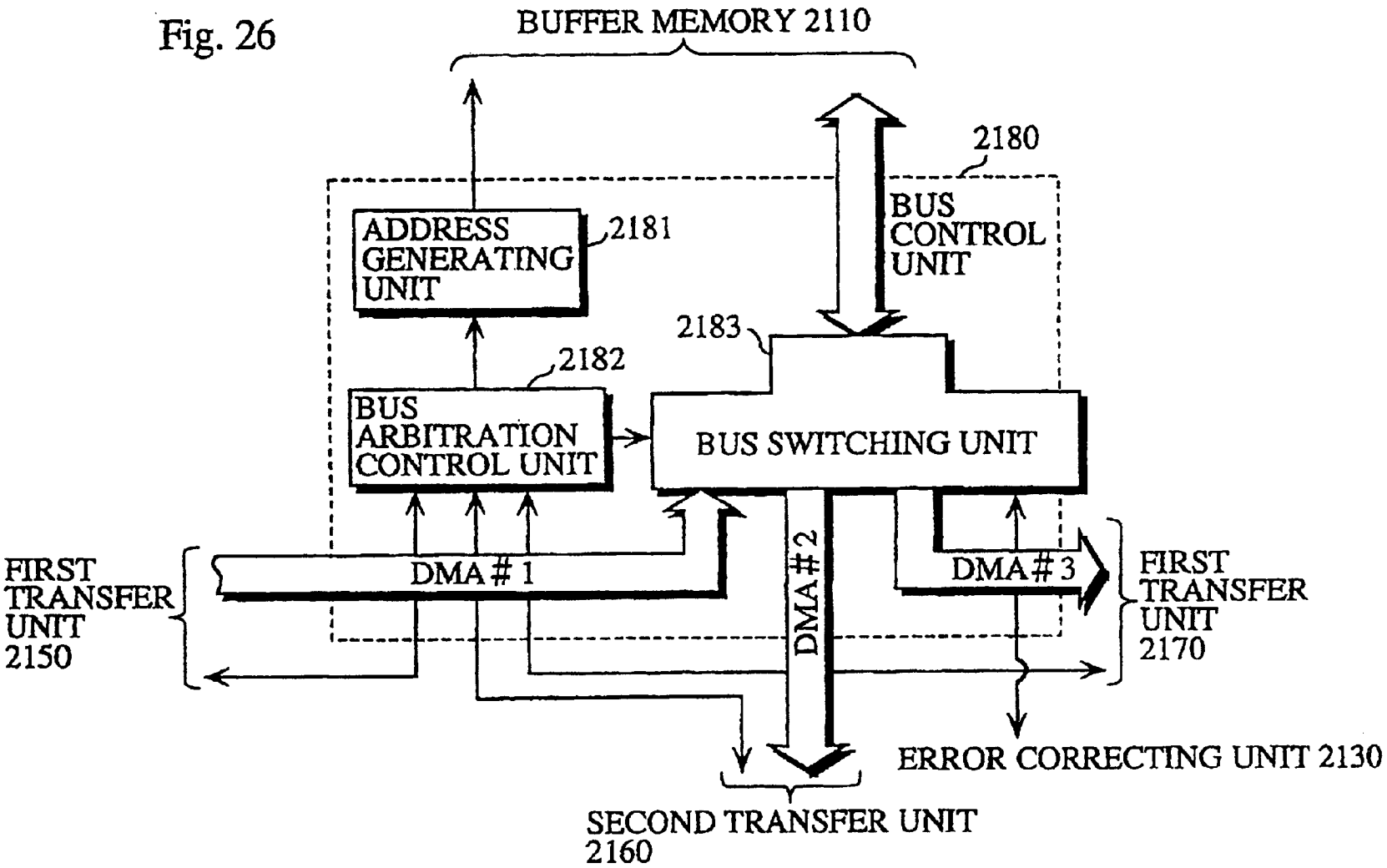
FIG. 26 is a block diagram showing the detailed composition of the bus control unit 2180 in the optical disc reading device 2000.

FIG. 26 is a block diagram showing the detailed composition of the bus control unit 2180. The bus control unit 2180 includes an address generating unit 2181, a bus arbitration control unit 2182, and a bus switching unit 2183. The address generating unit 2181 generates an address for accessing the buffer memory 2110. The bus switching unit 2183 switches a bus connection with the buffer memory 2110 between the first transfer unit 2150, the second transfer unit 2160, the third transfer unit 2170, and the error correcting unit 2130. The bus arbitration control unit 2182 controls the three transfer units 2150~2170 and the bus switching unit 2183 according to a predetermined priority list so that DMA transfer by one of the three transfer units 2150~2170 or access to the buffer memory 2110 by the error correcting unit 2130 is exclusively performed.

Note that the address generating unit 21 accesses the buffer memory 2110 at high speed during a DMA transfer using page mode. So long as a page hit is achieved, a constant row address (RAS) can be outputted to the buffer memory 1, with the address generating unit 21 only incrementing the column address (CAS) by the required number of data elements.

Figure 27:
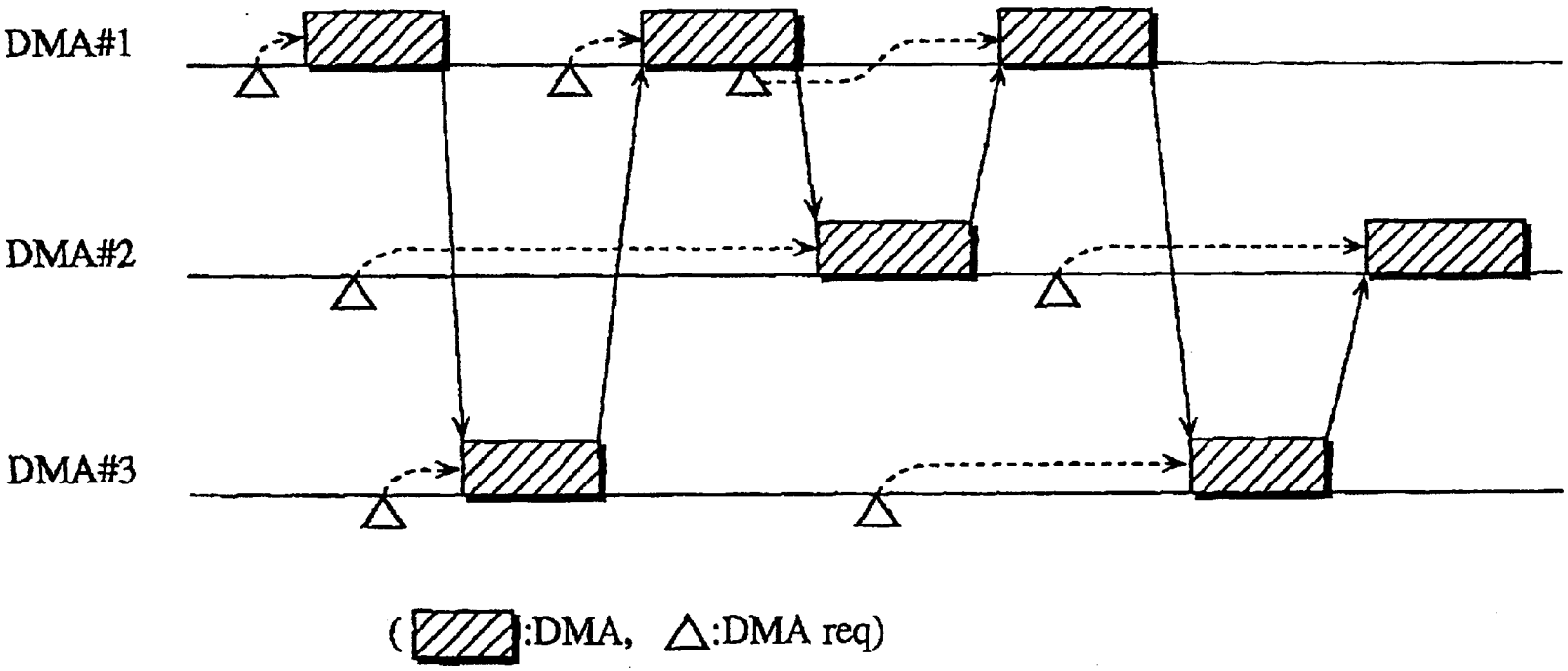
FIG. 27 shows an example of control for three exclusive DMA (Direct Memory Access) transfers by the bus arbitration control unit 2812 of the optical disc reading device 2000.

FIG. 27 is a timing chart showing an example of the scheduling performed by the bus arbitration control unit 2182 for the three types of exclusive DMA transfer. These DMA transfers are DMA#1 where the first transfer unit 2150 transfers from the disc interface unit 2120 to the buffer memory 2110, DMA#2 where the second transfer unit 2160 transfers from the buffer memory 2110 to the error correcting unit 2130, and DMA#3 where the third transfer unit 2170 transfers from the buffer memory 2110 to the host interface unit 2140. In FIG. 27, the horizontal axis represents time, the triangular marks show the time at which requests for DMA transfer are issued, and the shaded rectangles show executions of the DMA transfer.

The bus arbitration control unit 2182 gives the highest priority to DMA#1. This means that when DMA transfer is not being performed and a request for DMA#1 has been received, the bus arbitration control unit 2182 will have DMA#1 performed with the highest priority, regardless of the order in which requests for DMA transfer have been received. If no request for DMA#1 has been received, the bus arbitration control unit 2182 will have DMA#3 performed. If no request for DMA#1 or DMA#3 has been received, the bus arbitration control unit 2182 will have DMA#2 performed. However, when a request for DMA#2 and DMA#3 is received while consecutive requests for DMA#1 are being received, the bus arbitration control unit 2182 will stop having DMA#1 consecutively executed and will have DMA#2 or DMA#3 executed instead.

Note that the bus arbitration control unit 2182 handles the standard access to the buffer memory 2110 by the error correcting unit 2130 when rewriting error data in the buffer memory 2110 in the same way as DMA#3. This means that the bus arbitration control unit 2182 permits standard access to the buffer memory 2110 by the error correcting unit 2130 provided that a request for either DMA#1 or DMA#3 has not been received.

Figure 28:
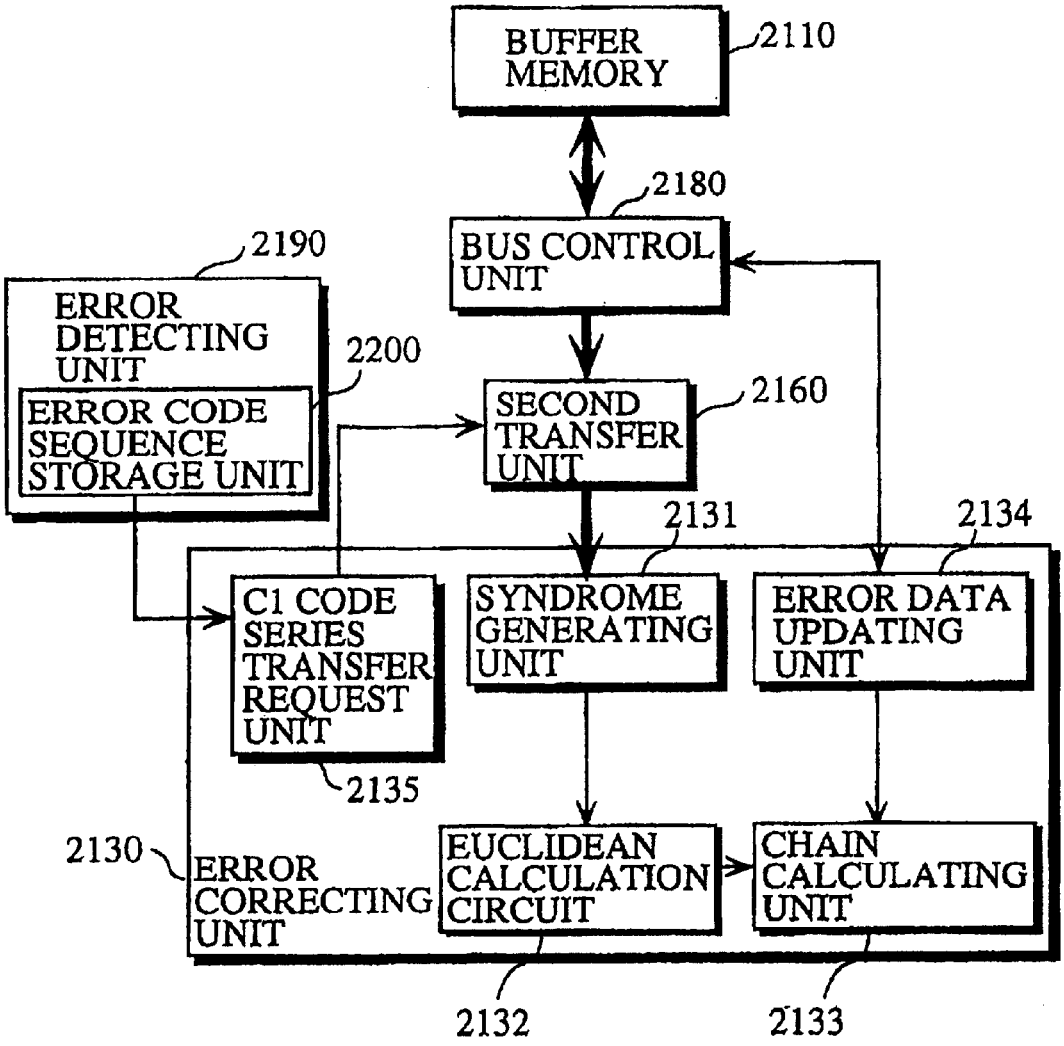
FIG. 28 is a circuit diagram showing the detailed composition of the error correcting unit 2130 of the optical disc reading device 2000.

FIG. 28 is a circuit diagram showing the detailed composition of the error correcting unit 2130 and the related components. The error correcting unit 2130 is a circuit for performing error correction for a row or column where an error has been detected, out of the code sequences in the C1 direction and C2 direction that compose the product code shown in FIG. 1. As shown in FIG. 28, the error correcting unit 2130 includes a C1 code series transfer request unit 2135, a syndrome generating unit 2131, a Euclidean calculation circuit 2132, chain calculating unit 2133, and an error data updating unit 2134.

The C1 code series transfer request unit 2135 reads the number of a code sequence in the C1 direction that includes an error from the error code sequence storage unit 2200 and instructs the second transfer unit 2160 to read the code sequence with this number from the buffer memory 2110.

The syndrome generating unit 2131 obtains the C1 code sequence, which includes an error and was requested by the C1 code series transfer request unit 2135, from the buffer memory 2110 via the bus control unit 2180 and the second transfer unit 2160. The syndrome generating unit 2131 then calculates syndromes for the code sequence and outputs the results to the Euclidean calculation circuit 2132.

Note that at any given instant, the syndrome generating unit 2131 only calculates syndromes for a code sequence in one of a row and a column, and so corresponds to one of the four syndrome generating units 52~55 in the error correcting unit 5 of the first embodiment (i.e., the circuit shown in FIG. 8). Here, if the size of the product code given by k1=k2=100 bytes and m1=m2=10 bytes, the syndrome generating unit 2131 will include a queue buffer for temporarily buffering the input data and ten product-sum calculation circuits for calculating ten syndromes. These product-sum calculation circuits will each include a register for storing one product-sum value, a Galois field multiplier for reading a product-sum value stored in the register and multiplying it by a unique coefficient, and a Galois field adder for adding the next inputted code to the multiplication result of the Galois field multiplier.

The Euclidean calculation circuit 2132 calculates coefficients for each expression, based on the syndromes it receives from the syndrome generating unit 2131, to specify an error position polynomial and an error value polynomial using a Euclidean method or the like. The Euclidean calculation circuit 2132 outputs the resulting coefficients to the chain calculating unit 2133.

The chain calculating unit 2133 finds the root of the error position polynomial, based on the coefficients it receives from the Euclidean calculation circuit 2132, using a chain search-or other method. The chain calculating unit 2133 then outputs the results of its calculation and the error value polynomial generated by the Euclidean calculation circuit 2132 to the error data updating unit 2134.

The error data updating unit 2134 uses the error position and the error value polynomial received from the chain calculating unit 2133 to find the error value at the indicated error position. The error data updating unit 2134 reads the data or parity data positioned at the indicated error position in the buffer memory 2110 via the bus control unit 2180, and calculates an exclusive OR on the retrieved values, before writing the resulting value back into the buffer memory 2110.

Note that the transfer of data from the buffer memory 2110 to the syndrome generating unit 2131 by the second transfer unit 2160 is performed using DMA, while the transfer of data between the buffer memory 2110 and the error data updating unit 2134 by the bus control unit 2180 is performed according to standard (i.e., non-DMA) access. This is because the rewriting performed during error correction is not restricted to data stored in consecutive addresses in the buffer memory 2110. Also note that the four circuits 2131~2134 that compose the error correcting unit 2130 operate separately and in parallel, which means that the error correcting unit 2130 performs sequential processing with a pipeline architecture.

FIG. 29 is a timing chart showing the internal processing of the optical disc control unit 2100 when consecutively processing data in a plurality of blocks. In FIG. 29, the first to fifth block are blocks of data stored in the buffer memory 2110. The legend "buffering" represents the transfer of data from the buffer memory 2110 to the disc interface unit 2120 by the first transfer unit 2150. The legend "error detection" represents the transfer of data from the disc interface unit 2120 to the error detecting unit 2190 by the first transfer unit 2150 and the detection of errors by the error detecting unit 2190. The legend "error correction" represents the transfer of data from the buffer memory 2110 to the error correcting unit 2130 by the second transfer unit 2160 and the error correction process of the error correcting unit 2130. The legend "transfer to host" represents the transfer of data from the buffer memory 2110 to the host interface unit 2140 by the third transfer unit 2170.

As shown in FIG. 29, buffering and error detection are performed in parallel for each block. When these processes have ended for a block, error correction is performed on the block. When the error correction is complete, the block is transferred to the host. These processes are performed sequentially and in parallel to form a pipeline architecture. For the example of cycle T5, the fifth block is transferred from the disc interface unit 2120 to the buffer memory 2110 at the same time as the error detecting unit 2190 performs detects errors in the fifth block. At the same time, the fourth block is transferred from the buffer memory 2110 to the error correcting unit 2130 where error correction is performed, and the third block is transferred from the buffer memory 2110 to the host interface unit 2140.

Note that the reason the three types of data transfer that access the buffer memory 2110 appear to be executed in parallel in FIG. 29 is that the drawing shows blocks as a relatively large amount of data. By focusing on the separate data elements that compose each block, it can be seen that only one of the data transfers is being performed at any given instant. This kind of exclusive data transfer and pipeline control is achieved by the bus arbitration control unit 2182 of the bus control unit 2180 switching the permission to transfer data at very short intervals between the three transfer units 2150, 2160, and 2170 according to the predetermined priority order. This is shown by the timing chart in FIG. 27.

The reason error correction is not performed for the third block in FIG. 29 is that no errors were detected for this block during the error detection process. On receiving notification that the error detecting unit 2190 did not find any errors in the third block, the error correcting unit 2130 does not perform any error correction on this block. The error correcting unit 2130 informs the bus control unit 2180 that no error correction will be performed, so that the second transfer unit 2160 does not transfer any of the code sequences in the third block from the buffer memory 2110 to the error correcting unit 2130.

In this way, "buffering" and "error detection" are performed for this same block in parallel and, when no errors are detected in a block, the error correcting unit 2130 is informed that no errors exist in the block. As a result, the error correcting unit 2130 can skip the reading of data with no errors, thereby avoiding unnecessary data transfers that involve the buffer memory 2110. Conventionally, the following three transfers are performed for all data read from an optical disc:

(1) the storage of data read from an optical disc into a buffer;

(2) the transfer of data from the buffer for error detection and error correction; and (3) the transfer of data from the buffer to a host computer.

With this second embodiment, however, data that does not contain any errors only needs to be transferred into the buffer memory (transfer (1)) and then transferred onward to the host computer (transfer (3)). Accordingly, such data only requires two transfers.

Figure 30:
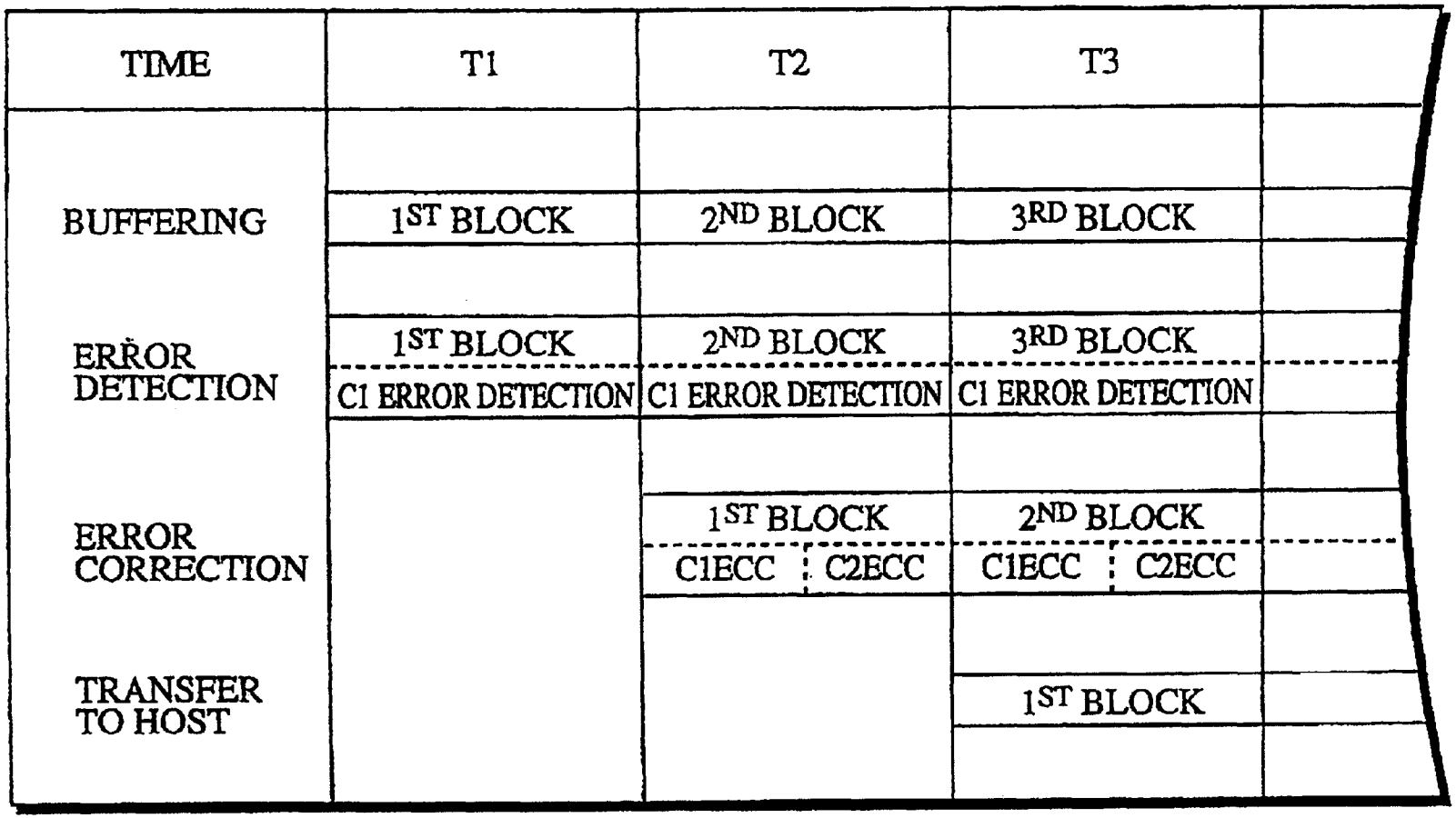
FIG. 30 shows the timing chart of FIG. 29 in more detail.

FIG. 30 shows the timing chart of FIG. 29 in more detail. In FIG. 30, the error detection and error correction are shown as separate processes in the C1 direction and the C2 direction. In this example, error detection is only performed in the C1 direction, while error correction in the C1 direction and error correction in the C2 direction are both respectively performed once for each block that contains an error.

During cycle T1, the error detecting unit 2190 detects whether there are any errors in the code sequences in the C1 direction for the first block that the first transfer unit 2150 sends from the disc interface unit 2120. On finding an error, the error detecting unit 2190 records the number of the code sequence that includes an error in the error code sequence storage unit 2200.

Here, the reason the error detecting unit 2190 performs error detection in the C1 direction is that the data transfer from the disc interface unit 2120 to the buffer memory 2110 is performed in an order where the product code is scanned in the row direction repetitively from the first row to the $n_2^{th}$ row. This means that error detection in the C1 direction is simple. The reason error detection is not performed for the C2 direction is that if the preceding error correction in the C1 direction finds there is one or more code sequences in the C1 direction for which error correction is impossible, error detection is performed for all code sequence in the C1 direction, error correction for the code sequences in the C2 direction will also be necessary. Accordingly, there is no need to detect errors in the C2 direction.

Next, in cycle T2 the error correcting unit 2130 reads the code sequences in the C1 direction from the buffer memory 2110 and performs error correction. Here, the error correcting unit 2130 refers to the error code sequence storage unit 2200, reads only code sequences in the C1 direction that contain errors from the buffer memory 2110, and performs error correction on these code sequences. When this processing has been completed for every code sequence in the C1 direction that was found to contain an error, if there is at least one code sequence in the C1 direction for which error correction was not possible, the error correcting unit 2130 reads all the code sequences in the C2 direction that compose the block from the buffer memory 2110 and performs error correction on these code sequences. Note that error correction is performed for every code sequence in the C2 direction that composes a block since it is unclear from the error detection in the C1 direction by the error detecting unit 2190 which code sequences in the C2 direction contain errors.

FIG. 31 is a timing chart for the processing of row units by the error correcting unit 2130 when performing error correction in the C1 direction. This drawing shows the parallel processing of the syndrome generating unit 2131, the Euclidean calculation circuit 2132, the chain calculating unit 2133, and the error data updating unit 2134 when the error detecting unit 2190 has detected errors in the code sequences on the first, fourth, sixth, and eleventh rows.

Since the error detecting unit 2190 has not detected any errors in the code sequences on the second, third, fifth, and eighth~tenth rows, these rows are not read from the buffer memory 2110 by the syndrome generating unit 2131. AS a result, the data on these rows is not subjected to syndrome calculation, Euclidean calculation, chain calculation, and error data updating.

Figure 2:
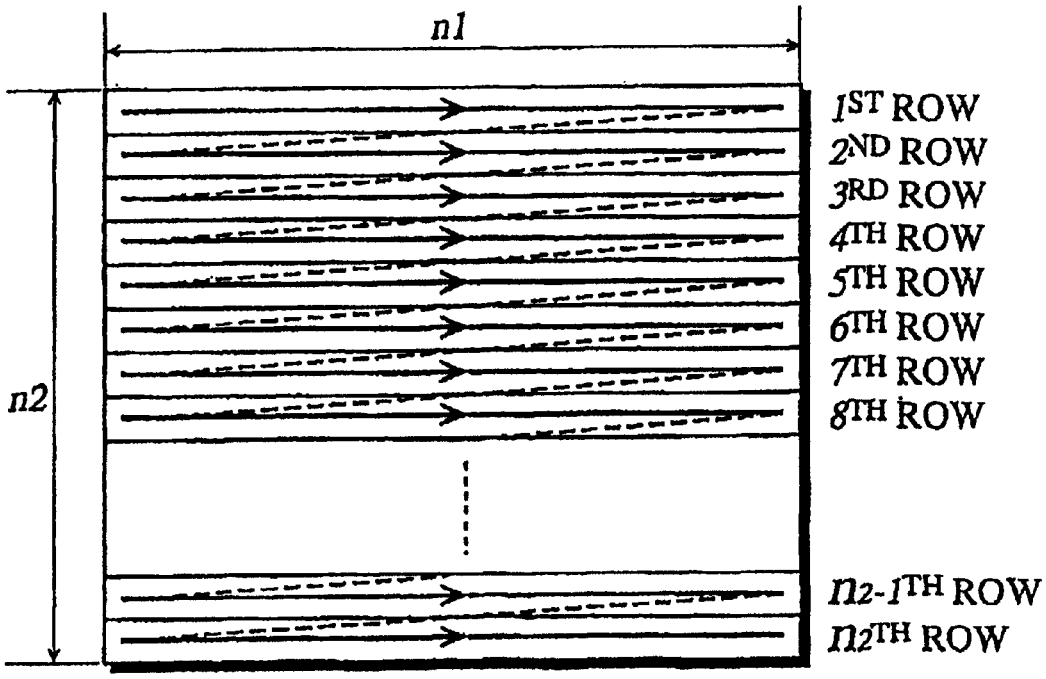
FIG. 2 shows the processing order for sequentially performing error correction in the C1 direction one row at a time.
Figure 3:
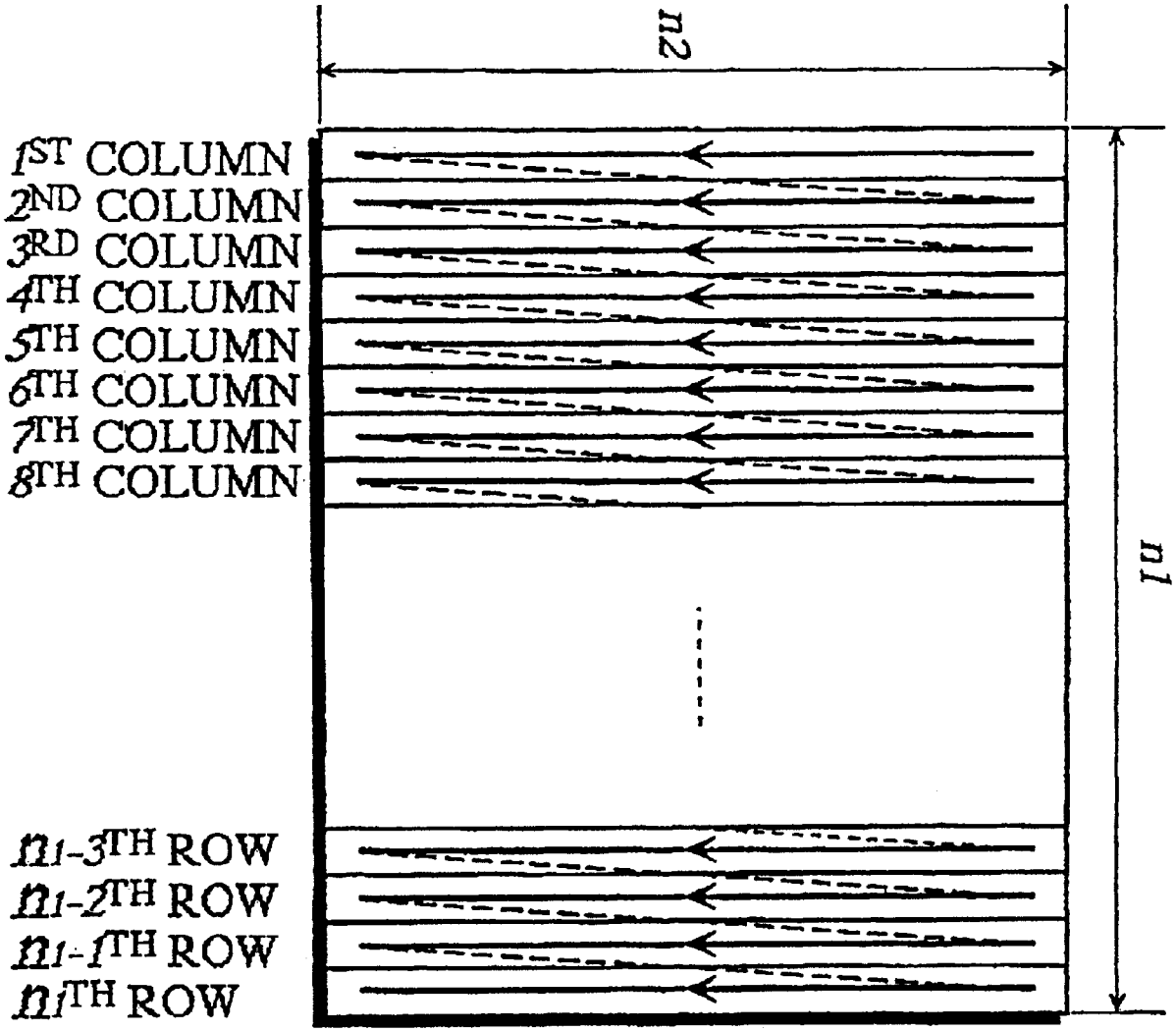
FIG. 3 shows the processing order for sequentially performing error correction in the C2 direction one column at a time.
Figure 4:
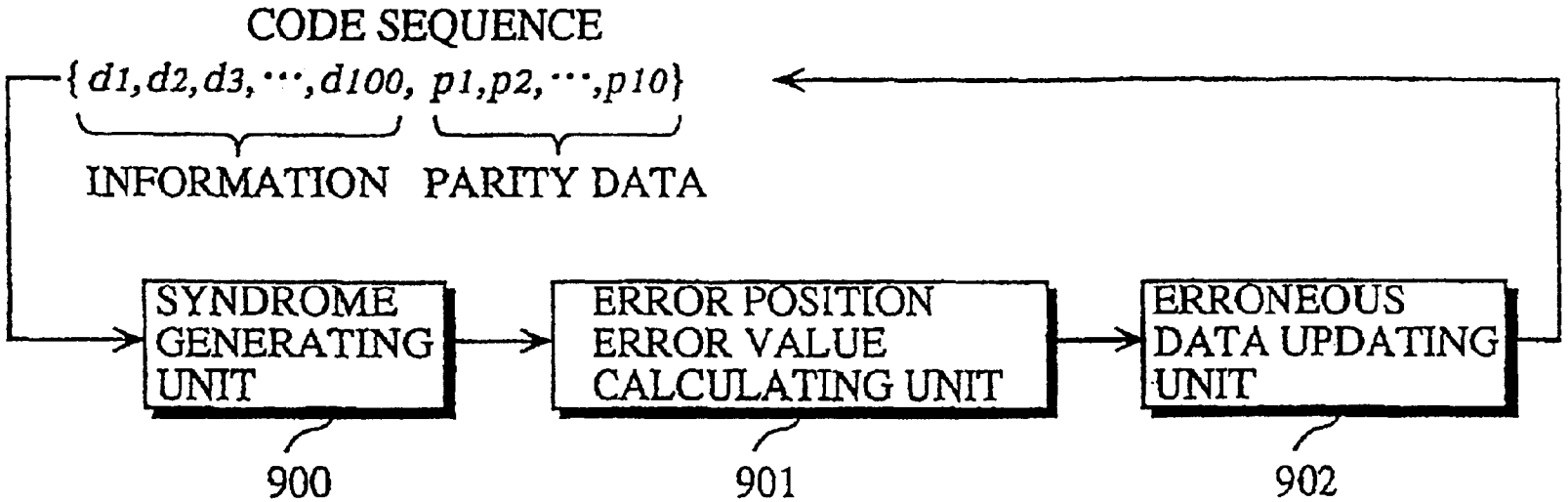
Fig. 4 PRIOR ART
FIG. 4 shows the processing order for error correction by a conventional error correction apparatus.
Figure 32:
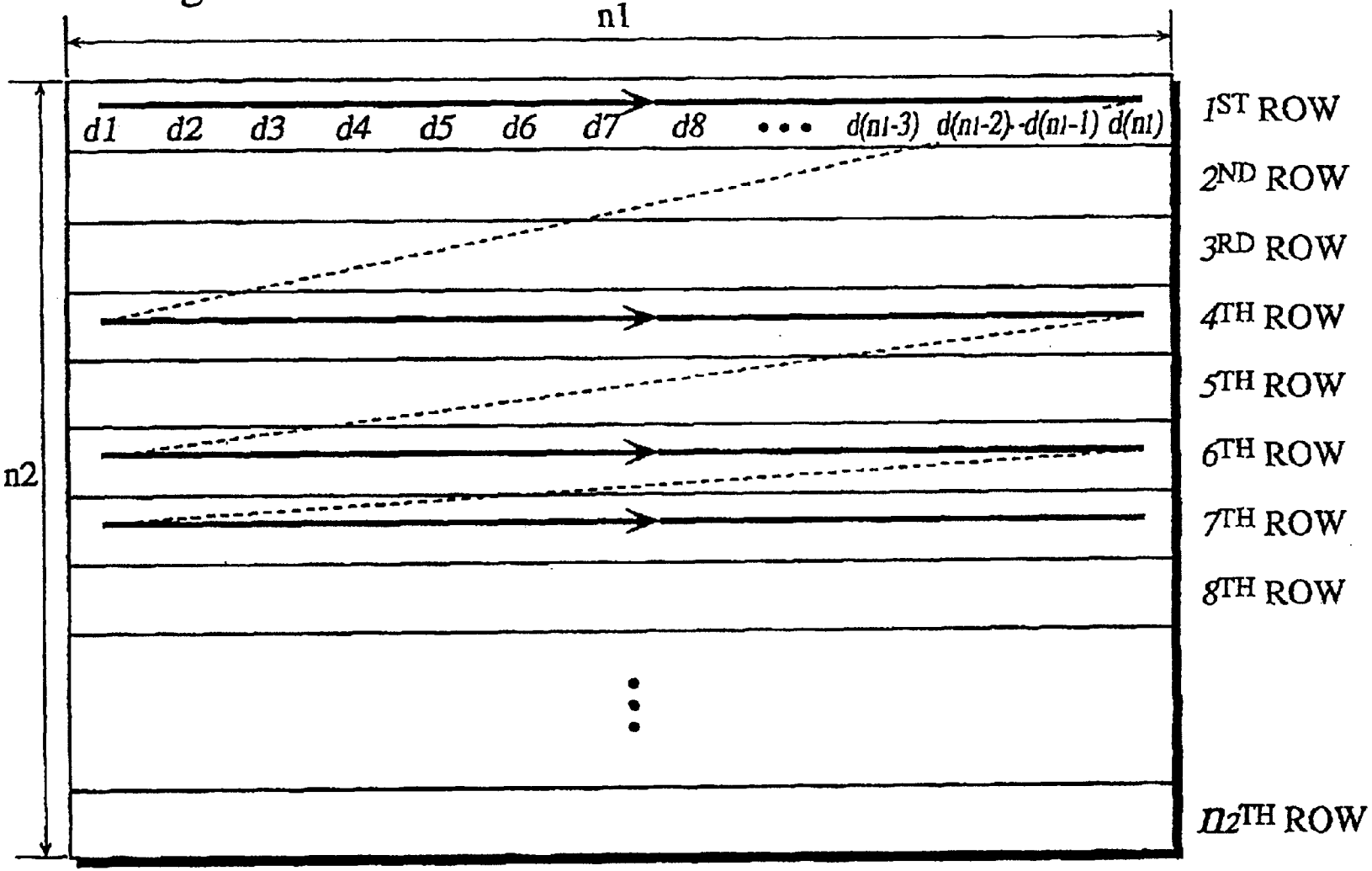
FIG. 32 shows the access order for the product code stored in the buffer memory 2110 when correcting the code sequences shown in FIG. 31.

FIG. 32 shows the access order for the product code stored in the buffer memory 2110 when correcting the code sequences shown in FIG. 31. Here, error correction is first performed for the first row, before skipping the second and third rows and moving on the fourth row. The fifth row is then skipped and error correction is then performed for the sixth row and the seventh row. While every row is scanned in FIG. 2, only rows where an error has been detected are scanned in FIG. 32.

As described above in this second embodiment, the error correcting unit 2130 refers to the error code sequence storage unit 2200 and only reads code sequences that contain errors, which is to say code sequences for which error correction is required from the buffer memory 2110, before performing error correction on the read code sequences. In this way, unnecessary transfers of data from the buffer memory 2110 are avoided.

With the above construction, code sequences in the C1 direction for which no errors are detected will not require the conventional three data transfers of (1) storing all data read from the optical disc into the buffer memory, (2) reading all data from the buffer memory for error detection.error correction, and (3) reading data from the buffer memory for transmission to the host computer. Instead such data only needs the two data transfers of (1) storage into the buffer memory and (2) output to the host device. This reduces the number of accesses made to the buffer memory 2110, which increases the overall processing speed of the optical disc control unit 2100, as well as reducing power consumption. This enables the optical disc reading device 2000 to operate at higher speed with lower power consumption.

Note that while the second embodiment states that the error correcting unit 2130 repeatedly performs error correction for one code sequence of a row or a column at a time, as shown in FIG. 32, the error correcting unit 2130 may instead perform error correction in parallel on a plurality of code sequences, such as on four rows or columns as in the first embodiment.

Figure 33:
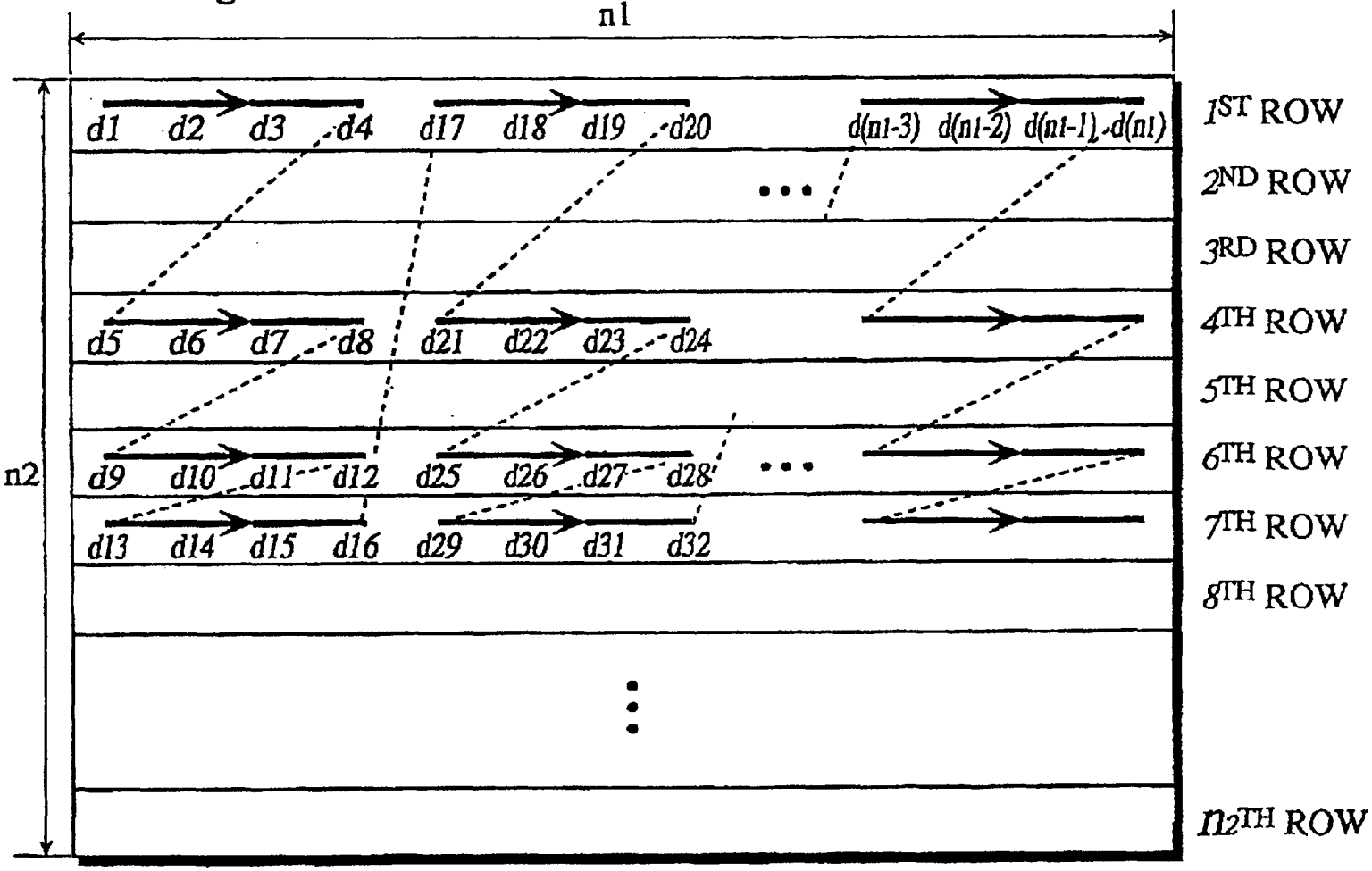
FIG. 33 shows the read order for data from the disc interface unit 2120 when performing the error correction in the C1 direction shown in FIG. 31 for four rows of code in parallel.
Figure 34:
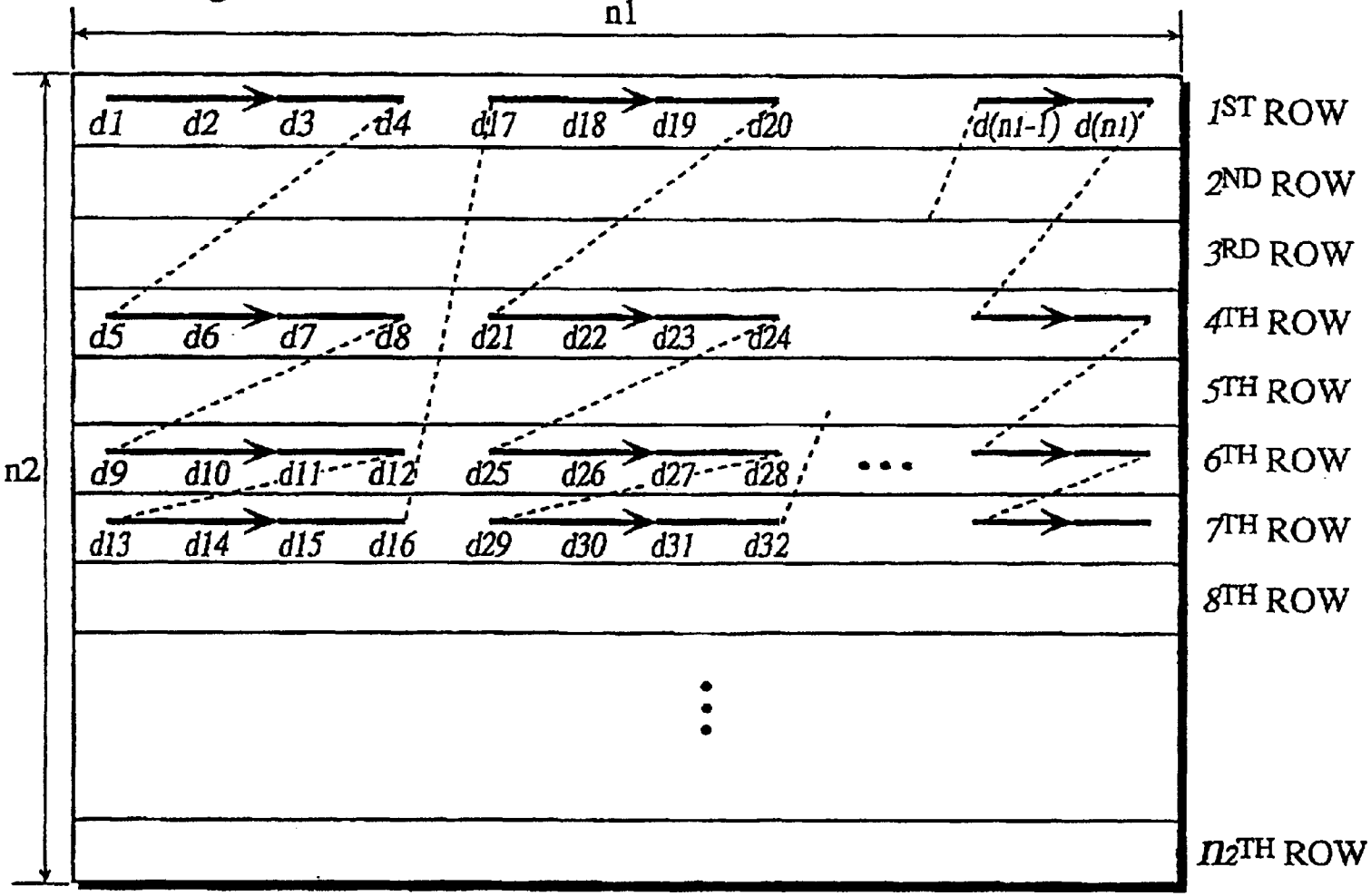
FIG. 34 shows the read order for the end parts of code sequences in the C1 direction shown in FIG. 31.

FIG. 33 shows the read order for data from the disc interface unit 2120 when performing the error correction in the C1 direction shown in FIG. 31 for four rows of code in parallel. This read order has fundamentally the same flow as the read order shown in FIG. 10 in the first embodiment, although in FIG. 33 differs in that only rows where an error has been detected (the first, fourth, sixth, seventh rows etc.) compose the four rows that are read in parallel. When the length of the code sequence is not divisible by four, the read order shown in FIG. 34 may be used. Here, the transfer of four bytes is repeated for the first four rows where an error has been detected (the first, fourth, sixth, seventh rows), and two bytes is transferred for the end part of each of these rows.

In this way, the error correcting unit 2130 of the second embodiment can be modified to execute error correction in parallel for four code sequences by providing four syndrome generating units and a data distributing unit that distributes the data sent from the buffer memory 2110 among the four syndrome generating units. The resulting system has a high processing speed by performing error correction in parallel as in the first embodiment, and by performing error detection before error correction as in the second embodiment.

In the second embodiment, the C1 code series transfer request unit 2135 is provided inside the error correcting unit 2130, although it may instead be provided inside the error detecting unit 2190, or as a circuit that is external to both the error correcting unit 2130 and the error detecting unit 2190.

In this embodiment, the error detecting unit 2190 only notifies the other elements of the numbers of code sequences where an error has been detected, although the error detecting unit 2190 may also inform other elements of the syndromes obtained during the detection. The error correcting unit 2130 may then receive the syndromes for a code sequence where an error has been detected from the error detecting unit 2190 before performing the Euclidean and chain calculations. By doing so, the same syndrome calculations do not need to be executed by both the error detecting unit 2190 and the error correcting unit 2130.

In the same way, instead of merely detecting errors, the error detecting unit 2190 may also perform the Euclidean and chain calculations. When this is the case, the error correcting unit 2130 can receive the error position and error value for a code sequence found to contain an error from the error detecting unit 2190, and can proceed to amending the error data in the buffer memory 2110. In this way, where possible under the exigencies of processing time, the error detecting unit 2190 may perform the syndrome calculations, Euclidean calculations, and chain calculations needed for error correction in the C1 direction. This means that these calculations are performed while data is being transferred from the disc interface unit 2120 to the buffer memory 2110, which reduces the processing time taken for error correction by the error correcting unit 2130.

Third Embodiment

The third embodiment relates to a high-speed optical disc reading apparatus with a reduced number of accesses to a buffer memory. In this apparatus, error correction in the C1 direction is performed in parallel with the storage of data into the buffer memory. Only blocks where an error has been detected during the error correction in the C1 direction are read from the buffer memory and subjected to error correction in the C2 direction.

Figure 35:
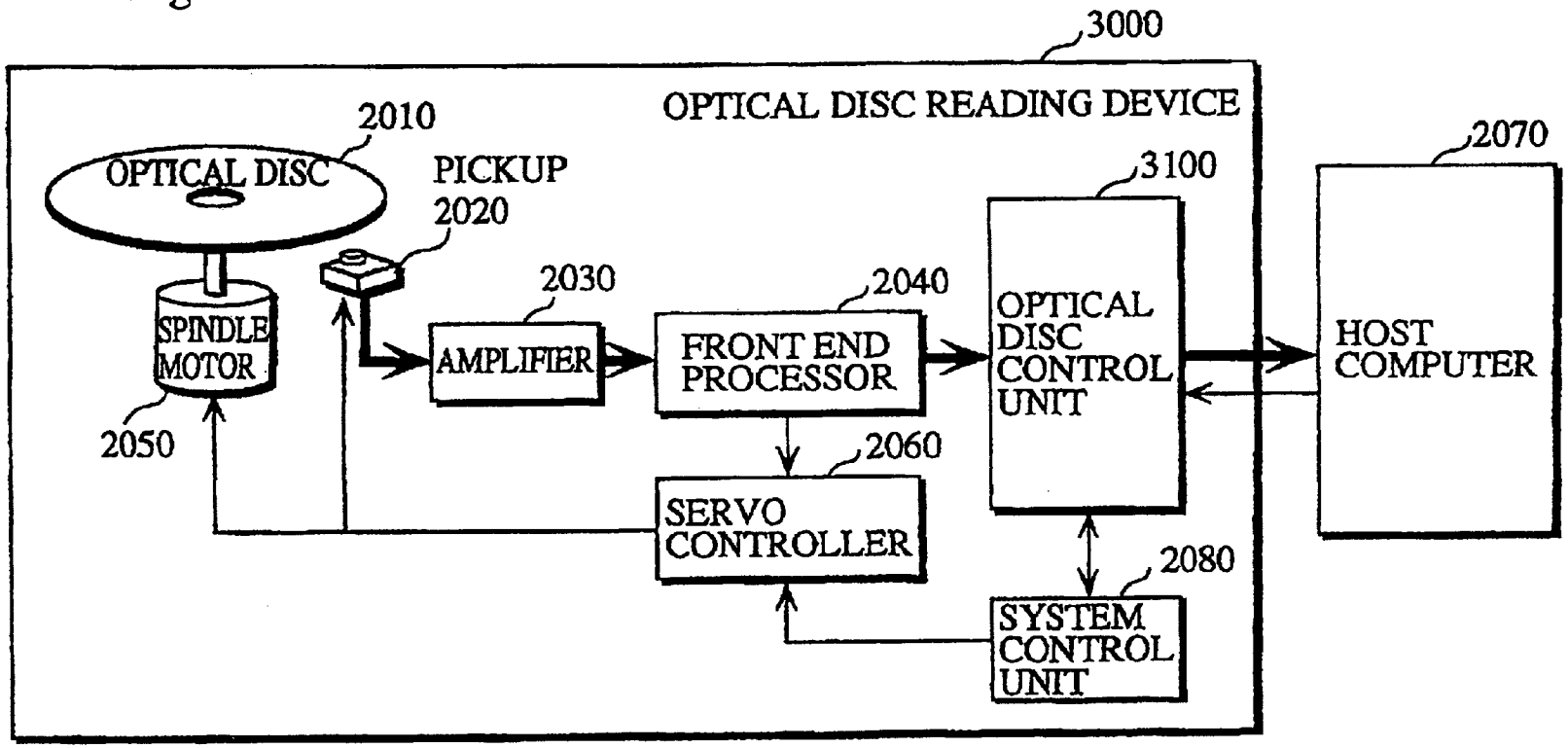
FIG. 35 is a block diagram showing the composition of the optical disc reading device 3000 in the third embodiment of the present invention.

FIG. 35 is a block diagram showing the composition of the optical disc reading device 3000 in the third embodiment of the present invention. This optical disc reading device 3000 reads data that is stored on the optical disc 2010, corrects errors in the read data and outputs the corrected data to the host computer 2070. As shown in FIG. 35, the optical disc reading device 3000 includes a pickup 2020, an amplifier 2030, a front end processor 2040, a spindle motor 2050, a servo controller 2060, and a system control unit 2080.

The only difference between the optical disc reading device 3000 of this third embodiment and the optical disc reading device 2000 in the second embodiment lies in the optical disc control unit 3100. Other components are the same as in the optical disc reading device 2000 and so have the same reference numbers. No further explanation of such components will be given.

Figure 36:
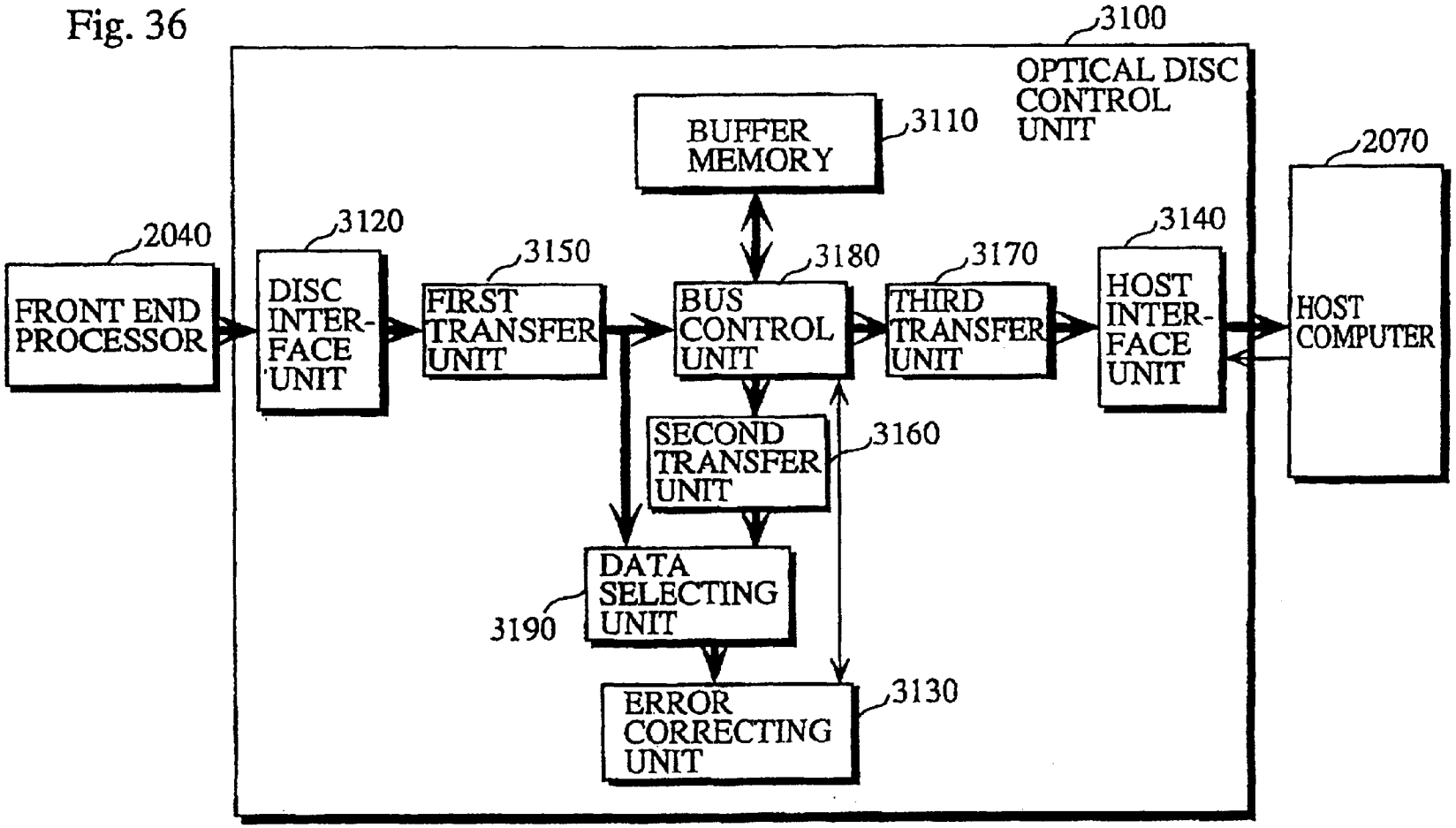
FIG. 36 is a block diagram showing the detailed composition of the optical disc control unit 3100 in the optical disc reading device 3000.

FIG. 36 is a block diagram showing the detailed composition of the optical disc control unit 3100. This optical disc control unit 3100 demodulates signals it receives from the front end processor 2040, performs error correction on the resulting data, and sends corrected data to the host computer 2070. As shown in FIG. 36, the optical disc control unit 3100 includes a buffer memory 3110, a disc interface unit 3120, an error correcting unit 3130, a host interface unit 3140, a first transfer unit 3150, a second transfer unit 3160, a third transfer unit 3170, a bus control unit 3180, and a data selecting unit 3190. Note that the thick arrows in FIG. 36 show the data paths when data is written into or read from the buffer memory 3110 using a DMA transfer.

The buffer memory 3110 is a semiconductor memory, such as a DRAM, that has storage areas that are specified using a two-dimensional address (a row address and a column address). The buffer memory 3110 has sufficient storage capacity for temporarily storing the plurality of sets of product code shown in FIG. 1.

The disc interface unit 3120 demodulates the signals inputted by the front end processor 3040 and outputs the resulting data to the first transfer unit 3150 so that the data is stored into the buffer memory 3110. Note that when the first transfer unit 3150 transfers data outputted from the disc interface unit 3120 to the buffer memory 3110, the data is inputted in parallel into the data selecting unit 3190.

The data selecting unit 3190 is a selector for selecting the transfer source for a code sequence on which the error correcting unit 3130 is going to perform error correction. When the first transfer unit 3150 is transferring data from the disc interface unit 3120 to the buffer memory 3110, the same data is inputted in parallel into the data selecting unit 3190, so that the data selecting unit 3190 selects this data and passes it on to the error correcting unit 3130. On the other hand, when the second transfer unit 3160 transfers a code sequence for the C2 direction from the buffer memory 3110, the data selecting unit 3190 selects this data and passes it on to the error correcting unit 3130. Note that the data selecting unit 3190 selects the source for data transfer according to instructions from the first transfer unit 3150 and the second transfer unit 3160.

The error correcting unit 3130 performs error correction, distinguishing between the two types of code sequences (C1 direction and C2 direction) it receives from the data selecting unit 3190. When the data selecting unit 3190 selects and transfers data (code sequences in the C1 direction) received from the first transfer unit 3150, the error correcting unit 3130 performs error correction in the C1 direction. Conversely, when the data selecting unit 3190 selects and transfers data (code sequences for the C2 direction) received from the second transfer unit 3160, the error correcting unit 3130 performs error correction for the C2 direction.

The host interface unit 3140 is an interface circuit that reads data that does not require further processing by the error correcting unit 3130 from the buffer memory 3110 via the third transfer unit 3170 and outputs the data to the host computer.

The first transfer unit 3150 transfer data from the disc interface unit 3120 to the buffer memory 3110 using DMA and simultaneously transfers the same data in parallel to the data selecting unit 3190. The second transfer unit 3160 transfers data from the buffer memory 3110 to the error correcting unit 3130 using DMA. The third transfer unit 3170 data from the buffer memory 3110 to the host interface unit 2140 using DMA.

The bus control unit 3180 controls the first transfer unit 3150, the second transfer unit 3160, and the third transfer unit 3170 according to a predetermined priority list so that DMA transfer is exclusively performed by one of these three transfer units. In addition, the bus control unit 3180 controls standard (non-DMA) access to the buffer memory 3110 by the error correcting unit 3130 when error data in the buffer memory 3110 is rewritten. Note that the detailed composition of the bus control unit 3180 and its method for controlling exclusive access to the buffer memory 3110 are the same as those shown in FIGS. 26 and 27 for the bus control unit 2180 of the second embodiment.

Figure 37:
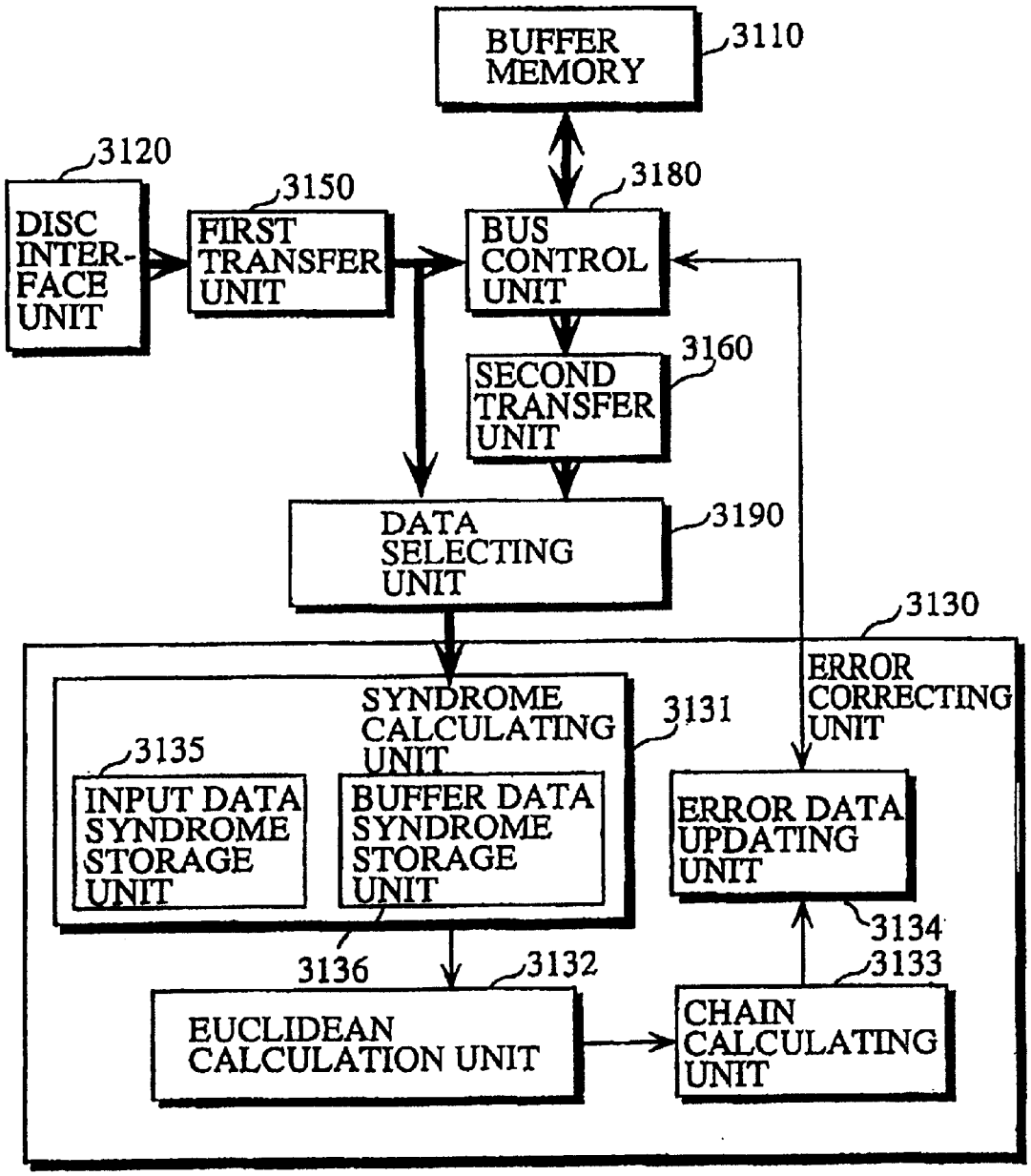
FIG. 37 is a block diagram showing the detailed composition of the error correcting unit 3130 in the optical disc reading device 3000.

FIG. 37 is a block diagram showing the detailed composition of the error correcting unit 3130 and the related components. The error correcting unit 3130 is a circuit for performing error correction, switching between a code sequence for one row in the product code and a code sequence for one column according to time division. As shown in FIG. 37, the error correcting unit 3130 includes a syndrome generating unit 3131, a Euclidean calculation circuit 3132, chain calculating unit 3133, and an error data updating unit 3134.

The syndrome generating unit 3131 calculates syndromes, distinguishing between the two types of code sequences sent from the data selecting unit 3190. This syndrome generating unit 3131 includes the input data syndrome storage unit 3135 and the buffer data syndrome storage unit 3136 as two temporary memories. The input data syndrome storage unit 3135 is a memory with a suitable storage capacity for temporarily storing syndromes for all of the code sequences in the C1 direction that compose a block. Conversely, the buffer data syndrome storage unit 3136 is a memory with a suitable storage capacity for temporarily storing syndromes for all of the code sequences for the C2 direction that compose a block.

When the data selecting unit 3190 selects and transfers data from the first transfer unit 3150 (C1 code sequences), the syndrome generating unit 3131 calculates syndromes for the C1 code sequences, accumulates the calculated syndromes for each C1 code sequence, and stores them in the input data syndrome storage unit 3135. On the other hand, when the data selecting unit 3190 selects and transfers data from the second transfer unit 3160 (C2 code sequences), the syndrome generating unit 3131 calculates syndromes for the C2 code sequences and accumulates the calculated syndromes for each C2 code sequence and stores them in the buffer data syndrome storage unit 3136.

Note that at any given instant, the syndrome generating unit 2131 only calculates syndromes for a code sequence in one of a row and a column, and so corresponds to one of the four syndrome generating units 52~55 in the error correcting unit 5 of the first embodiment (i.e., the circuit shown in FIG. 8). Here, if the size of the product code is given by k1=k2=100 bytes and m1=m2=10 bytes, the syndrome generating unit 3131 will include a queue buffer for temporarily buffering the input data and ten product-sum calculation circuits for calculating ten syndromes. These product-sum calculation circuits will each include a register for storing one product-sum value, a Galois field multiplier for reading a product-sum value stored in the register and multiplying it by a unique coefficient, and a Galois field adder for adding the next inputted code to the multiplication result of the Galois field multiplier.

The Euclidean calculation circuit 3132 sequentially reads the syndromes stored in the input data syndrome storage unit 3135 and the buffer data syndrome storage unit 3136 of the syndrome generating unit 3131 and calculates coefficients for each expression to specify an error position polynomial and an error value polynomial. The Euclidean calculation circuit 3132 outputs the resulting coefficients to the chain calculating unit 3133.

The chain calculating unit 3133 finds the root of the error position polynomial, based on the coefficients it receives from the Euclidean calculation circuit 3132, using a chain search or other method. The chain calculating unit 3133 then outputs the results of its calculation and the error value polynomial generated by the Euclidean calculation circuit 3132 to the error data updating unit 3134.

The error data updating unit 3134 uses the error position and the error value polynomial received from the chain calculating unit 3133 to find the error value at the indicated error position. The error data updating unit 3134 reads the data or parity data positioned at the indicated error position in the buffer memory 3110 via the bus control unit 3180, and calculates an exclusive OR on the retrieved values, before writing the resulting value back into the buffer memory 3110.

Note that the transfer of data from the buffer memory 3110 to the syndrome generating unit 3131 by the second transfer unit 3160 is performed using DMA, while the transfer of data between the buffer memory 3110 and the error data updating unit 3134 by the bus control unit 3180 is performed according to standard (i.e., non-DMA) access. Also note that the four circuits 3131~3134 that compose the error correcting unit 3130 operate separately and in parallel, which means that the error correcting unit 3130 performs sequential processing with a pipeline architecture.

FIG. 38 is a timing chart showing the internal processing of the optical disc control unit 3100 when consecutively processing data in a plurality of blocks. In FIG. 38, the first to fifth blocks are blocks of data stored in the buffer memory 3110. The legend "buffering" represents the transfer of data from the buffer memory 3110 to the disc interface unit 3120 by the first transfer unit 3150. The legend "error correction 1" represents error correction by the error correcting unit 3130 for code sequences in the C1 direction that have been transferred from the disc interface unit 3120 by the first transfer unit 3150. The legend "error correction 2" represents error correction by the error correcting unit 3130 for code sequences for the C2 direction that have been transferred from the buffer memory 3110 by the second transfer unit 3160 via the data selecting unit 3190. The legend "transfer to host" represents the transfer of data from the buffer memory 3110 to the host interface unit 3140 by the third transfer unit 3170.

As shown in FIG. 38, a block is first subjected to "buffering" and "error correction 1" in parallel. The block is then subjected to "error correction 2", and after that to "transfer to host", so that processing of blocks is performed sequentially and in parallel in a pipeline architecture. Focusing on cycle T5, for example, the fifth-block is transferred from the disc interface unit 3120 to the buffer memory 3110 at the same time as the error correcting unit 3130 performs "error correction 1" (error correction in the C1 direction) on the fifth block. At the same time, the fourth block is transferred from the buffer memory 3110 to the error correcting unit 3130 where "error correction 2" (error correction in the C2 direction) is performed, and the third block is transferred from the buffer memory 3110 to the host interface unit 3140.

Note that the reason the three types of data transfer that access the buffer memory 3110 appear to be executed in parallel in FIG. 38 is that the drawing shows blocks as a relatively large amount of data. By focusing on the separate data elements that compose each block, it can be seen that only one of the data transfers is being performed at any given instant. This kind of exclusive data transfer and pipeline control is achieved by the bus control unit 3180 switching the permission to transfer data at very short intervals between the three transfer units 3150, 3160, and 3170 according to a predetermined priority order.

The reason "error correction 2" is not performed for the third block in FIG. 38 is that no errors were detected for this block during the "error correction 1" process (error correction in the C1 direction) for this block. This means that all syndromes calculated by the error correcting unit 3130 for the code sequences in the C1 direction in the third block and written into the input data syndrome storage unit 3135 are zeros, or alternatively that the "error correction 1" in the cycle T1 was able to correct all of the errors in the code sequence in the C1 direction so that errors are no longer present in the block. By referring to the stored content of the input data syndrome storage unit 3135, the error correcting unit 3130 finds that error correction in the C2 direction for the third block is unnecessary, and does not perform any processing for the "error correction 2" of this block. The error correcting unit 3130 informs the bus control unit 3180 that no error correction will be performed, so that the second transfer unit 3160 does not transfer any of the code sequences in the third block from the buffer memory 3110 to the error correcting unit 3130.

In this way, "buffering" and the error correction in the C1 direction ("error correction 1") are performed for the same block in parallel, with information regarding the detection of errors being stored in the input data syndrome storage unit 3135. The error correcting unit 3130 can soon know if no errors are detected in the code sequences in the C1 direction by referring to the input data syndrome storage unit 3135. As a result, the error correcting unit 3130 can skip the reading of data that does not require error correction in the C2 direction, thereby avoiding unnecessary data transfers that involve the buffer memory 3110. Conventionally, the following three transfers are performed for all data read from an optical disc:

(1) the storage of data read from an optical disc into a buffer;

(2) the transfer of data from the buffer for error detection and error correction; and (3) the transfer of data from the buffer to a host computer.

With this third embodiment, however, data that does not contain any errors only needs to be transferred into the buffer memory (transfer (1)) and then transferred onward to the host computer (transfer (3)). Accordingly, such data only requires two transfers.

FIG. 39 shows the timing chart of FIG. 38 in more detail. In FIG. 39, the "error correction 1" and "error correction 2" are shown as separate processes in the C1 direction and the C2 direction. In this example, error correction in the C2 direction ("error correction 2") is only performed for blocks for which an error was detected during the error correction ("error correction 1") in the C1 direction.

During cycle T1, the error correcting unit 3130 performs error correction ("error correction 1") for the code sequences in the C1 direction for the first block that the first transfer unit 3150 sends from the disc interface unit 3120. When doing so, the syndrome generating unit 3131 stores the syndromes obtained for all code sequences in the C1 direction in the input data syndrome storage unit 3135.

Here, the error correcting unit 3130 performs error correction in the C1 direction since the data transfer from the disc interface unit 3120 to the buffer memory 3110 is performed in an order where the product code is scanned in the row direction repetitively from the first row to the $n_2^{th}$ row. This means that error correction in the C1 direction is simple.

Next, in cycle T2 the error correcting unit 3130 performs the "error correction 1" in the C1 direction for the second block and, in parallel, performs the "error correction 2" in the C2 direction for the first block. Here, data for the first block and the second block is sent from the data selecting unit 3190 according to time division, so that the error correcting unit 3130 performs error correction in the C1 direction for the code sequences of the second block that are inputted from the disc interface unit 3120 via the data selecting unit 3190, and performs error correction in the C2 direction for the code sequences of the first block that are inputted from the buffer memory 3110 via the data selecting unit 3190.

Note that when no errors are detected during the correction in the C1 direction or when all of the detected errors in the C1 direction have been corrected, error correction in the C2 direction is not performed for the first block, in the same way as with the third and fourth blocks. This means that the code sequences in the C2 direction in the first block are not transferred by the second transfer unit 3160 from the buffer memory 3110 to the error correcting unit 3130.

FIG. 40 is a timing chart showing the processing of the error correcting unit 3130 for code sequences in the row and column directions. This drawing corresponds to "error correction 1" and "error correction 2" shown at the start of cycle T2 in the timing chart of FIG. 39. Accordingly, FIG. 40 shows how the error correcting unit 3130 performs the error correction in the C1 direction ("error correction 1") for the second block in parallel with the error correction in the C2 direction ("error correction 2") for the first block.

In time t1, the syndrome generating unit 3131 calculates syndromes for the first column in the first block and for the first row in the second block in parallel. The syndrome generating unit 3131 stores the respective results in the input data syndrome storage unit 3135 and the buffer data syndrome storage unit 3136. Note that data is sent from the data selecting unit 3190 that switches between the first row of the second block and the first column of the first block according to time division, so that at any given instant, the syndrome generating unit 3131 will be calculating syndromes for only one of these code sequences.

In time t2, the syndrome generating unit 3131 calculates syndromes for the second column in the first block and for the second row in the second block in parallel. Again, the syndrome generating unit 3131 stores the respective results in the input data syndrome storage unit 3135 and the buffer data syndrome storage unit 3136.

Also in time t2, the Euclidean calculation circuit 3132 reads the syndromes for the code sequence of the first row in the second block from the input data syndrome storage unit 3135 and uses the read syndromes to perform a Euclidean calculation. The Euclidean calculation circuit 3132 notifies the chain calculation unit 3133 of the results. After this, the Euclidean calculation circuit 3132 performs a Euclidean calculation on the code sequence in the first column of the first block, and notifies the chain calculation unit 3133 of the results.

In the latter half of time t2, the chain calculating unit 3133 performs a chain calculation on the data for the first row of the second block received from the Euclidean calculation circuit 3132, and notifies the error data updating unit 3134 of the results.

In time t3, the syndrome generating unit 3131 calculates syndromes for the third column in the first block and for the third row in the second block in parallel. In parallel, the Euclidean calculation circuit 3132 performs respective Euclidean calculations for the code sequence of the second row in the second block and the code sequence in the second column of the first block. Also in parallel, the chain calculating unit 3133 performs respective chain calculations for the code sequence on the first column of the first block and the code sequence on the second row of the second block. Also in time t3, the error data updating unit 3134 updates the error data in the code sequence of the first row in the second block (rewrites the error data in the buffer memory 3110) and then updates the error data in the code sequence of the first column in the first block.

Hereafter, in each period tn, syndrome calculation, Euclidean calculation, chain calculation, and error data correction are performed in parallel for respective code sequences of one row and one column. Note that in FIG. 40, the Euclidean calculation, chain calculation, and error data correction are performed for every row and every column. This corresponds to the case when an error is detected in every code sequence during the calculation of syndromes. When a code sequence is found to contain no errors, Euclidean calculation, chain calculation, and error data correction are not performed for that code sequence.

As described above, this third embodiment has the error correction in the C1 direction (shown as "error correction 1" in the drawings) performed for data in parallel with the transfer of the same data from the disc interface unit 3120 to the buffer memory 3110 (shown as "buffering"). As a result, once data has been stored in the buffer memory 3110, the buffered data does not need to be read from the buffer memory 3110 to perform error correction on this data in the C1 direction.

The error correction performed in parallel with the buffering process stores the results (syndromes) of error detection in the C1 direction in the input data syndrome storage unit 3135. This stored content is then referred to, so that when no errors are detected in any of the code sequences in the C1 direction for a block, unnecessary data transfers that read data in such blocks for which error correction in the C2 direction is unnecessary can be avoided.

In this third embodiment, data transfer from the buffer memory 3110 is not necessary for error correction (1) in the C1 direction or (2) for error correction in the C2 direction provided a block does not contain any errors. The error correction processing can therefore be performed with fewer accesses to the buffer memory 3110 than were conventionally possible. This means that an optical disc reading device 2000 that operates at high speed with lower power consumption can be achieved.

Note that while this third embodiment describes an example where the error correcting unit 3130 repeatedly performs error correction on one row or one column, the error correcting unit 3130 may instead perform error correction on four rows on four columns, for example, as in the first embodiment.

As an example modification of the third embodiment where the error correcting unit 3130 performs error correction for four code sequences in parallel, the error correcting unit 3130 may be provided with four syndrome generating units and a data distributing unit for distributing data sent from the buffer memory 3110 on the four syndrome generating units, like the error correcting unit 5 in the first embodiment. As a result, a single error correction device can attain the effects of faster error correction in the first embodiment achieved due to parallel operation and in the third embodiment achieved by performing error correction in the C1 direction first.

In the third embodiment, the data selecting unit 3190 and the syndrome generating unit 3131 detect errors in the code sequences that are respectively sent from the first transfer unit 3150 and the second transfer unit 3160 according to time division. Alternatively, by providing two independent syndrome generating circuits that respectively perform error detection for a code sequence received from the first transfer unit 3150 and for a code sequence received from the second transfer unit 3160, error detection for two code sequences can be performed simultaneously in parallel.

The present invention has been explained using the three embodiments given above, although it should be obvious that the invention is not limited to such. A number of modifications are possible, examples of which are given below.

In the first to third embodiments, the error correction for one block is performed by performing error correction in the C1 direction and error correction in the C2 direction respectively once. However, a further error correction in both the C1 and C2 directions may be performed. By increasing the number of executions, the device's ability to correct errors can be improved, so that the number of executions of error correction in each direction may be set with consideration to the number of errors found in the data and the amount of time allowed for error correction, given the requirements of other processes.

Other variations of error correction apparatuses can be achieved by combining features that have been described in different embodiments. As one example, the three DMA transfers in the second and third embodiments that are shown in FIG. 27 may be scheduled in the same way as in the first embodiment.

The first to third embodiments of the present invention are disc drive apparatuses that use a DVD-ROM or other optical disc as a storage medium. The error correction apparatus of the invention does not apply only to such data storage apparatuses, and so may naturally be used whenever high-speed correction of errors is required for transferred data. An example of such a use would be for a relay device used in network communication.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. An error correcting apparatus that repeatedly performs calculations that are required for error correction on code sequences in a row direction and a column direction in block code of R rows and L columns, the error correcting apparatus comprising:

storing means for storing the block code;

calculating means for performing calculations for correcting errors in the block code in units of one of (a) one row and (b) one column; and transfer means, including a row direction transferring unit for repeatedly reading code sequences on R1 (where R1 is an integer such that $2 \leqq R1 < R$) rows in the block code from the storing means and transferring the read code sequences to the calculating means until all R rows have been read and transferred, the row direction transferring unit transferring the code sequences on the R1 rows from the storing means to the calculating means by repeatedly reading and transferring sections of L1 consecutive codes (where L1 is an integer such that $2 \leqq L1 < L$) on the R1 rows in order, shifting a read position by L1 codes after reading L1 consecutive codes on each of the R1 rows, wherein when codes have been transferred by the row direction transferring unit, the calculating means performs the calculations for the code sequences on the R1 rows in parallel, treating the received codes as L1-code-wide sections of the code sequences on different rows in the R1 rows.

2. The error correcting apparatus of claim 1, wherein the block code is product code, and code sequences in the row direction and column direction that compose the block code include information codes and error correction codes, the calculating means includes:

error detecting means for detecting whether errors are present in a code sequence on one of (a) a row and (b) a column in the block code; and error code updating means for rewriting, when the error detecting means has detected at least one error in a code sequence, a code in the storing means that corresponds to the error using a corrected value, the row direction transferring unit repeatedly transfers code sequences to the error detecting means, and the error detecting means performs error detection for the code sequences on the R1 rows in parallel, treating the received codes as L1-code-wide sections of the code sequences on different rows in the R1 rows.

3. The error correcting apparatus of claim 2, wherein the storing means stores the block code so that codes on a same row are stored in a storage area with consecutive addresses, and the row direction transferring unit sequentially reads L1 codes from a storage area with consecutive addresses in the storing means.

4. The error correcting apparatus of claim 3, wherein the storing means is a dynamic random access memory, and the row direction transferring unit reads L1 codes from the storing means using page mode.

5. The error correcting apparatus of claim 4, wherein the row direction transferring unit transfers codes by performing direct memory access to the storing means.

6. The error correcting apparatus of claim 2, wherein the error detecting means includes:

R1 error detecting units that each perform error detection for a code sequence on one row in the R1 rows; and a distributing unit for distributing codes, which are received from the row direction transferring unit, in L1-code-wide sections to the R1 error detecting units in order, wherein the R1 error detecting units are independent of one another and each perform error detection in parallel with a transfer of codes by the row direction transferring unit.

7. The error correcting apparatus of claim 6, wherein each of the R1 error detecting units completes the error detection for an L1-code-wide section in a time that is shorter than an interval at which L1-code-wide sections are distributed to the error correcting unit by the distributing unit.

8. The error correcting apparatus of claim 7, wherein each of the R1 error detecting units has a product-sum calculating circuit that calculates a plurality of syndromes for one code sequence.

9. The error correcting apparatus of claim 2, wherein when a division of L by L1 results in a quotient of D and a remainder of E, the row direction transferring unit repeats a transfer of L1-code-wide sections on R1 rows D times, before reading and transferring an E-code-wide section on each of the R1 rows in order to the error detecting means, and the error detecting means performs error detection a predetermined number of times for L1-code-wide sections before performing error detection for E-code-wide sections.

10. The error correcting apparatus of claim 2, wherein the transferring means further includes a column direction transfer unit for reading code sequences in L2 (where L2 is an integer such that $2 \leqq L2 < L$) columns in the block code from the storing means and transferring the read code sequences to the error detecting means until all L columns have been processed, the column direction transferring unit transfers all code in the L2 columns from the storing means to the calculating means by repeatedly reading and transferring sections of L2 consecutive codes in the row direction on the R rows in order, shifting a read position by L2 codes after reading all codes in the L2 columns, and when codes have been transferred by the column direction transferring unit, the error detecting means performs error detection for the code sequences in the L2 columns in parallel, treating the received codes as a series where each code corresponds to a code sequence in a different column in the L2 columns.

11. The error correcting apparatus of claim 10, wherein R1 and L2 are such that R1=L2=j, and the error detecting means includes:

j error detecting units that each perform error detection for one code sequence; and a distributing unit for repeatedly distributing each L1-code-wide section of codes that is received from the row to one of the j error detecting units selected in order, and for repeatedly distributing each code that forms part of an L2 code-wide section received from the column to a different error detecting unit in the j error detecting units in order, wherein the j error detecting units are independent of one another and each detect errors in parallel with transfer of codes by the row direction transferring unit and the column direction transferring unit.

12. The error correcting apparatus of claim 11, wherein each of the j error detecting units completes an error detection for an L1-code-wide section in a time that is shorter than an interval at which-L1-code-wide sections are distributed to the error correcting unit by the distributing unit, and completes an error detection for one code in an L2-code-wide section in a time that is shorter than an interval at which codes in L2-code-wide sections are distributed to the error correcting unit by the distributing unit.

13. The error correcting apparatus of claim 12, wherein R1=L1=L2=j.

14. An error correcting apparatus that repeatedly performs calculations that are required for error correction on code sequences in a row direction and column direction in block code of R rows and L columns, the error correcting apparatus comprising:

storing means for storing the block code;

calculating means for performing calculations for correcting errors in the block code in units of one of (a) one row and (b) one column; and transfer means, including a column direction transferring unit for repeatedly reading code sequences on L2 (where R1 is an integer such that $2 \leqq L2 < L$) columns in the block code from the storing means and transferring the read code sequences to the calculating means until all L columns have been read and transferred, the column direction transferring unit transferring the code sequences in the L2 columns from the storing means to the calculating means by repeatedly reading and transferring sections of L2 consecutive codes on the R rows in order, shifting a read position by L2 codes after reading all codes in the L2 columns, wherein when codes have been transferred by the column direction transferring unit, the calculating means performs the calculations for the code sequences in the L2 columns in parallel, treating successive codes as belonging to code sequences in different columns in the L2 columns.

15. The error correcting apparatus of claim 14, wherein the block code is product code, and code sequences in the row direction and column direction that compose the block code include information codes and error correction codes, the calculating means includes:

error detecting means for performing error detection for a code sequence on one of (a) a row and (b) a column in the block code; and error code updating means for rewriting, when the error detecting means has detected at least one error in a code sequence, a code in the storing means that corresponds to the error using a corrected value, the column direction transferring unit repeatedly transfers code sequences to the error detecting means, and the error detecting means performs error detection for the code sequences in the L2 columns in parallel, treating the received codes as a series where each code corresponds to a code sequence in a different column in the L2 columns.

16. The error correcting apparatus of claim 15, wherein the storing means stores the block code so that codes on a same row are stored in a storage area with consecutive addresses, and the column direction transferring unit sequentially reads L2 codes from a storage area with consecutive addresses in the storing means.

17. The error correcting apparatus of claim 16, wherein the storing means is a dynamic random access memory, and the column direction transferring unit reads L2 codes from the storing means using page mode.

18. The error correcting apparatus of claim 17, wherein the column direction transferring unit transfers codes by performing direct memory access to the storing means.

19. The error correcting apparatus of claim 15, wherein the error detecting means includes:

L2 error detecting units that each perform error detection for a code sequence in one column in the L2 columns; and a distributing unit for distributing each code that forms part of an L2 code-wide section received from the column direction transferring unit to a different one of the L2 error detecting units in order, wherein the L2 error detecting units are independent of one another and each perform error detection in parallel with a transfer of codes by the column direction transferring unit.

20. The error correcting apparatus of claim 19, wherein each of the L2 error detecting units completes the error detection for one code in an L2-code-wide section in a time that is shorter than an interval at which the distributing unit distributes codes in L2-code-wide sections to the error correcting unit.

21. The error correcting apparatus of claim 20, wherein each of the L2 error detecting units has a product-sum calculating circuit that calculates a plurality of syndromes for one code sequence.

22. The error correcting apparatus of claim 15, wherein when a division of L by L2 results in a quotient of D and a remainder of E, the column direction transferring unit repeats a transfer of L2-code-wide sections on R rows D times, before reading and transferring an E-code-wide section on each of the R rows in order, and the error detecting means performs error detection a predetermined number of times for L2-code-wide sections before performing error detection for E-code-wide sections.

23. An error correcting apparatus that performs error correction on codes received from a first external apparatus and outputs the corrected codes to a second external apparatus, the error correcting apparatus comprising:

storing means including a storage area for storing the codes;

error detecting means for detecting errors in sections of a predetermined number of codes;

error correcting means for correcting sections, in which the error detecting means has detected an error, of a predetermined number of codes in the storing means;

first transfer means for transferring codes outputted by the first external apparatus in parallel to the storing means and to the error detecting means so that the outputted codes are stored in the storing means and simultaneously subjected to error detection by the error detecting means;

second transfer means for transferring a section of a predetermined number of codes, in which the error detecting means has detected an error, from the storing means to the error correcting means, third transfer means for transferring a section of a predetermined number of codes that does not contain any uncorrected errors from the storing means to the second external apparatus; and transfer control means for controlling transfers of codes so that transfer is exclusively performed by one of the first to third transfer means.

24. The error correcting apparatus of claim 23, wherein the error detecting means includes a detection result recording unit that records detection results showing whether an error exists in a section of codes, and the error correcting means refers to the detection results in the detection result recording unit and controls the second transfer means so that only sections of codes for which the error detecting means has detected an error are transferred from the storing means to the error correcting means.

25. The error correcting apparatus of claim 24, wherein the first external apparatus repeatedly outputs code sequences that form rows in block code composed of R rows by L columns, the block code is product code, and code sequences in the row direction and column direction that compose the block code include information codes and error correction codes, and the error correcting means performs error correction for code sequences in one of (a) a row direction and (b) a column direction, and when performing error correction for code sequences in the row direction, refers to the detection results in the detection result recording unit and controls the second transfer means so that only code sequences in the row direction for which the error detecting means has detected errors are transferred from the storing means to the error correcting means.

26. The error correcting apparatus of claim 25, wherein the error detecting means accumulatively stores detection results in the detection result recording unit for all code sequences in the row direction that compose one set of block code, and when performing error correction for code sequences in the column direction, the error correcting means refers to the detection results in the detection result recording unit and controls the second transfer means so that the second transfer means transfers code sequences in the column direction in a block from the storing means to the error correcting means only if the error detecting means has detected at least one error in the block.

27. The error correcting apparatus of claim 23, wherein the second transfer means includes a row direction transferring unit for repeatedly reading code sequences on R1 (where R1 is an integer such that $2 \leqq R1 < R$) rows where errors have been detected from the storing means and transferring the read code sequences to the error correcting means, until no code sequences on rows that contain errors remain in the block code, the row direction transferring unit transfers the code sequences on the R1 rows from the storing means to the calculating means by repeatedly reading and transferring sections of L1 consecutive codes (where L1 is an integer such that $2 \leqq L1 < L$) on the R1 rows in order, shifting a read position by L1 codes after reading L1 consecutive codes on each of the R1 rows, and when codes have been transferred by the row direction transferring unit, the error correcting means performs the calculations for the code sequences on the R1 rows in parallel, treating the received codes as L1-code-wide sections of the code sequences on different rows in the R1 rows.

28. The error correcting apparatus of claim 27, wherein the second transfer means further include s a column direction transferring unit for repeatedly reading code sequences in L2 (where L is an integer such that $2 \leqq L2 < L$) columns in a block where an error has been detected from the storing means and transferring the read code sequences to the error correcting means, until code sequences in all L columns have been transferred, the column direction transferring unit transfers all code in the L2 columns from the storing means to the error correcting means by repeatedly reading and transferring sections of L2 consecutive codes in the row direction on the R rows in order, shifting a read position by L2 codes after reading all codes in the L2 columns, and when codes have been transferred by the column direction transferring unit, the error correcting means performs error detection for the code sequences in the L2 columns in parallel, treating the received codes as a series where each code corresponds to a code sequence in a different column in the L2 columns.

29. The error correcting apparatus of claim 23, wherein transfer of codes from the first external apparatus to the storing means by the first transfer means, transfer of codes from the storing means to the error correcting means by the second transfer means, and transfer of codes from the storing means to the second external apparatus by the third transfer means are all transfers that are accompanied by direct memory access (DMA) to the storing means, the transfer control means has DMA transfer by the first transfer means performed with a highest priority out of DMA transfers by the first to third transfer means, and when DMA transfer by the first transfer means becomes necessary, the transfer control means has DMA transfer performed by the first transfer means immediately if DMA transfer is not presently being performed by any of the first to third transfer means and, if DMA transfer is presently being performed by one of the first to third transfer means, allows a present DMA transfer to end before having DMA transfer performed by the first transfer means.

30. The error correcting apparatus of claim 29, wherein the transfer control means has DMA transfer performed by the second transfer means with a lowest priority out of the first to third transfer means, so that when DMA transfer by the second transfer means becomes necessary, the transfer control means only has DMA transfer performed by the second transfer means if DMA transfer is not being performed by any of the first to third transfer means.

31. The error correcting apparatus of claim 30, wherein the error correcting means specifies an error code in a code sequence transferred by the second transfer means and then rewrites a corresponding error code in the storing means under control by the transfer control means, the transfer control means only allowing the error correcting means to rewrite the corresponding error if DMA transfer is not being performed by any of the first to third transfer means.

32. An error correcting apparatus that performs error correction on codes received from a first external apparatus and outputs the corrected codes to a second external apparatus, the error correcting apparatus comprising:

storing means including a storage area for storing the codes;

error correcting means for detecting error codes in sections of a predetermined number of codes and correcting the error codes in the storing means;

code selecting means for selecting one of codes sent from the first external apparatus and codes sent from the storing means and sending the selected codes to the error correcting means to have the error correcting means perform error detection and error correction on the selected codes;

first transfer means for transferring codes outputted by the first external apparatus in parallel to the storing means and the code selecting means so that the outputted codes are stored in the storing means and simultaneously selected by the code selecting means and sent to the error correcting means where error detection and error correction are performed on the transferred codes;

second transfer means for transferring a section of a predetermined number of codes from the storing means to the code selecting means so that the error correcting means performs error detection and error correction on the transferred codes;

third transfer means for transferring a section of a predetermined number of codes that do not contain any uncorrected errors from the storing means to the second external apparatus; and transfer control means for controlling transfers of codes so that transfer is exclusively performed by one of the first to third transfer means.

33. The error correcting apparatus of claim 32, wherein the first external apparatus repeatedly outputs code sequences that form rows in block code composed of R rows by L columns, the block code is product code, and code sequences in the row direction and column direction that compose the block code include information codes and error correction codes, the first transfer means transfers code sequences in a row direction that are repeatedly outputted by the first external apparatus in parallel to the storing means and the code selecting means to have the code sequences stored in the storing means and simultaneously selected by the code selecting means and sent to the error correcting means where error detection and error correction are performed on the transferred code sequences, and the second transfer means transfers code sequences in the column direction in the block code to the code selecting means so that the code sequences are selected by the code selecting means and sent to the error correcting means where error detection and error correction are performed for the code sequences.

34. The error correcting apparatus of claim 33, wherein the error correcting means includes:

an error detecting unit for detecting whether error codes are present in a code sequence on one of (a) one row and (b) one column; and an error updating unit for updating, when the error detecting unit finds an error code, a code in the storing means that corresponds to the error code using a corrected value, the error detecting unit includes:

a row direction detection result recording unit for recording results of error detection for code sequences in the row direction that are transferred by the first transfer means from the first external apparatus to the error detecting unit; and a column direction detection result recording unit for recording results of error detection for code sequences in the column direction that are transferred by the second transfer means from the storing means to the error detecting unit, and the error code updating unit uses the detection results in the row direction detection result recording unit and in the column direction detection result recording unit to update codes in the storing means.

35. The error correcting apparatus of claim 34, wherein when performing error detection in the row direction, the error detecting unit accumulates detection results for all code sequences in the row direction that compose one set of block code in the row direction detection result recording unit, and when performing error detection in the column direction, the error detecting unit refers to the detection results recorded in the row direction detection result recording unit and controls the second transfer means so that only code sequences in the column direction that compose a set of block code that contains an error are sent from the storing means to the error correcting means.

36. The error correcting apparatus of claim 35, wherein the transfer control means has (a) a transfer of a code sequence of one row from the first external apparatus to the storing means by the first transfer means, and (b) a transfer of a code sequence for one column from the storing means to the code selecting means by the second transfer means executed alternately in units of parts of the transferred code sequences, the error detecting unit switches between (i) error detection for a code sequence in the row direction sent from the first external apparatus by the first transfer means and (ii) error detection for a code sequence in the column direction sent from the storing means by the second transfer means in units of parts of the code sequences so as to perform error detection for code sequences in the row direction and code sequences in the column direction in parallel, the error detecting unit storing results of the error detection in the row direction in the row direction detection result recording unit and results of the error detection in the column direction in the column direction detection result recording unit, and the error code updating unit sequentially refers to the detection results recorded in the row direction detection result recording unit and in the column direction detection result recording unit and successively updates error codes in the storing means in the row direction and error codes in the storing means in the column direction.

37. The error correcting apparatus of claim 32, wherein the second transfer means includes a column direction transferring unit for repeatedly reading code sequences in L2 (where L2 is an integer such that $2 \leqq L2 < L$) columns in a block and transferring the read code sequences to the error correcting means via the code selecting means until all L columns in the block code have been transferred, the column direction transferring unit transfers the code sequences in the L2 columns from the storing means to the code correcting means by repeatedly reading and transferring sections of L2 consecutive codes in the row direction on the R rows in order, shifting a read position by L2 codes after reading all codes in the L2 columns, and when codes have been transferred by the column direction transferring unit, the error correcting means performs error correction for the code sequences in the L2 columns in parallel, treating the received codes as a series where each code corresponds to a code sequence in a different column in the L2 columns.

38. The error correcting apparatus of claim 32, wherein transfer of codes from the first external apparatus to the storing means by the first transfer means, transfer of codes from the storing means to the error correcting means via the code selecting means by the second transfer means, and transfer of codes from the storing means to the second external apparatus by the third transfer means are all transfers that are accompanied by direct memory access (DMA) to the storing means, the transfer control means has DMA transfer by the first transfer means performed with a highest priority out of DMA transfers by the first to third transfer means, and when DMA transfer by the first transfer means becomes necessary, the transfer control means has DMA transfer performed by the first transfer means immediately if DMA transfer is not presently being performed by any of the first to third transfer means and, if DMA transfer is presently being performed by one of the first to third transfer means, allows a present DMA transfer to end before having DMA transfer performed by the first transfer means.

39. The error correcting apparatus of claim 38, wherein the transfer control means has DMA transfer performed by the second transfer means with a lowest priority out of the first to third transfer means, so that when DMA transfer by the second transfer means becomes necessary, the transfer control means only has DMA transfer performed by the second transfer means if DMA transfer is not being performed by one of the first transfer means the third transfer means.

40. The error correcting apparatus of claim 39, wherein the transfer control means only allows the code updating unit to rewrite codes in the storing means if DMA transfer is not being performed by any of the first to third transfer means.

*41. An error correcting method that repeatedly performs calculations that are required for error correction on code sequences in a row direction or a column direction in block code of R rows and L columns, the error correcting method comprising the steps of:*

*storing the block code in a memory;*

*calculating, using a calculating unit, a calculation for correcting errors on codes of one row or one column in the block code; and*

*repeatedly reading, using a row direction transferring unit, code sequences on R1 (where R1 is an integer such that $2 \leqq R1 < R$) rows in the block code from the memory and transferring the read code sequences to the calculating unit until all R rows have been read and transferred,*

*transferring, using the row direction transferring unit, code sequences on the R1 rows from the memory to the calculating unit by repeatedly reading and transferring sections of L1 consecutive codes (where L1 is an integer such that $2 \leqq L1 < L$) on the R1 rows in order, and shifting, using the row direction transferring unit, a read position by L1 columns after reading L1 consecutive codes on each of the R1 rows,*

*wherein the step of transferring code sequences, using the row direction transferring unit, and the step of calculating, using the calculating unit, the calculations for the code sequences in the R1 rows, are performed in parallel.*

*42. The error correcting method of claim 41,*

*wherein when codes have been transferred by the row direction transferring unit, performing, using the calculating unit, the calculations for the code sequences on the R1 rows by time division, treating the received codes as L1-code-wide sections of the code sequences on different rows in the R1 rows.*

*43. The error correcting method of claim 41,*

*wherein the block code is product code.*

*44. The error correcting method of claim 43,*

*wherein code sequences in the row direction and column direction that compose the block code include information codes and error correction codes, and*

*wherein the step of calculating, using the calculating unit, includes the steps of:*

*performing error detection, using an error detecting unit, a code sequence on one of (a) a row and (b) a column in the block code; and*

*rewriting, using an error code updating unit, when the error detecting means has detected at least one error in a code sequence, a code in the memory that corresponds to the error using a corrected value,*

*repeatedly transferring, using the row direction transferring unit, code sequences to the error detecting unit, and*

*performing error detection, using the error detecting unit, for the code sequences on the R1 rows in parallel, treating the received codes as L1-code-wide sections of the code sequences on different rows in the R1 rows.*

*45. The error correcting method of claim 44,*

*wherein the block code is stored in the memory so that codes on a same row are stored in a storage area with consecutive addresses, and*

*further including the step of sequentially reading, using the row direction transferring unit, L1 codes from a storage area with consecutive addresses in the memory.*

*46. The error correcting method of claim 45,*

*wherein the memory is a dynamic random access memory, and*

*further including the step of reading, using the row direction transferring unit, L1 codes from the memory using page mode.*

*47. The error correcting method of claim 46,*

*wherein the row direction transferring unit transfers codes by performing direct memory access to the memory.*

*48. The error correcting method of claim 44,*

*wherein the step of performing error detection, using an error detecting unit, includes the steps of:*

*performing error detection, using R1 error detecting units, for a code sequence on one row in the R1 rows; and*

*distributing, using a distributing unit, codes which are received from the row direction transferring unit, in L1-code-wide sections to the R1 error detecting units in order,*

*wherein the R1 error detecting units are independent of one another and each perform error detection in parallel with a transfer of codes by the row direction transferring unit.*

*49. The error correcting method of claim 48,*

*wherein each of the R1 error detecting units completes the error detection for an L1-code-wide section in a time that is shorter than an interval at which L1-code-wide sections are distributed to the error correcting unit by the distributing unit.*

*50. The error correcting method of claim 49,*

*wherein each of the R1 error detecting units has a product-sum calculating circuit that calculates a plurality of syndromes for one code sequence.*

*51. The error correcting method of claim 44,*

*repeating, using the row direction transferring unit, a transfer of L1-code-wide sections on R1 rows D times, before reading and transferring an E-code-wide section on each of the R1 rows in order to the error detecting unit when a division of L by L1 results in a quotient of D and a remainder of E, and*

*performing error detection, using the error detecting unit, for a predetermined number of times for L1-code-wide sections before performing error detection for E-code-wide sections.*

*52. The error correcting method of claim 44,*

*wherein the step of transferring, using the row direction transferring unit, includes:*

*reading, using a column direction transfer unit, code sequences in L2 (where L2 is an integer such that $2 \leqq L2 < L$) columns in the block code from the memory and transferring the read code sequences to the error detecting unit until all L columns have been processed,*

*the column direction transferring unit transfers all code in the L2 columns from the memory to the calculating unit by repeatedly reading and transferring sections of L2 consecutive codes in the row direction on the R rows in order, shifting a read position by L2 codes after reading all codes in the L2 columns, and*

*performing error detection, using the error detecting unit, for the code sequences in the L2 columns in parallel, treating the received codes as a series where each code corresponds to a code sequence in a different column in the L2 columns when codes have been transferred by the column direction transferring unit.*

*53. The error correcting method of claim 52,*

*wherein R1 and L2 are such that R1=L2=j, and the step of performing error detection, using the error detecting unit, includes:*

*performing error detecting, using j error detecting units that each perform error detection for one code sequence; and*

*repeatedly distributing, using a distributing unit, each L1-code-wide section of codes that is received from the row to one of the j error detecting units selected in order, and*

*repeatedly distributing, using the distributing unit, each code that forms part of an L2 code-wide section received from the column to a different error detecting unit in the j error detecting units in order,*

*wherein the j error detecting units are independent of one another and each detect errors in parallel with transfer of codes by the row direction transferring unit and the column direction transferring unit.*

*54. The error correcting method of claim 53,*

*wherein each of the j error detecting units completes an error detection for an L1-code-wide section in a time that is shorter than an interval at which L1-code-wide sections are distributed to the error correcting unit by the distributing unit, and completes an error detection for one code in an L2-code-wide section in a time that is shorter than an interval at which codes in L2-code-*

*wide sections are distributed to the error correcting unit by the distributing unit.*

*55. The error correcting method of claim 54,*

*wherein R1=L1=L2=j.*

*56. An error correcting method that repeatedly performs calculations that are required for error correction on code sequences in a row direction or a column direction in block code of R rows and L columns,*

*the error correcting method comprising the steps of:*

*storing the block code in a memory;*

*calculating, using a calculating unit, a calculation for correcting errors on codes of one row or one column in the block code; and*

*repeatedly reading, using a column direction transferring unit, code sequences on L2 (where L2 is an integer such that 2 L2<L) columns in the block code from the memory and transfers the read code sequences to the calculating unit until all L columns have been read and transferred,*

*transferring, using the column direction transferring unit, code sequences in the L2 columns from the memory to the calculating unit by repeatedly reading and transferring sections of L2 consecutive codes on the R rows in order, and shifting, using the column direction transferring unit, a read position by L2 columns after reading all codes in the L2 columns,*

*wherein the step of transferring code sequences, using the column direction transferring unit, and the step of calculating, using the calculating unit, the calculations for the code sequences in the L2 columns, are performed in parallel.*

*57. The error correcting method of claim 56,*

*wherein when codes have been transferred by the column direction transferring unit, the calculating unit performs the calculations for the code sequences in the L2 columns by time division, treating successive codes as belonging to code sequences in different columns in the L2 columns.*

*58. The error correcting method of claim 56,*

*wherein the block code is product code.*

*59. The error correcting method of claim 58,*

*wherein code sequences in the row direction and column direction that compose the block code include information codes and error correction codes,*

*wherein the step of calculating, using the calculating unit includes the steps of:*

*performing error detection, using an error detecting unit, a code sequence on one of (a) a row and (b) a column in the block code; and*

*rewriting, using an error code updating unit for rewriting, when the error detecting unit has detected at least one error in a code sequence, a code in the memory that corresponds to the error using a corrected value,*

*repeatedly transferring, using the column direction transferring unit, code sequences to the error detecting unit, and*

*performing error detection, using the error detecting unit performs, for the code sequences in the L2 columns in parallel, treating the received codes as a series where each code corresponds to a code sequence in a different column in the L2 columns.*

*60. The error correcting method of claim 59,*

*wherein the block code is stored in the so that codes on a same row are stored in a storage area with consecutive addresses, and*

*further including the step of sequentially reading, using the column direction transferring unit, L2 codes from a storage area with consecutive addresses in the memory.*

*61. The error correcting method of claim 60,*

*wherein the memory is a dynamic random access memory, and*

*further including the step of reading, using the column direction transferring unit, L2 codes from the memory using page mode.*

*62. The error correcting method of claim 61,*

*wherein the column direction transferring unit transfers codes by performing direct memory access to the memory.*

*63. The error correcting method of claim 59,*

*wherein the step of performing error detection, using the error detecting unit, includes the steps of:*

*performing error detection, using L2 error detecting units, for a code sequence in one column in the L2 columns; and*

*distributing, using a distributing unit, each code that forms part of an L2 code-wide section received from the column direction transferring unit to a different one of the L2 error detecting units in order,*

*wherein the L2 error detecting units are independent of one another and each perform error detection in parallel with a transfer of codes by the column direction transferring unit.*

*64. The error correcting method of claim 63,*

*wherein each of the L2 error detecting units completes the error detection for one code in an L2-code-wide section in a time that is shorter than an interval at which the distributing unit distributes codes in L2-code-wide sections to the error correcting unit.*

*65. The error correcting method of claim 64,*

*wherein each of the L2 error detecting units has a product-sum calculating circuit that calculates a plurality of syndromes for one code sequence.*

*66. The error correcting method of claim 59,*

*wherein when a division of L by L2 results in a quotient of D and a remainder of E, the column direction transferring unit repeats a transfer of L2-code-wide sections on R rows D times, before reading and transferring an E-code-wide section on each of the R rows in order, and*

*the error detecting unit performs error detection a predetermined number of times for L2-code-wide sections before performing error detection for E-code-wide sections.*

* * * * *